(12) United States Patent
Yu et al.

(10) Patent No.: US 10,831,043 B2
(45) Date of Patent: Nov. 10, 2020

(54) ELECTRO-OPTICALLY ACTIVE DEVICE

(71) Applicant: ROCKLEY PHOTONICS LIMITED, London (GB)

(72) Inventors: Guomin Yu, Glendora, CA (US); Yi Zhang, Pasadena, CA (US); Aaron Zilkie, Pasadena, CA (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 16/427,247

(22) Filed: May 30, 2019

(65) Prior Publication Data

US 2019/0384073 A1 Dec. 19, 2019

Related U.S. Application Data

(63) Continuation-in-part of application No. 16/463,203, filed as application No. PCT/EP2017/080221 on Nov. 23, 2017.

(Continued)

(51) Int. Cl.
 *G02F 1/035* (2006.01)
 *G02F 1/017* (2006.01)
 (Continued)

(52) U.S. Cl.
 CPC .............. *G02F 1/017* (2013.01); *G02B 6/12* (2013.01); *G02F 1/025* (2013.01); *G02F 1/2257* (2013.01);
 (Continued)

(58) Field of Classification Search
 CPC ........ G02F 1/017; G02F 1/2257; G02F 1/025; G02F 2001/0151; G02F 2202/108;
 (Continued)

(56) References Cited

U.S. PATENT DOCUMENTS 6,154,475 A    11/2000  Soref et al.
8,160,404 B2 * 4/2012   Pan .......................... G02F 1/025
                                                         385/129

(Continued)

FOREIGN PATENT DOCUMENTS

WO    WO 2018/096038 A1    5/2018

OTHER PUBLICATIONS

International Search Report and Written Opinion of the International Searching Authority, dated Mar. 8, 2018, Corresponding to PCT/EP2017/080221, 13 pages.

(Continued)

*Primary Examiner* — Ellen E Kim
(74) *Attorney, Agent, or Firm* — Lewis Roca Rothgerber Christie LLP

(57) ABSTRACT

A silicon based electro-optically active device and method of producing the same, the device comprising: a silicon-on-insulator (SOI) waveguide; an electro-optically active stack within a cavity of the SOI waveguide, wherein the electro-optically active stack is separated from an insulator layer of the electro-optically active device by a seed layer; and a channel between the electro-optically active stack and the SOI waveguide; wherein the channel is filled with a filling material with a refractive index greater than that of a material forming a sidewall of the cavity to form a bridge-waveguide in the channel between the SOI waveguide and the electro-optically active stack.

21 Claims, 76 Drawing Sheets

Related U.S. Application Data

(60) Provisional application No. 62/426,117, filed on Nov. 23, 2016, provisional application No. 62/427,132, filed on Nov. 28, 2016.

(51) Int. Cl.
   | | |
   |---|---|
   | *G02B 6/12* | (2006.01) |
   | *G02F 1/025* | (2006.01) |
   | *H01L 27/12* | (2006.01) |
   | *G02F 1/225* | (2006.01) |
   | *G02F 1/015* | (2006.01) |

(52) U.S. Cl.
   CPC .. *H01L 27/1203* (2013.01); *G02F 2001/0151* (2013.01); *G02F 2001/0157* (2013.01); *G02F 2202/108* (2013.01)

(58) Field of Classification Search
   CPC ......... G02F 2001/0157; H01L 27/1203; G02B 6/12; G02B 6/136; G02B 6/12004
   See application file for complete search history.

(56) References Cited

U.S. PATENT DOCUMENTS

| | | | |
|---|---|---|---|
| 8,330,242 B2 | 12/2012 | Shiba et al. | |
| 8,710,470 B2 | 4/2014 | Gattass et al. | |
| 8,768,132 B2 | 7/2014 | Stewart et al. | |
| 9,134,553 B2 | 9/2015 | Lim et al. | |
| 9,368,579 B2 | 6/2016 | Balram et al. | |
| 9,513,498 B2 * | 12/2016 | Jones | G02F 1/025 |
| 9,768,195 B2 * | 9/2017 | Chou | H01L 21/823481 |
| 2010/0330727 A1 | 12/2010 | Hill et al. | |
| 2012/0207424 A1 | 8/2012 | Zheng et al. | |
| 2013/0051727 A1 | 2/2013 | Mizrahi et al. | |
| 2015/0098676 A1 | 4/2015 | Krasulick et al. | |
| 2016/0087160 A1 * | 3/2016 | Cheng | H01S 5/026 257/13 |
| 2016/0246016 A1 | 8/2016 | Mizrahi et al. | |
| 2016/0358954 A1 | 12/2016 | Hoyos et al. | |
| 2017/0229840 A1 | 8/2017 | Lambert | |

OTHER PUBLICATIONS

International Search Report and Written Opinion of the International Searching Authority, dated Aug. 29, 2018, Corresponding to PCT/EP2018/062269, 15 pages.

Rouifed, Mohamed-Saïd et al., "Advances Toward Ge/SiGe Quantum-Well Waveguide Modulators at 1.3μm", IEEE Journal of Selected Topics in Quantum Electronics, 2013, 7 pages, vol. 20, No. 4, IEEE.

U.S. Appl. No. 16/463,203, filed May 22, 2019.

Claussen, S.A. et al., "Selective area growth of germanium and germanium/silicon-germanium quantum wells in silicon waveguides for on-chip optical interconnect applications", Optical Materials Express, Oct. 1, 2012, pp. 1336-1342, vol. 2, No. 10, OSA.

Ren, Shen, "Ge/SiGe Quantum Well Waveguide Modulator for Optical Interconnect Systems", Dissertation submitted to the department of electrical engineering and the committee on graduate studies of Stanford University in partial fulfillment of the requirements for the degree of doctor of philosophy, Mar. 2011, 138 pages.

Ren, Shen et al., "Selective epitaxial growth of Ge/Si$_{0.15}$Ge$_{0.85}$ quantum wells on Si substrate using reduced pressure chemical vapor deposition", Applied Physics Letters, 2011, pp. 151108-1 through 151108-3, American Institute of Physics.

U.K. Intellectual Property Office Combined Search and Examination Report, dated Sep. 27, 2018 and re-sent by Examiner Sep. 26, 2019, for Patent Application No. GB1812309.1, 7 pages.

U.K. Intellectual Property Office Combined Search and Examination Report, dated Sep. 27, 2018, for Patent Application No. GB1812309.1, 5 pages.

U.S. Appl. No. 16/766,268, filed May 21, 2020, not yet published.

U.S. Office Action for U.S. Appl. No. 16/463,203, dated Apr. 16, 2020, 13 pages.

U.S. Notice of Allowance from U.S. Appl. No. 16/463,203, dated Aug. 31, 2020, 8 pages.

* cited by examiner waveguide patterning with SiO2 hard mask on Si, α-Si and
SiGe MQW EPI, and Si3N4 cover on SiGe MQW EPI Si and α-Si waveguide etched etching SiGe MQW waveguide by covering Si and α-Si waveguides
with Si3N4 and removing Si3N4 on SiGe MQW etching away P-doped region for top electrode pad VIA and Metallization

| Passive | Value | Unit |
|---|---|---|
| Silicon to amorphous silicon waveguide coupling | 0.9988 | |
| amorphous silicon to MQW (0V/cm) waveguide coupling | 0.9880 | |
| amorphous silicon to MQW (100kV/cm) waveguide coupling | 0.9865 | |
| Total coupling efficiency (0V/cm) | 0.9738 | |
| Total coupling efficiency (100kV/cm) | 0.9708 | |
| Total coupling loss | 0.1285 | db |
| | | |
| Active | | |
| MQW waveguide (0V/cm) loss | 598.41 | dB/cm |
| MQW waveguide (100kV/cm) loss | 1930 | dB/cm |
| Active length | 40 | um |
| Active insertion loss | 2.39 | dB |
| Total insertion loss | 2.52 | dB |
| Extinction ratio | 5.33 | dB |
| Link penalty | 7.03 | dB |

FIG. 5

Section view AA'

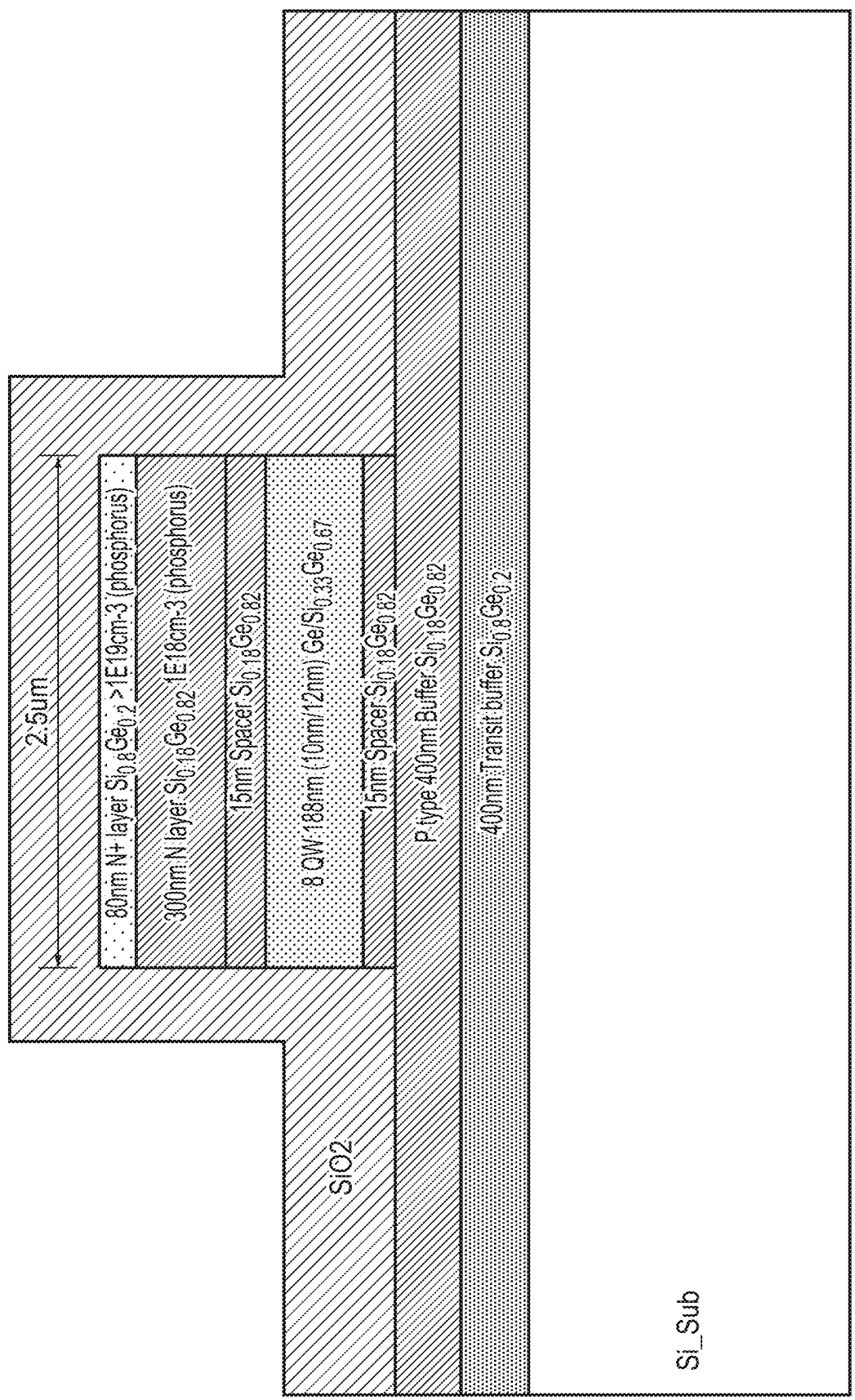
FIG. 16B Section view BB'

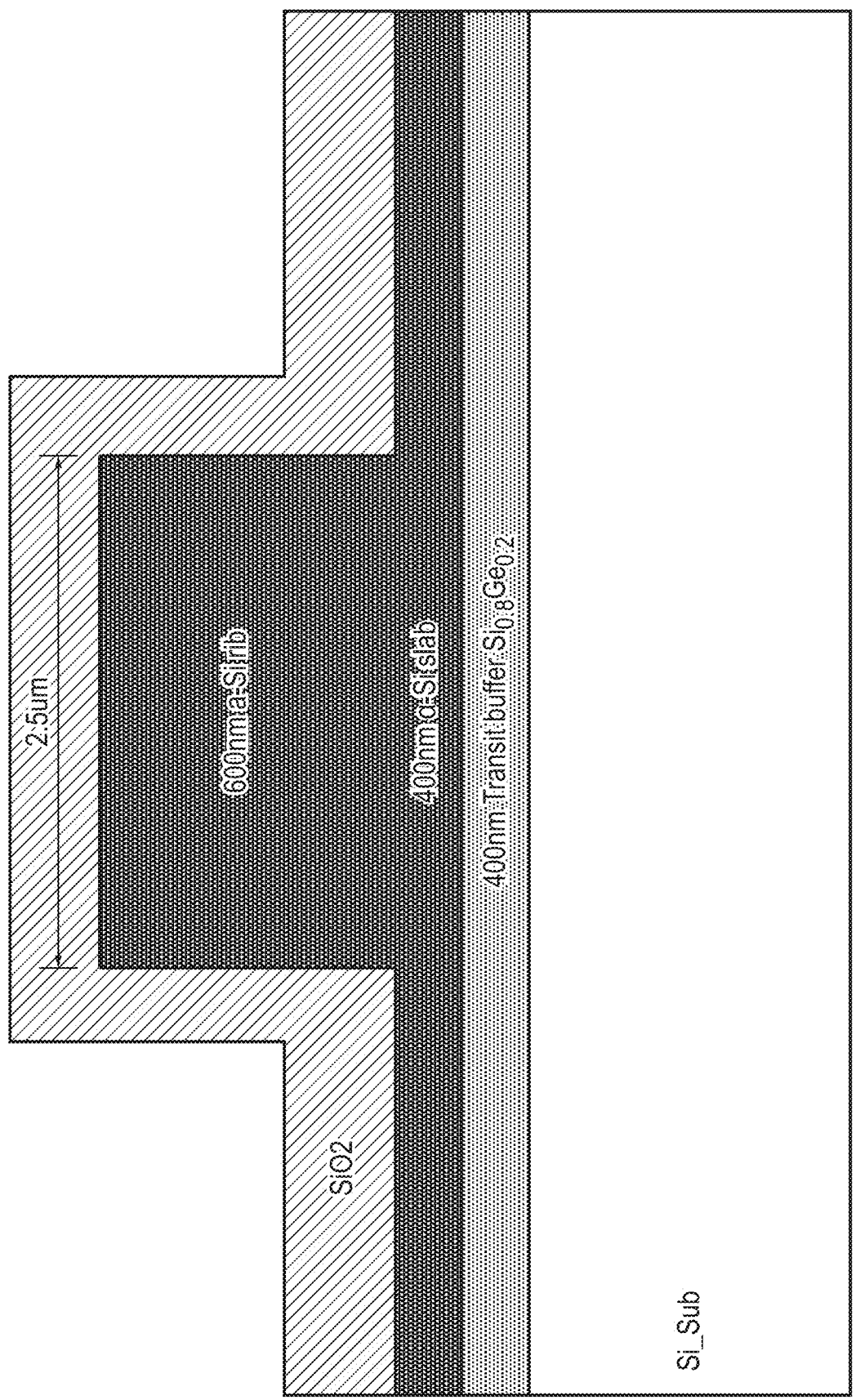

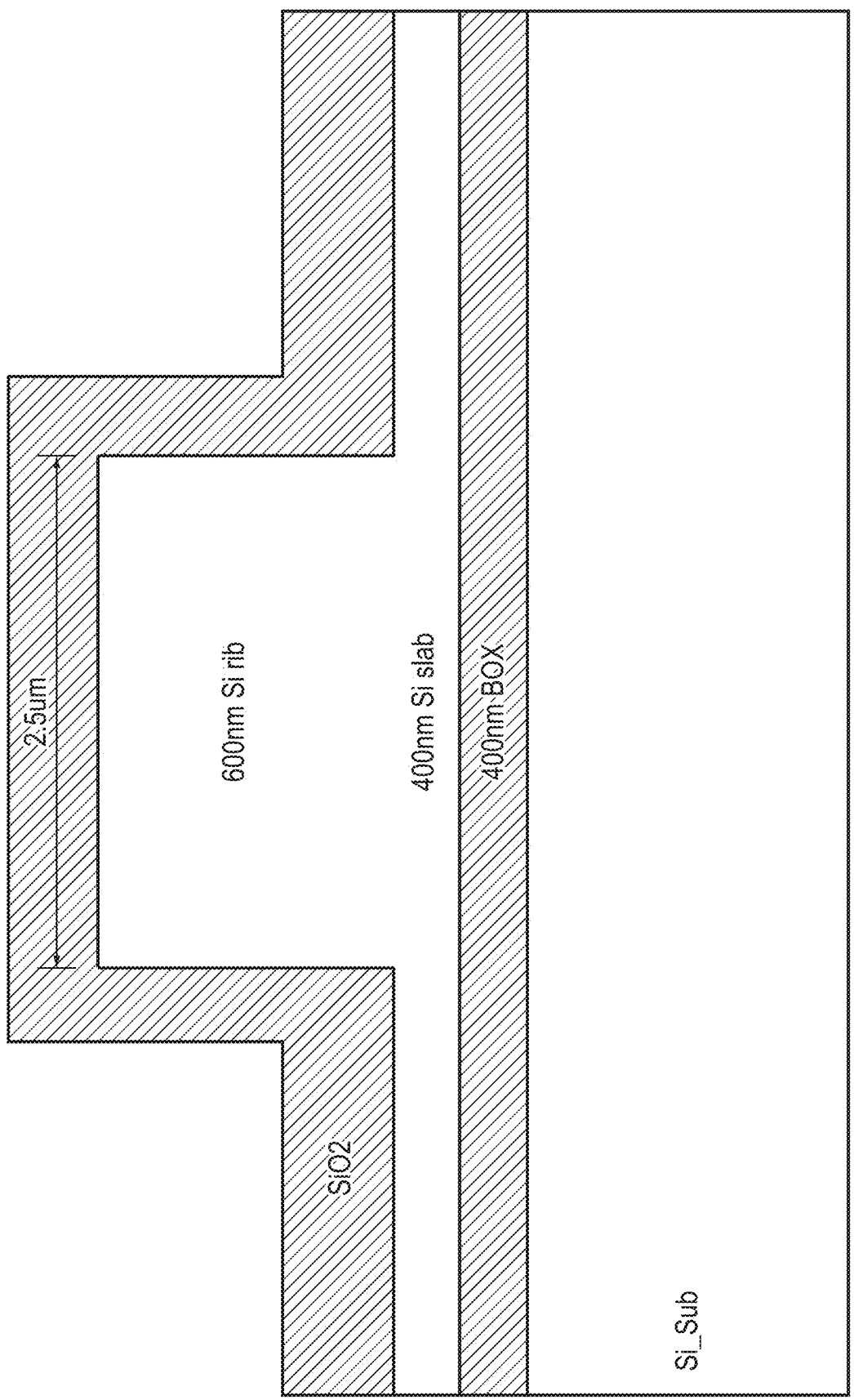

A) SOI 1um

B) Make cavity without BOX

C) SiGe MQW EPI deposition

D) Preparation for cavity facet etching

E) After cavity facet etching

F) α-Si filling

G) CMP a-Si

H) Etch a-Si to flat surface

I) Remove and re-deposit SiO2 for making rib waveguide

J) Waveguide litho (top view)

Section View

Etch SiO2, Si, α-Si and SiGe EPI to P-type buffer layer, top view

Litho and etching P-layer to transit buffer-layer (top view)

Section View

Make electrode (top view)

FIG. 17P

Section View

FIG. 17Q

Section view AA'

Section view BB'

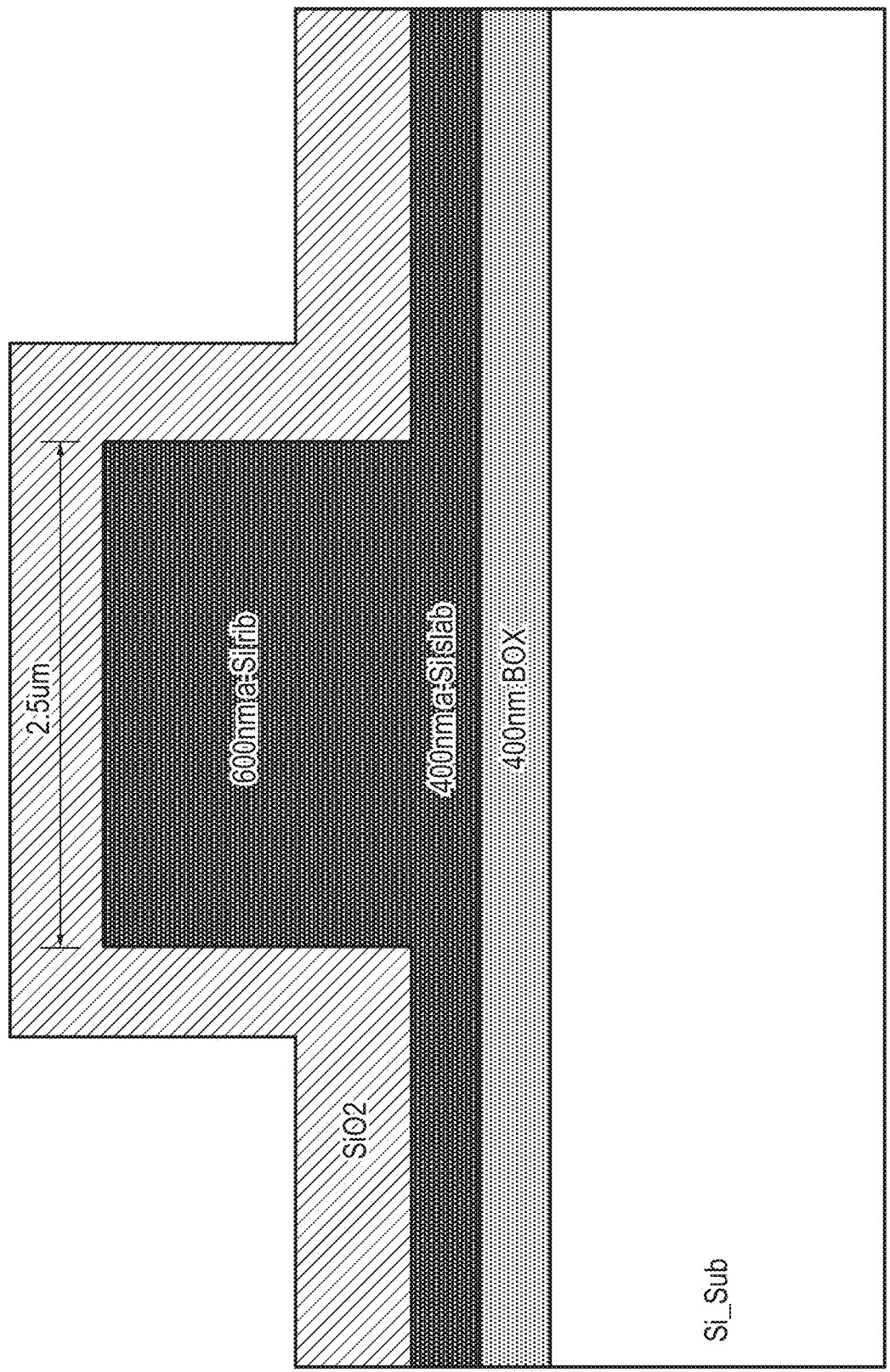

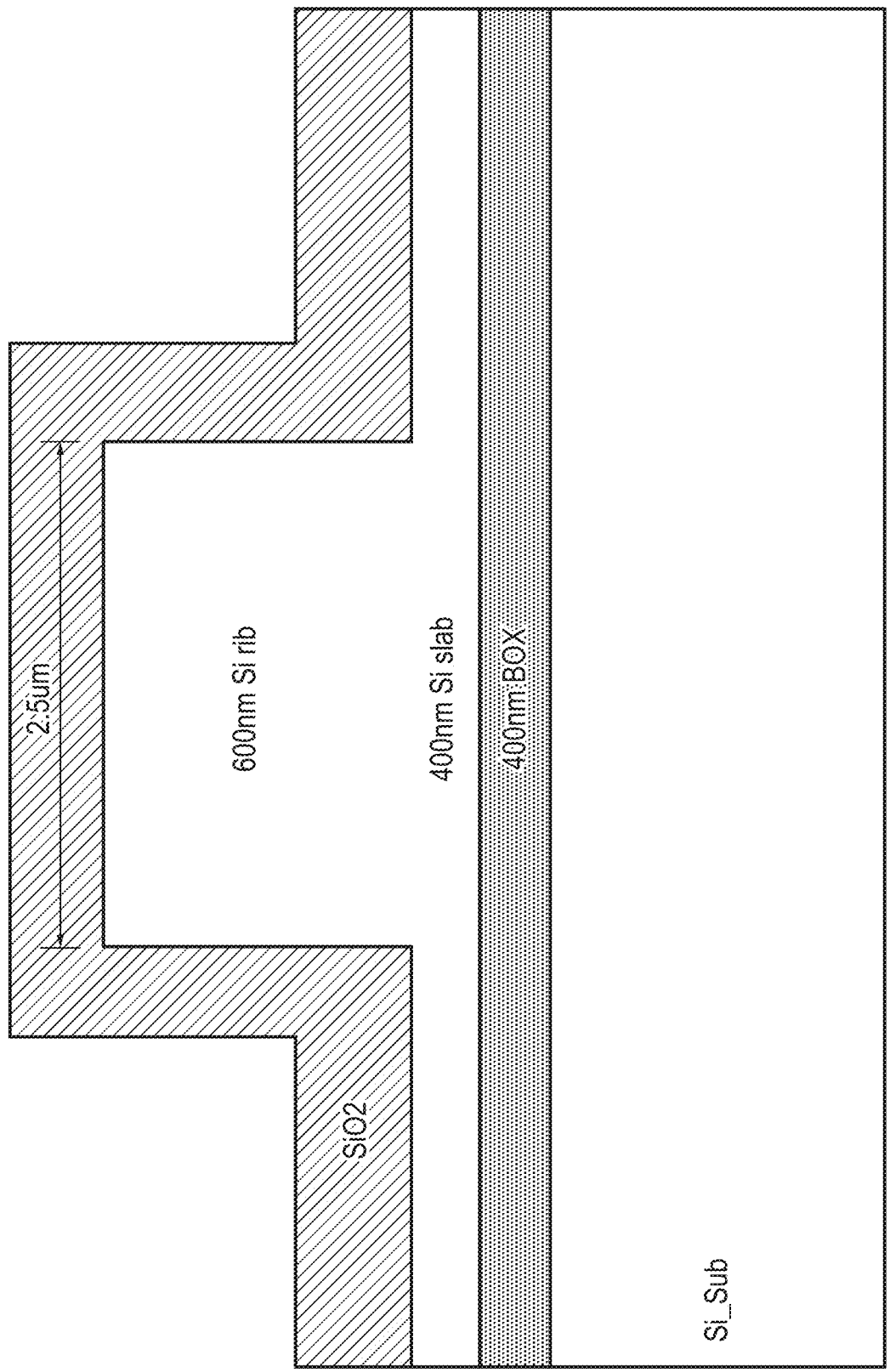

SOI 1μm make cavity through BOX

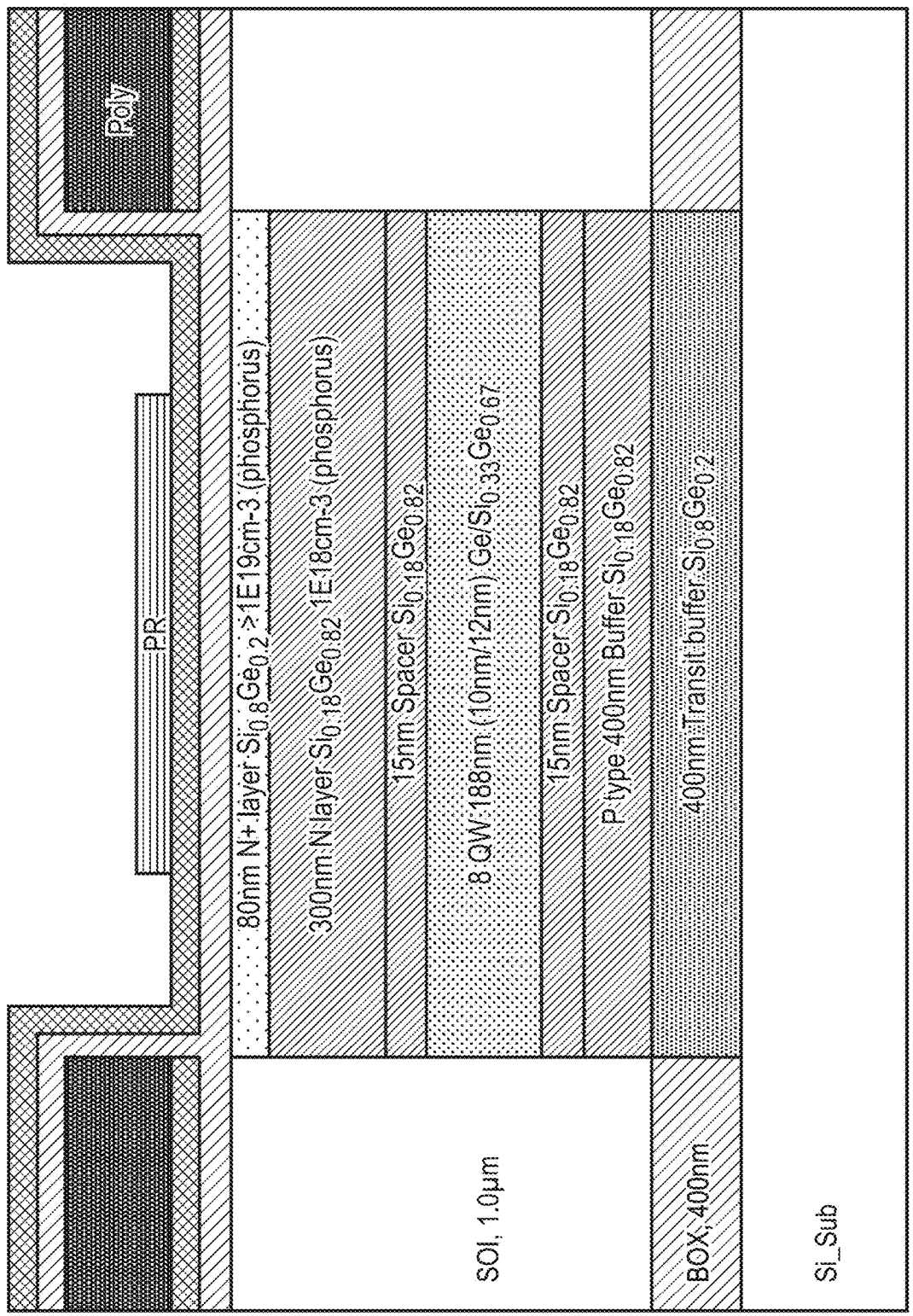
FIG. 20D Preparation for cavity facet etching

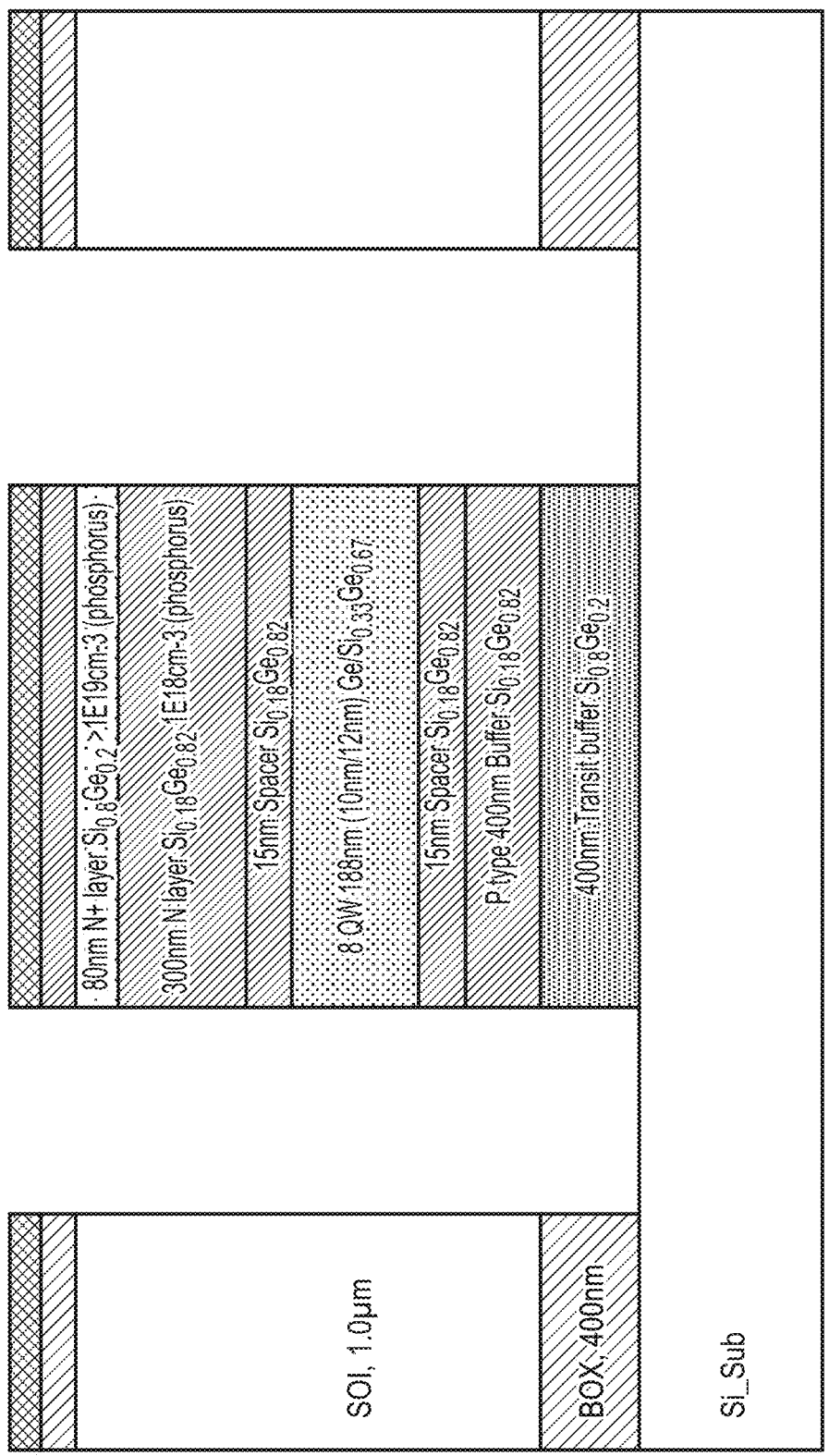
FIG. 20E After cavity facet etching

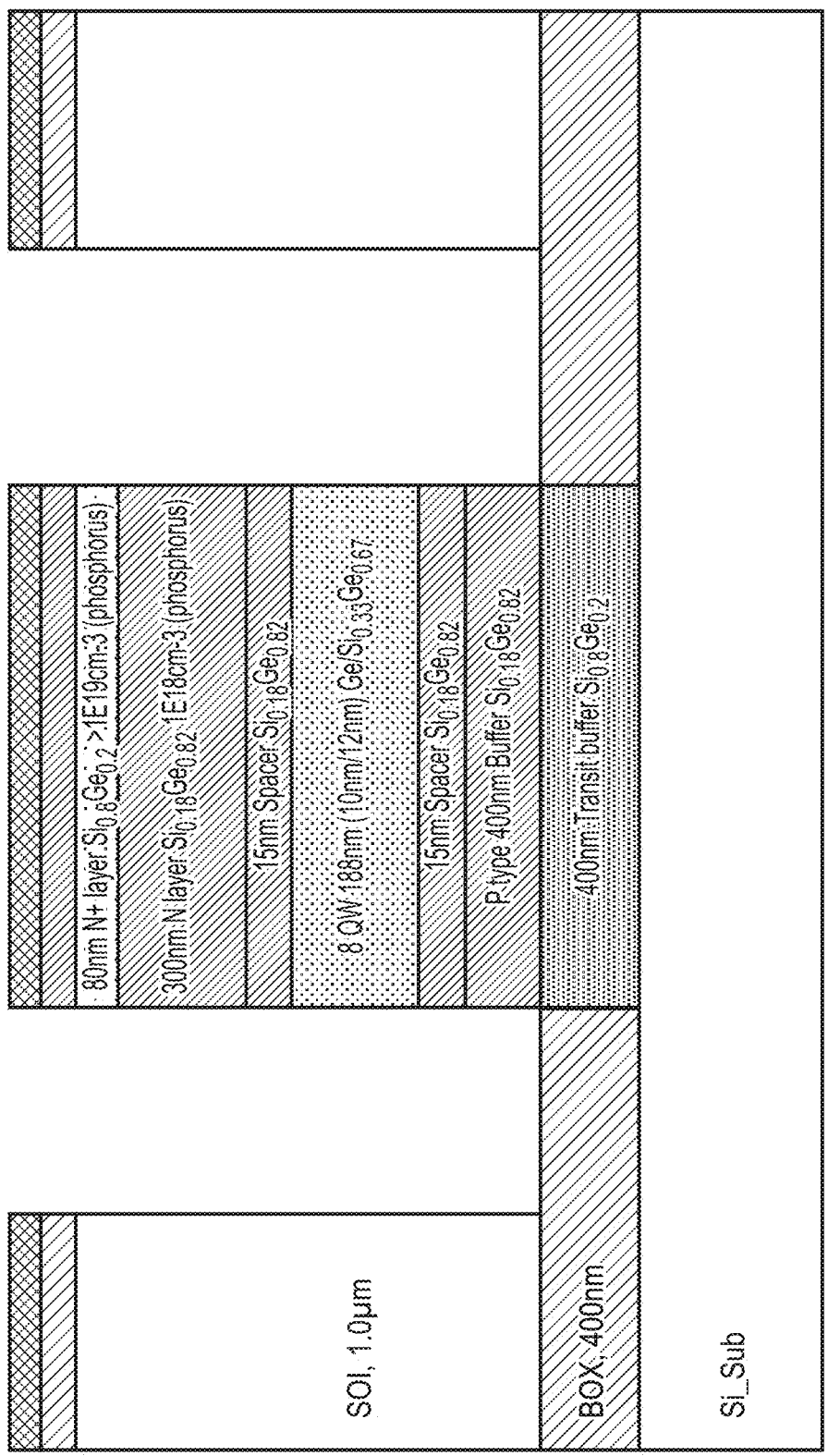
FIG. 20H Etch back SiO2 to BOX level

CMP α-Si and remove Si3N4

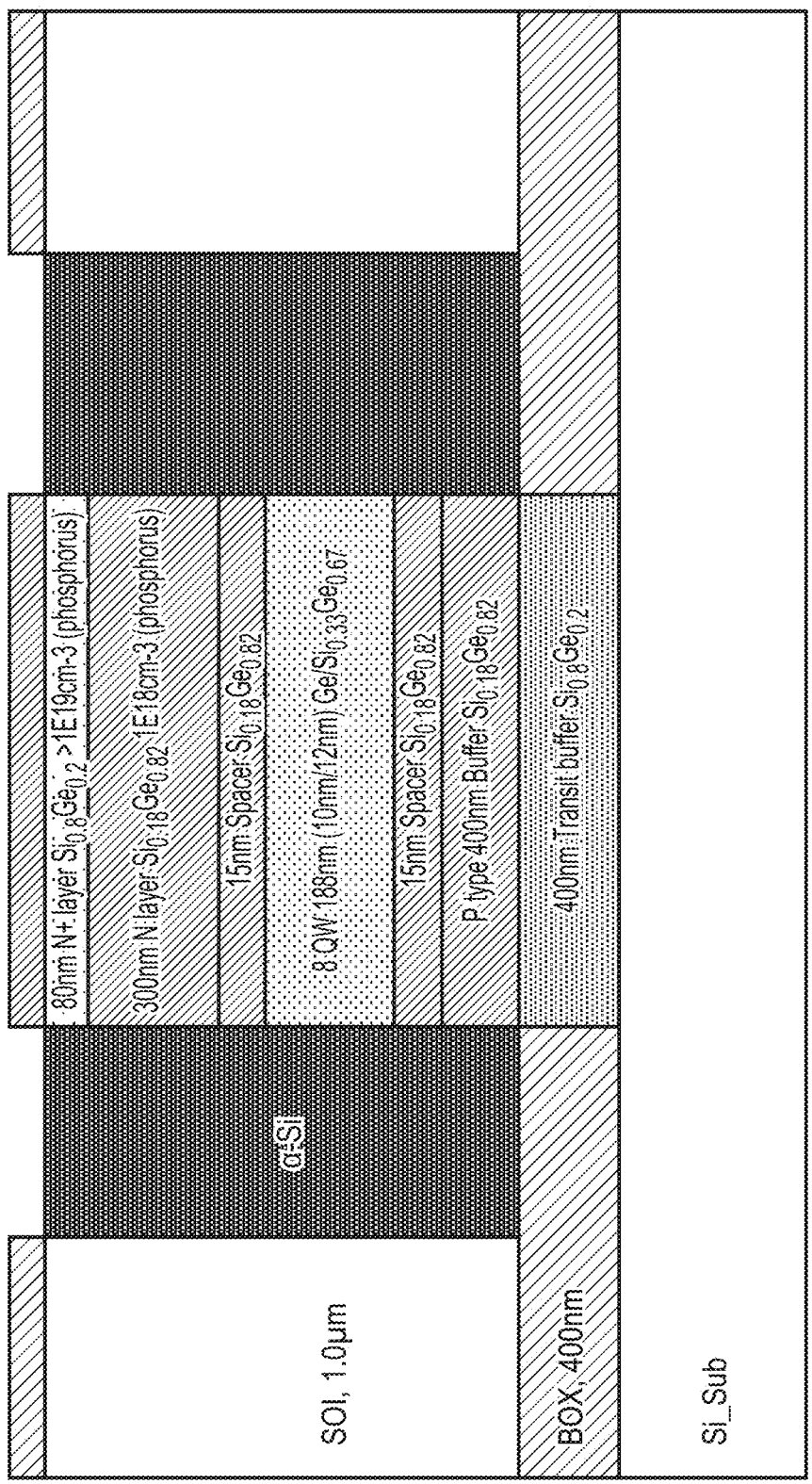
FIG. 20K Etch α-Si to flat surface

Remove and re-deposit SiO2 for making rib waveguide

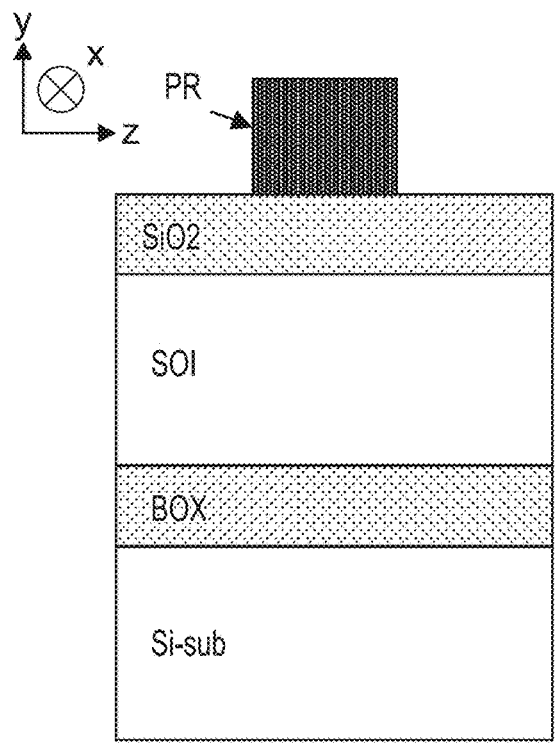
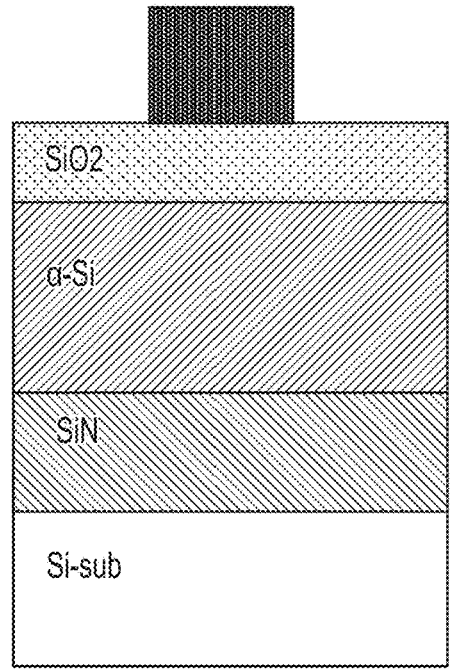
FIG. 27(A)　　　　FIG. 27(B)
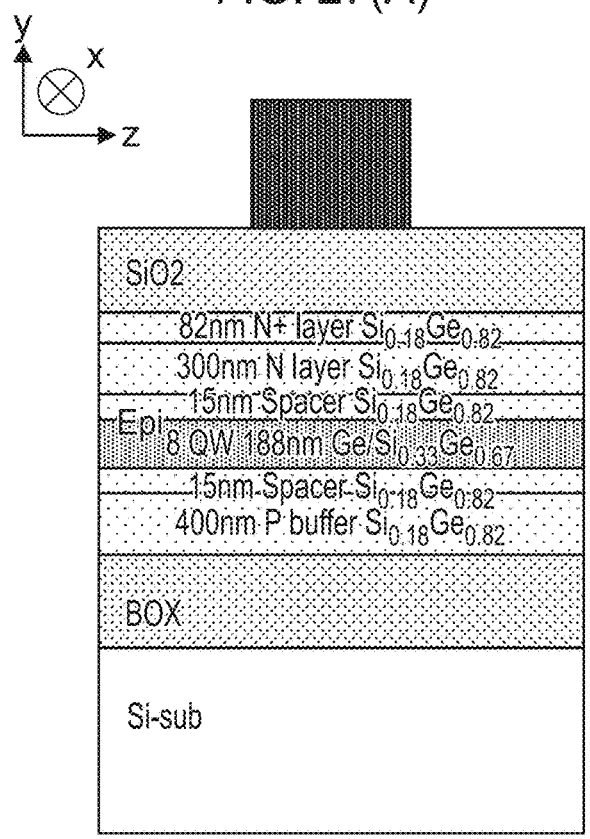
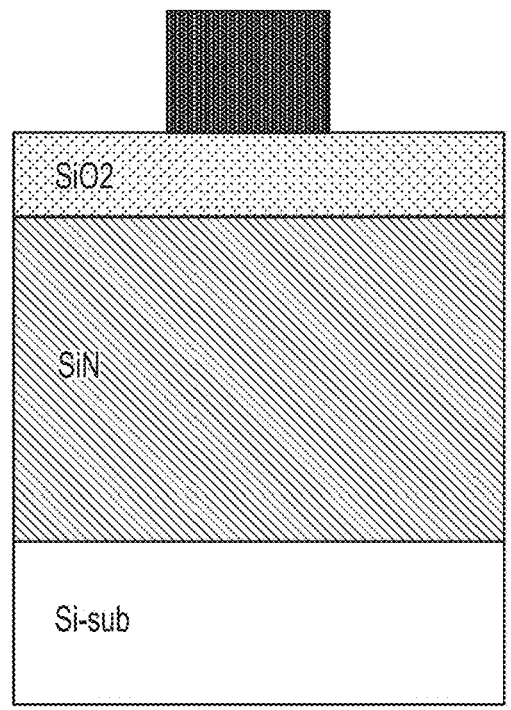
FIG. 27(C)　　　　FIG. 27(D)

ELECTRO-OPTICALLY ACTIVE DEVICE

CROSS-REFERENCE TO RELATED APPLICATION(S)

The present application is a continuation-in-part of U.S. patent application Ser. No. 16/463,203, filed May 22, 2019, which is a national stage application of International Application No. PCT/EP2017/080221, filed Nov. 23, 2017, which claims priority to and the benefit of U.S. Provisional Application No. 62/426,117, filed Nov. 23, 2016, and which claims priority to and the benefit of U.S. Provisional Application No. 62/427,132, filed Nov. 28, 2016. The entire contents of all documents identified in this paragraph are hereby incorporated herein by reference as if fully set forth herein.

FIELD

Embodiments of the present invention relate to silicon based electro-optically active devices, and particularly to electro-optic modulators.

BACKGROUND

As shown in FIG. 1, conventional electro-optically active devices may comprise a silicon substrate 101, on which is formed first and second passive waveguides 102a and 102b. An electro-optically active EPI stack 103 is grown in a gap between the passive waveguides, and may include first and second faceted or bending regions 104a 104b.

These faceted or bending regions of the EPI stack can produce significant losses in the device.

SUMMARY

Some embodiments provide an electro-optically active device and method of producing the same where the faceted regions are removed and replaced with a filling material.

Accordingly, in a first aspect embodiments of the invention provide a silicon based electro-optically active device comprising: a silicon-on-insulator (SOI) waveguide; an electro-optically active waveguide including an electro-optically active stack within a cavity of the SOI waveguide; and a channel between the electro-optically active stack and the SOI waveguide; wherein the channel is filled with a filling material with a refractive index greater than that of a material forming a sidewall of the cavity to thereby form a bridge-waveguide in the channel between the SOI waveguide and the electro-optically active stack.

In a second aspect, there is provided a method of producing a silicon based electro-optically active device, having the steps of: providing a silicon-on-insulator (SOI) waveguide; etching a cavity in a part of the SOI waveguide, through the BOX layer; epitaxially growing an electro-optically active stack within the cavity, and etching the electro-optically active stack to form an electro-optically active waveguide, wherein the epitaxially grown electro-optically active stack has a facet in a region adjacent to a sidewall of the cavity; etching the region to thereby remove the facet and produce a channel between the sidewall and the stack; and filling the channel with a filling material which has a refractive index which is greater than that of the material forming the sidewall, so that the filling material forms a bridge-waveguide in the channel between the SOI waveguide and the electro-optically active stack.

In a third aspect embodiments of the invention provide a silicon based electro-optically active device comprising: a silicon-on-insulator (SOI) waveguide; an electro-optically active waveguide including an electro-optically active stack within a cavity of the SOI waveguide, wherein the electro-optically active stack is separated from an insulator layer of the electro-optically active device by a seed layer; and a channel between the electro-optically active stack and the SOI waveguide; wherein the channel is filled with a filling material with a refractive index greater than that of a material forming a sidewall of the cavity to thereby form a bridge-waveguide in the channel between the SOI waveguide and the electro-optically active stack.

In a fourth aspect, there is provided a method of producing a silicon based electro-optically active device, having the steps of: providing a silicon-on-insulator (SOI) waveguide; etching a cavity in a part of the SOI waveguide, the cavity extending through a portion of a silicon device layer of the SOI waveguide and leaving a silicon seed layer above a BOX layer of the SOI waveguide; epitaxially growing an electro-optically active stack on the silicon seed layer within the cavity, and etching the electro-optically active stack to form an electro-optically active waveguide, wherein the epitaxially grown electro-optically active stack has a facet in a region adjacent to a sidewall of the cavity; etching the region to thereby remove the facet and produce a channel between the sidewall and the stack; and filling the channel with a filling material which has a refractive index which is greater than that of the material forming the sidewall, so that the filling material forms a bridge-waveguide in the channel between the SOI waveguide and the electro-optically active stack.

By electro-optically active stack, it may be meant that the stack comprises plural functional layers some of which are electro-optically active. For example, the stack may include a buffer layer, P doped layer and an N doped layer, separated by an intermediate layer which includes spacer layers, multiple quantum well (MQW) and barrier layers. These layers may be layered relative to the SOI waveguide on which the stack is formed, i.e. they are horizontal layers. The buffer layer functions as the virtual substrate for the MQW layer, and can be either un-doped or P-doped. The seed layer may be a silicon seed layer. The insulator layer of the electro-optically active device may be a buried oxide or BOX layer, which may comprise $SiO_2$.

In this way, light couples between the SOI waveguide and the electro-optically active stack via the bridge-waveguide such that there is no direct contact between a facet of the SOI waveguide in the region adjacent the sidewall of the cavity and the sidewall of the electro-optically active stack.

When viewed from the side of the device, the channel may be described as extending vertically downwards (i.e. in a direction at 900 to the surface of the SOI waveguide) from an uppermost side of the device towards the bottom of the cavity.

Optional features of embodiments of the invention will now be set out. These are applicable singly or in any combination with any aspect of embodiments of the invention.

The filling material may be amorphous silicon (α-Si) or SiGe material.

The silicon based electro-optically active device may include a silicon nitride liner, lining the sidewalls of the cavity, said silicon nitride liner being located between the SOI waveguide and the filling material.

The surface of the stack which is directed at the channel may be described as an etched surface. The etched surface will exhibit advantages over a grown-surface, in that undesirable bending region at the edges of each grown layer of the stack can be removed by etching. Instead, the interface between the stack and the channel will be sharp one; a slice through the stack. Therefore, the bending region is replaced by a filling material, which forms a straight bridge waveguide that is aligned with the SOI waveguide and the electro-optically active EPI stack.

The electro-optically active stack may have a parallelogramal or trapezoidal geometry when viewed from above (top down view).

The electro-optically active device may further comprise an epitaxial cladding layer located in-between the silicon substrate of the SOI waveguide and the optically active region which forms the electro-optically active waveguide. The epitaxial cladding layer has a refractive index less than that of the buffer layer in the electro-optically active stack. The epitaxial layer may be referred to as a regrown cladding layer in that it may be formed by etching away a pre-existing cladding region or part of a cladding region such as a buried oxide (BOX) region and then growing the epitaxial cladding layer in the etched cavity, the epitaxial cladding layer replacing a portion of the original cladding layer.

The step of filling the channel may be carried out by plasma-enhanced chemical vapour deposition (PECVD), or low-energy plasma-enhanced chemical vapour deposition (LEPECVD), or other epitaxial growth method at a temperature less than a lowest growth temperature of the stack. The temperature may be in the range of 250° C. and 500° C. In some embodiments the temperature may be in the range of 300° C. and 350° C.

The method may further include a step of planarizing the filling material through chemical-mechanical polishing.

The epitaxially grown electro-optically active stack may have a second facet in a second region adjacent to an opposite sidewall of the cavity, and the etching step may also remove the second region to thereby remove the second facet and produce a second channel between the opposite sidewall and the stack; the filling step may also fill the second channel with amorphous silicon or SiGe.

The method may further include the step of lining the cavity with a spacer prior to growing the stack. The spacer may be between 5 nm and 35 nm in thickness, and may be 20 nm in thickness. The method may further include the step of etching away a part of the lining which is in a bed of the cavity i.e. between the sidewalls of the cavity).

The method may include a step, performed before filling the channel with the filling material, of lining the channel with a silicon nitride liner.

The electro-optically active device may be any one of: an electro-optic modulator, a photodetector, or a laser. In some embodiments the device is an electro-optic modulator and in some embodiments it is a quantum-confined Stark effect based electro-absorption modulator.

The electro-optically active stack may comprise a multiple quantum well region.

The epitaxially grown stack may include a silicon layer and a buffer layer, and the method may include adjusting the height of the buffer layer such that an optical mode of the modulator matches an optical mode of the SOI waveguide. The silicon layer may be a lowermost layer of the epitaxially grown stack i.e. the layer closest to the bed of the cavity.

In some embodiments, the stack is ordered as follows going up from a layer immediately adjacent to a silicon substrate: a layer of silicon that has the same thickness of the BOX layer, a buffer layer comprising SiGe, a P doped layer comprising SiGe, a spacer layer comprising SiGe, a multiple quantum well layer comprising Ge/SiGe, a further spacer layer comprising SiGe, an N doped layer comprising SiGe, an N doped layer comprising SiGe, and an N+ doped layer comprising SiGe. In some embodiments, the stack is ordered as follows going up from a layer immediately adjacent to a silicon substrate: a layer of SiGe that has the same thickness of the BOX layer, a P doped buffer layer comprising SiGe, a spacer layer comprising SiGe, a multiple quantum well layer comprising Ge/SiGe, a further spacer layer comprising SiGe, an N doped layer comprising SiGe, and an N+ doped layer comprising SiGe.

More particularly, in some embodiments, the stack is ordered as follows going up from a layer immediately adjacent to the silicon substrate: a 400 nm silicon layer, a 400 nm buffer layer comprising $Si_{0.28}Ge_{0.72}$, a 200 nm P doped layer comprising $Si_{0.28}Ge_{0.72}$, a 50 nm (or 20 nm) spacer layer comprising $Si_{0.28}Ge_{0.72}$, 7 (or 10) quantum wells with each of the well comprising 10 nm Ge well layer and 12 nm $Si_{0.43}Ge_{0.57}$ barrier layer, a further 50 nm (or 20 nm) spacer layer comprising $Si_{0.28}Ge_{0.72}$, a 600 nm N doped layer comprising $Si_{0.28}Ge_{0.72}$, a 200 nm N doped layer comprising $Si_{0.8}Ge_{0.2}$, and a 100 nm N+ doped layer comprising $Si_{0.8}Ge_{0.2}$. The top 100 nm N+ doped layer is in some embodiments heavily doped (with a doping of more than $1\times10^{19}$ cm$^{-3}$, for example) to realise an ohmic contact with low contact resistance. The 400 nm buffer layer can also be P doped to reduce the series resistance and to obtain high speed.

In some embodiments, the stack is ordered as follows going up from a layer immediately adjacent to the silicon substrate: a 400 nm $Si_{0.8}Ge_{0.2}$ layer, a 400 nm P doped layer comprising $Si_{0.18}Ge_{0.82}$, a 15 nm (or 50 nm) spacer layer comprising $Si_{0.18}Ge_{0.82}$, 8 quantum wells with each of the well comprising 10 nm Ge well layer and 12 nm $Si_{0.33}Ge_{0.67}$ barrier layer, a further 15 nm (or 50 nm) spacer layer comprising $Si_{0.18}Ge_{0.82}$, a 300 nm N doped layer comprising $Si_{0.18}Ge_{0.82}$ and a 80 nm N+ doped layer comprising $Si_{0.8}Ge_{0.2}$. The top 80 nm N+ doped layer is in some embodiments heavily doped (with a doping of more than $1\times10^{19}$ cm$^{-3}$, for example) to realise an ohmic contact with low contact resistance.

BRIEF DESCRIPTION OF THE DRAWINGS

Embodiments of the invention will now be described by way of example with reference to the accompanying drawings in which:

FIG. 5 is a table showing the simulation results of the device at 1310 nm shown in FIG. 2;

FIGS. 16A-D show cross-sectional views at various locations of the device of FIG. 15;

FIGS. 19A-D show cross-sectional views at various locations of the device of FIG. 18;

FIGS. 20A-L show various stages of a method producing the device shown in FIG. 18

FIGS. 25a-33(D) show various stages of a method of producing the device shown in FIG. 21.

DETAILED DESCRIPTION AND FURTHER OPTIONAL FEATURES

Figure 2:
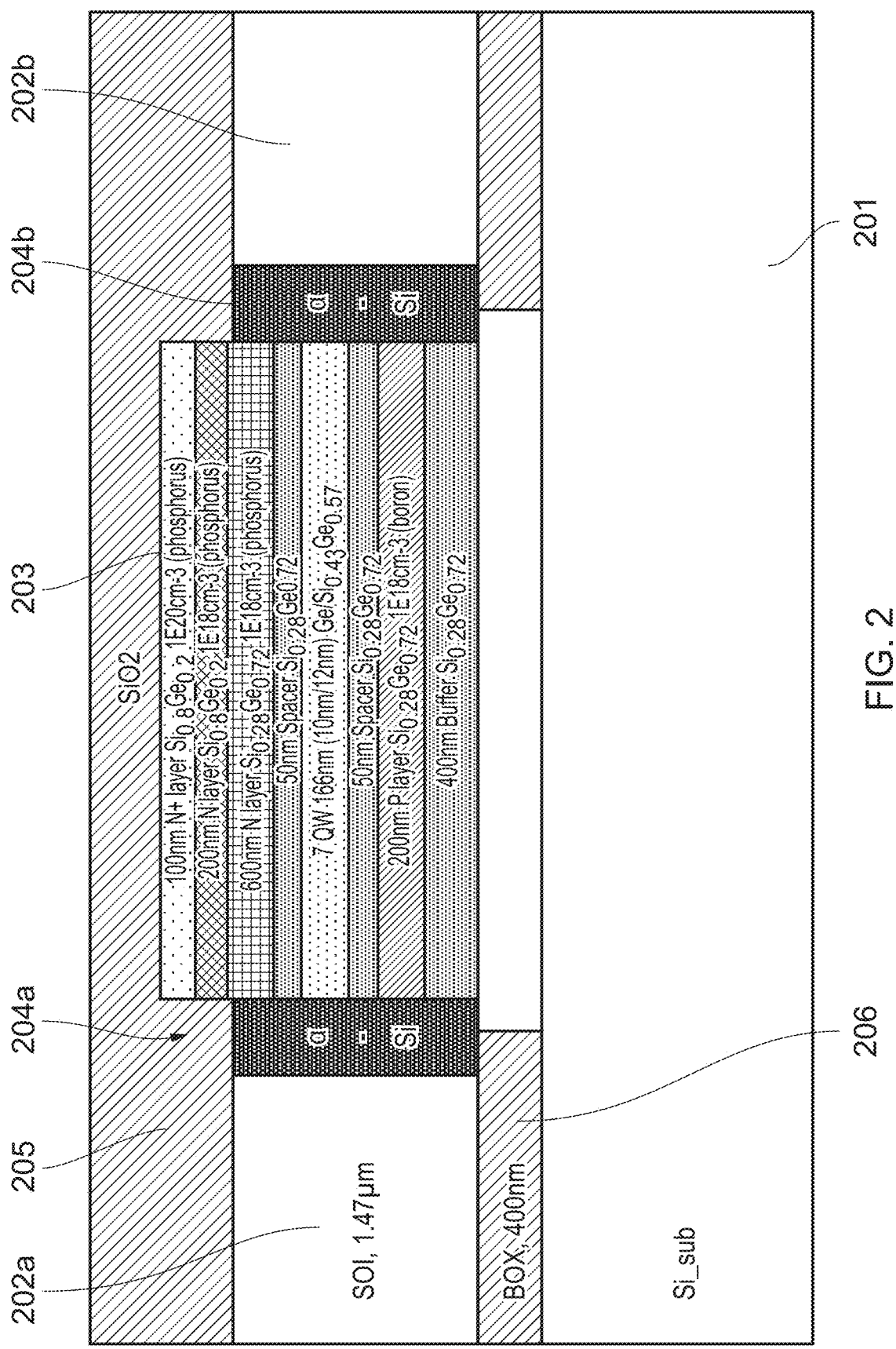
FIG. 2 shows a device according to embodiments of the present invention.

FIG. 2 shows an electro-optically active device which comprises a silicon substrate 201. Disposed on top of two regions of the substrate is a buried oxide layer (BOX) 206, which is around 400 nm thick. On top of the BOX layer are first and second passive silicon-on insulator (SOI) waveguides 202a and 202b. These SOI waveguides are 1.47 µm thick. In between the first and second passive SOI waveguides is an electro-optically active stack 203, and either side of the stack are first and second channels 204a and 204b which have been filled with amorphous silicon (α-Si) (or SiGe, or other material that has higher refractive index than silicon) thereby providing a bridge-waveguide. A capping oxide layer 205 is disposed on top of the stack, channels, and passive SOI waveguides.

In the embodiment shown in FIG. 2, the stack is ordered as follows going up from a layer immediately adjacent to the silicon substrate: a 400 nm silicon layer, a 400 nm buffer layer comprising $Si_{0.28}Ge_{0.72}$, a 200 nm P doped layer comprising $Si_{0.28}Ge_{0.72}$, a 50 nm spacer layer comprising $Si_{0.28}Ge_{0.72}$, 7 quantum wells with each of the well comprising 10 nm Ge well layer and 12 nm $Si_{0.43}Ge_{0.57}$ barrier layer, a further 50 nm spacer layer comprising $Si_{0.28}Ge_{0.72}$, a 600 nm N doped layer comprising $Si_{0.28}Ge_{0.72}$, a 200 nm N doped layer comprising $Si_{0.8}Ge_{0.2}$, and a 100 nm N+ doped layer comprising $Si_{0.8}Ge_{0.2}$.

The P doped layer may be doped with boron to a concentration of $1 \times 10^{18}$ cm$^{-3}$. The N doped layer may be doped with phosphorus to a concentration of $1 \times 10^{18}$ cm$^{-3}$. The N+ doped layer may be doped with phosphorus to a concentration of greater than or equal to $1 \times 10^{19}$ cm$^{-3}$.

Figure 3A:
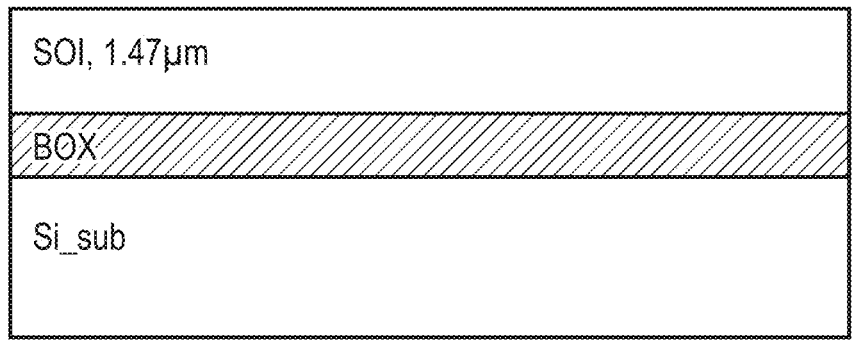
FIG. 3A-3N show cross-sectional views of various stages of a method producing the device shown in FIG. 2.

FIG. 3A shows a first step in producing the device shown in FIG. 2. Here a 1.47 µm thick silicon-on-insulator (SOI) layer is provided on top of a buried oxide layer (BOX). The BOX layer is itself positioned on top of a silicon substrate layer (Si_Sub).

Figure 3B:
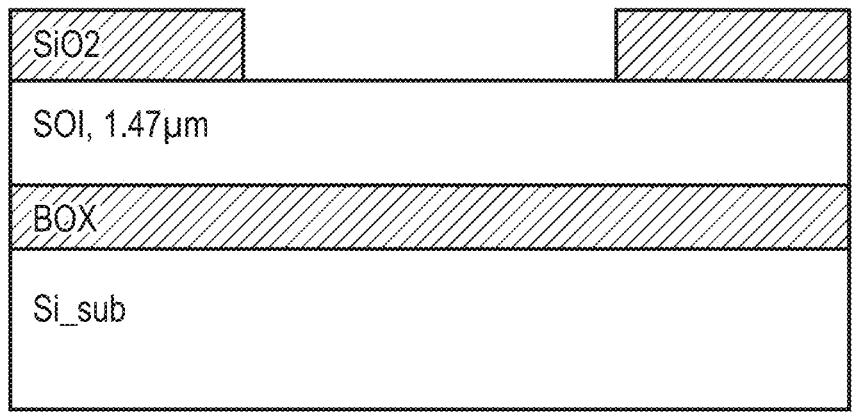
FIG. 3O-3S show top-down views of subsequent stages performed on the device shown in FIG. 3A-3N.
Figure 3C:
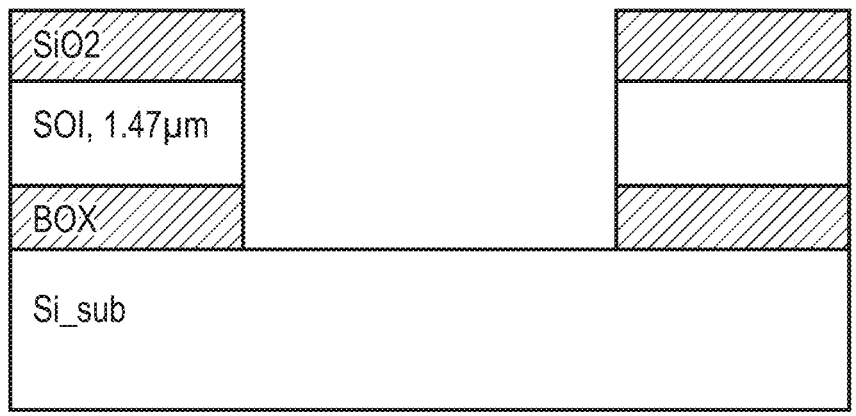

In a next step, shown in FIG. 3B, an oxide cavity window is provided. The oxide in this example is $SiO_2$ to provide a hard mask for etching. The window in between the two non-continuous parts defines the width of the cavity. The window is then etched, and the result is shown in FIG. 3C. The cavity is etched down to the Si_Sub layer, through the BOX layer.

Figure 3D:
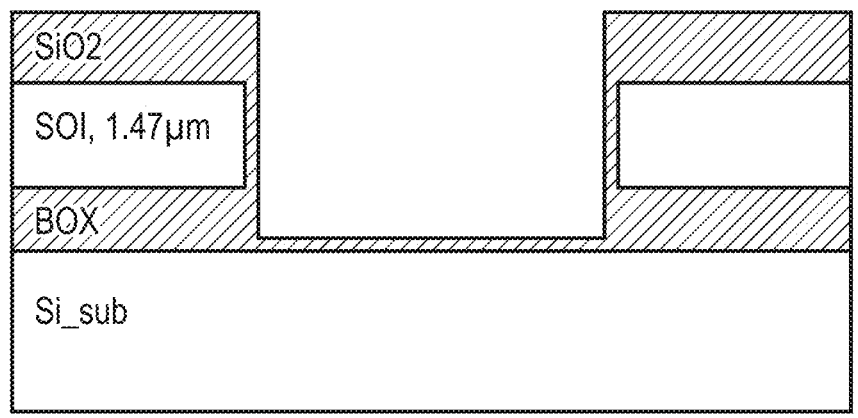

An oxide spacer layer is then deposited within the cavity as shown in FIG. 3D. The oxide spacer layer is $SiO_2$ and has a thickness of 20 nm. This means that the spacer layer lines the now formed cavity with a 20 nm thick lining along both the sidewalls and the bed of the cavity.

Figure 3E:
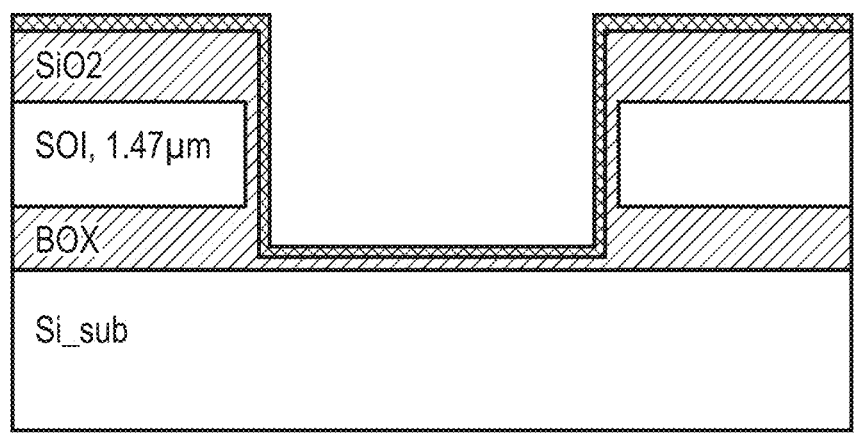
Figure 3F:
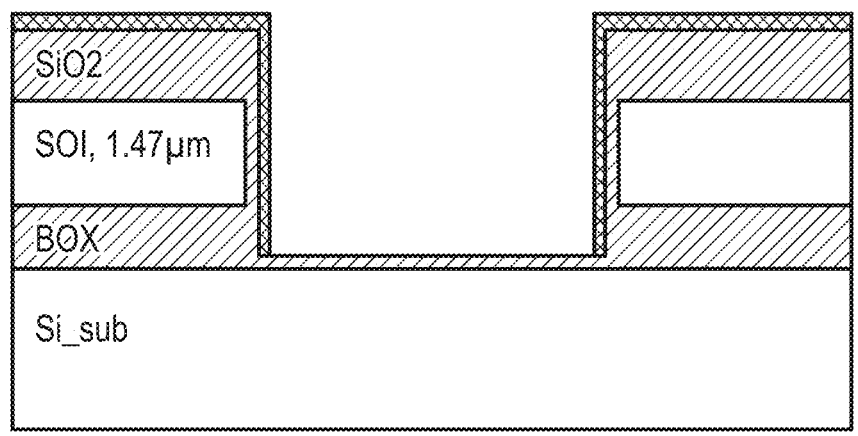
Figure 3G:
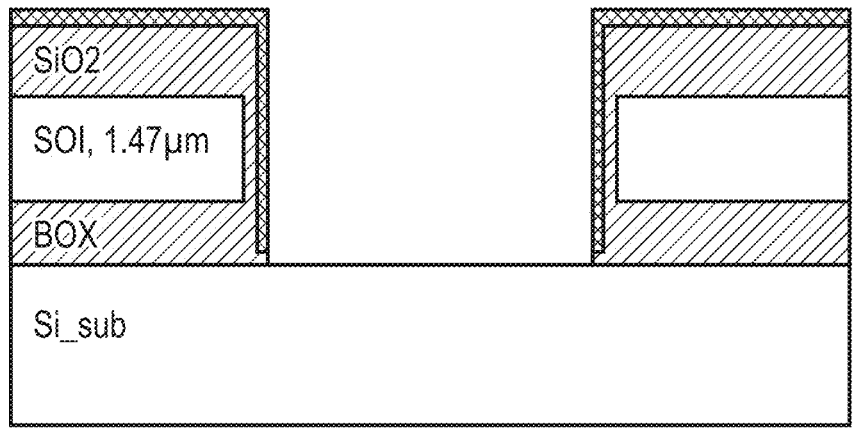
Figure 3H:
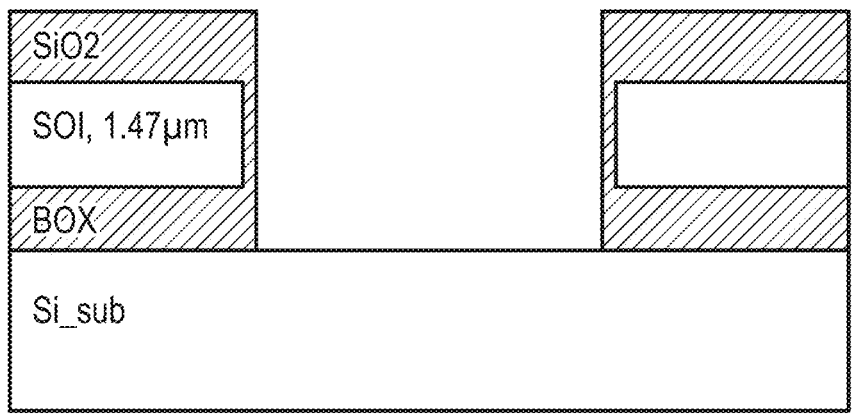

In the next step, shown in FIG. 3E, a $Si_3N_4$ cover layer is deposited over the sidewalls and the bed of the cavity. Next, the $Si_3N_4$ along a part of the bed of the cavity is etched so that the spacer layer is exposed. The result is shown in FIG. 3F. This allows the part of the spacer layer which is on the bed of the cavity to be etched away without removing the parts of the spacer layer disposed along the sides of the sidewalls, as shown in FIG. 3G. The $Si_3N_4$ is then removed (see FIG. 3H).

Figure 3I:
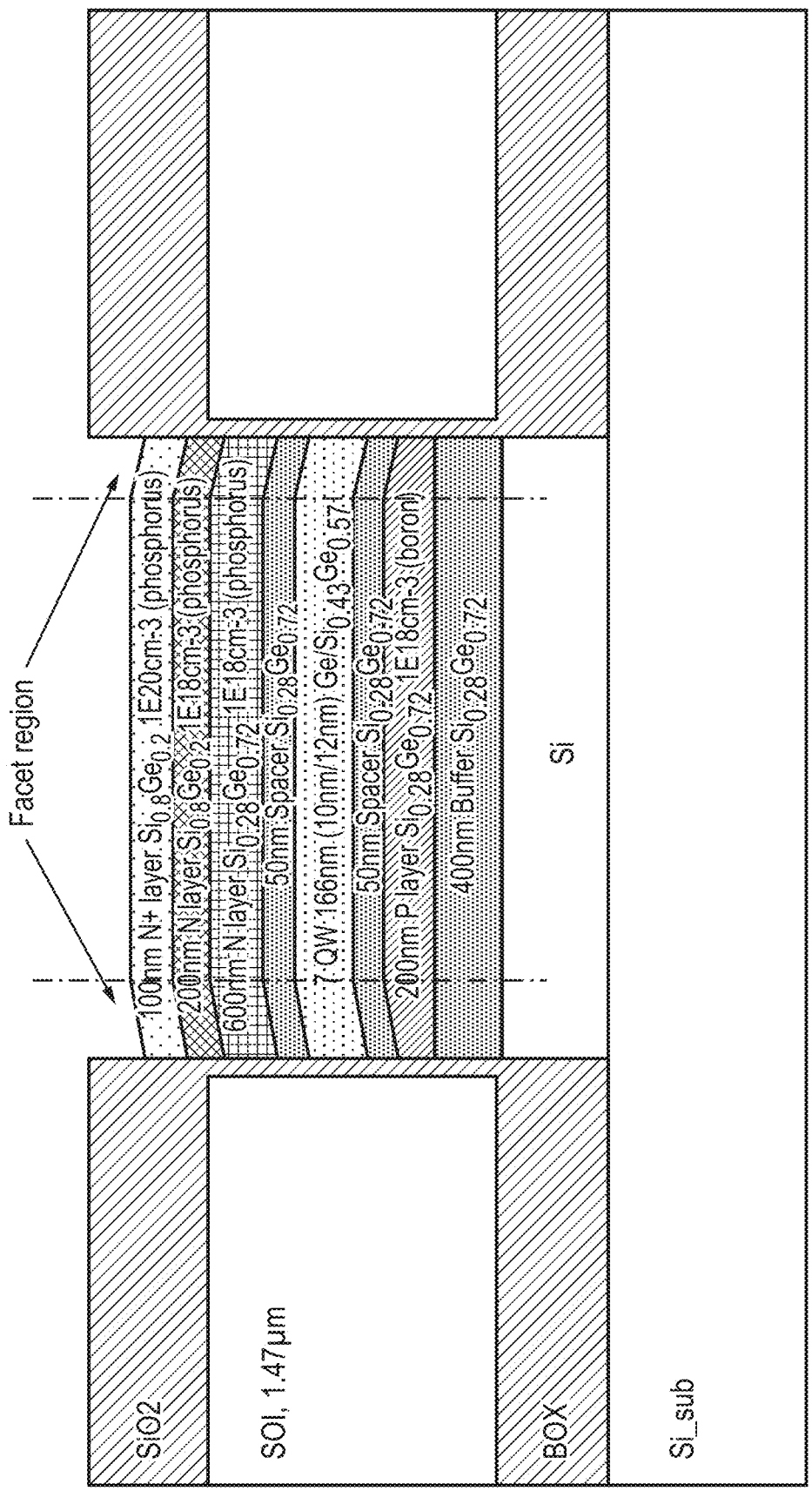

Next, a layer of Si with substantially the same thickness of BOX layer is grown first followed by the electro-optically active stack is selectively grown within the cavity defined by the sidewalls and spacer layer. The spacer layer helps ensure that the epitaxy process used to grow the stack produces a relatively uniform crystalline structure to the stack i.e. the stack grows only from the bed of the cavity and not from the side regions. The result of this growth is shown in FIG. 3I. The electro-optically active stack can also be grown by LEPECVD (Low-Energy Plasma-Enhanced Chemical Vapour Deposition) method, if so, there will be polycrystalline stack on top of the side regions (as shown in FIG. 17C). As can be seen in this figure, there are two faceted regions either side of the stack adjacent to the sidewalls (as indicated). The surfaces of the stack which is immediately adjacent to the sidewalls may be described as grown-surfaces as they are the result of epitaxial growth.

Figure 3J:
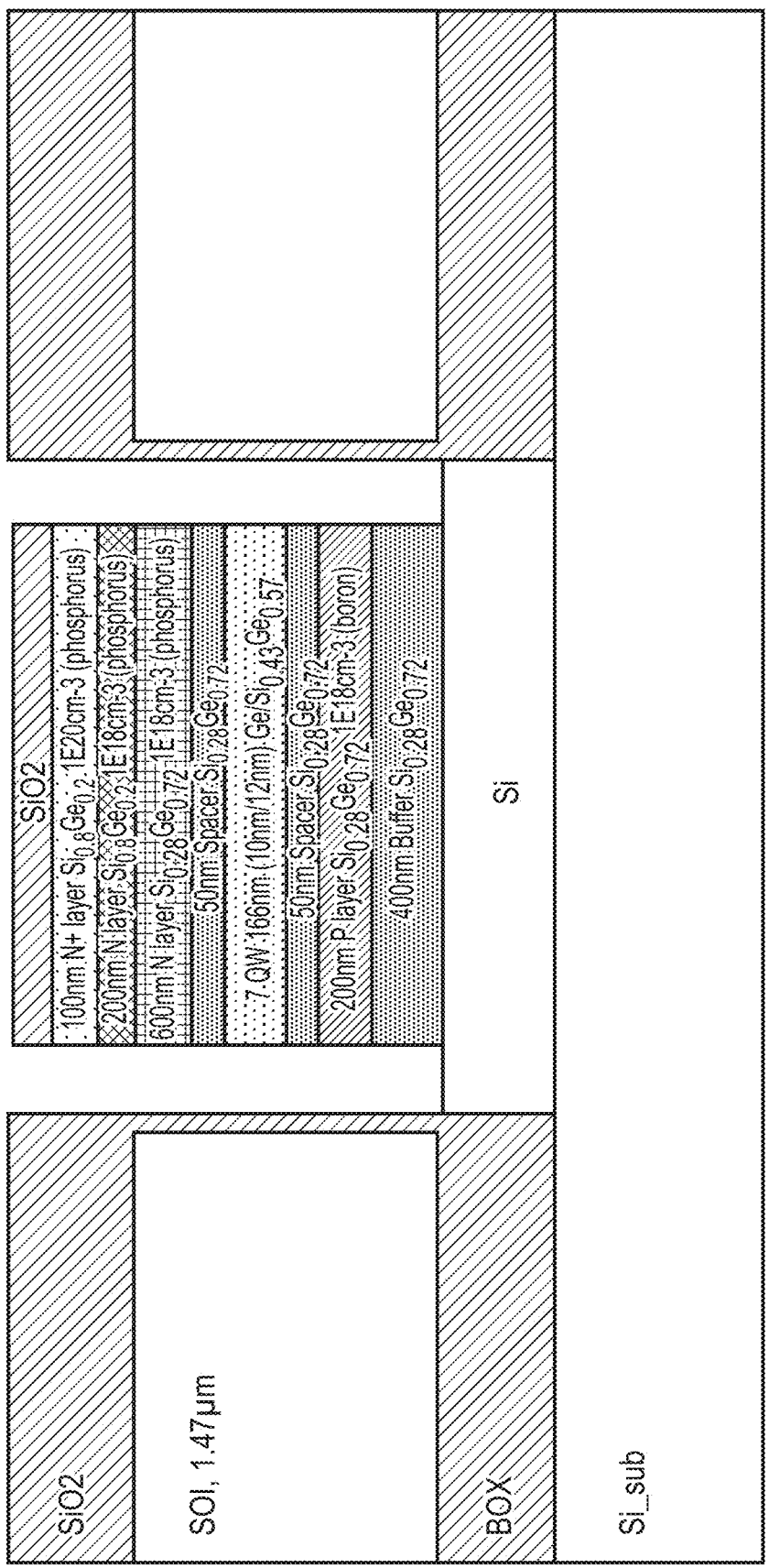

As shown in FIG. 3J, the stack is then etched to remove the faceted regions. This results in two channels, each adjacent to a respective sidewall, and the faces of the stack immediately adjacent to the channels are now etched-faces as opposed to grown-faces.

Figure 3K:
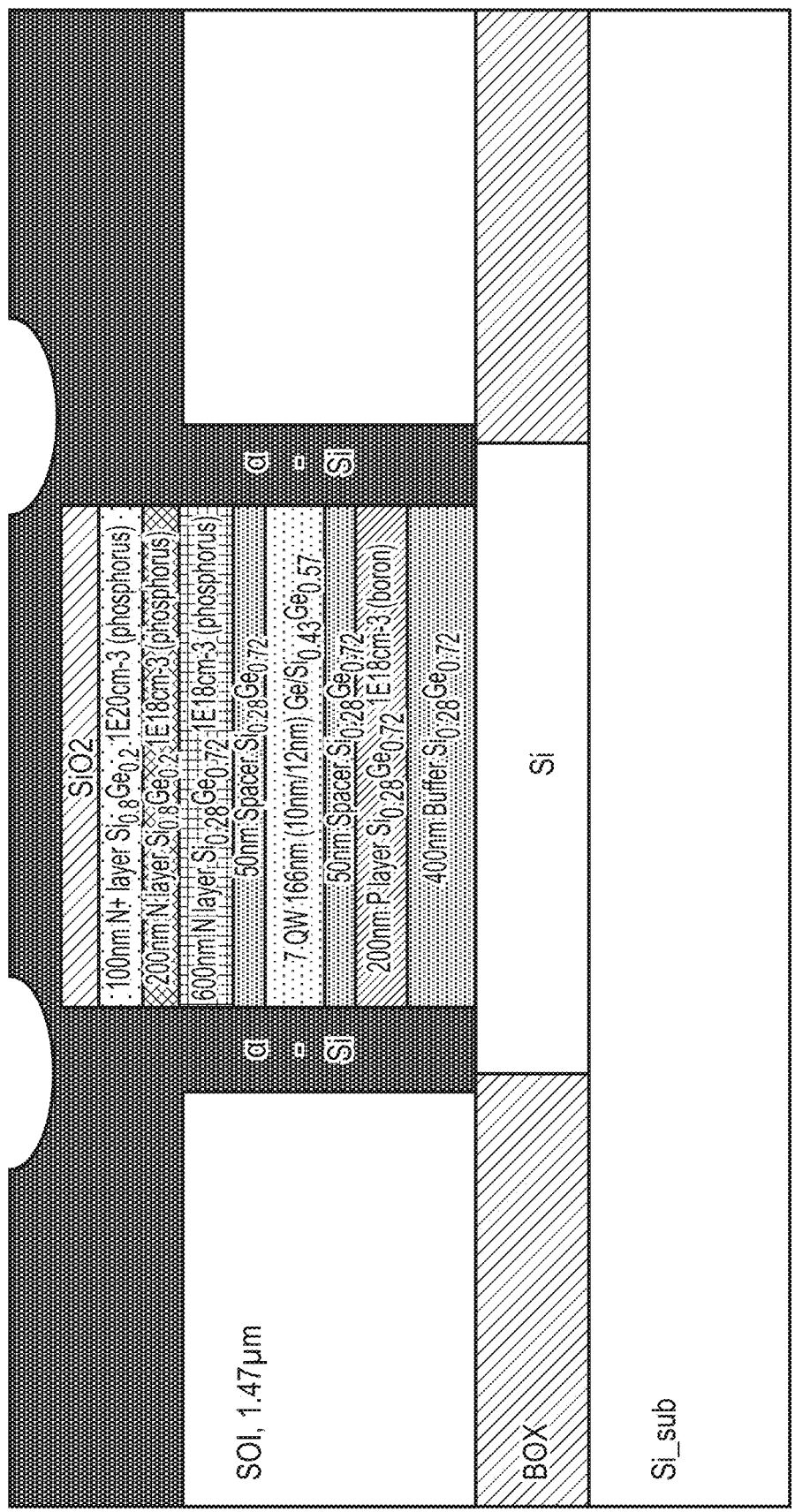

Next, amorphous silicon (α-Si), or SiGe, is deposited on the device. The α-Si fills the two channels, as well as providing a capping layer to the sidewalls. The deposition takes place at a temperature lower than a lowest EPI growth temperature of the stack. The result is shown in FIG. 3K.

Figure 1:
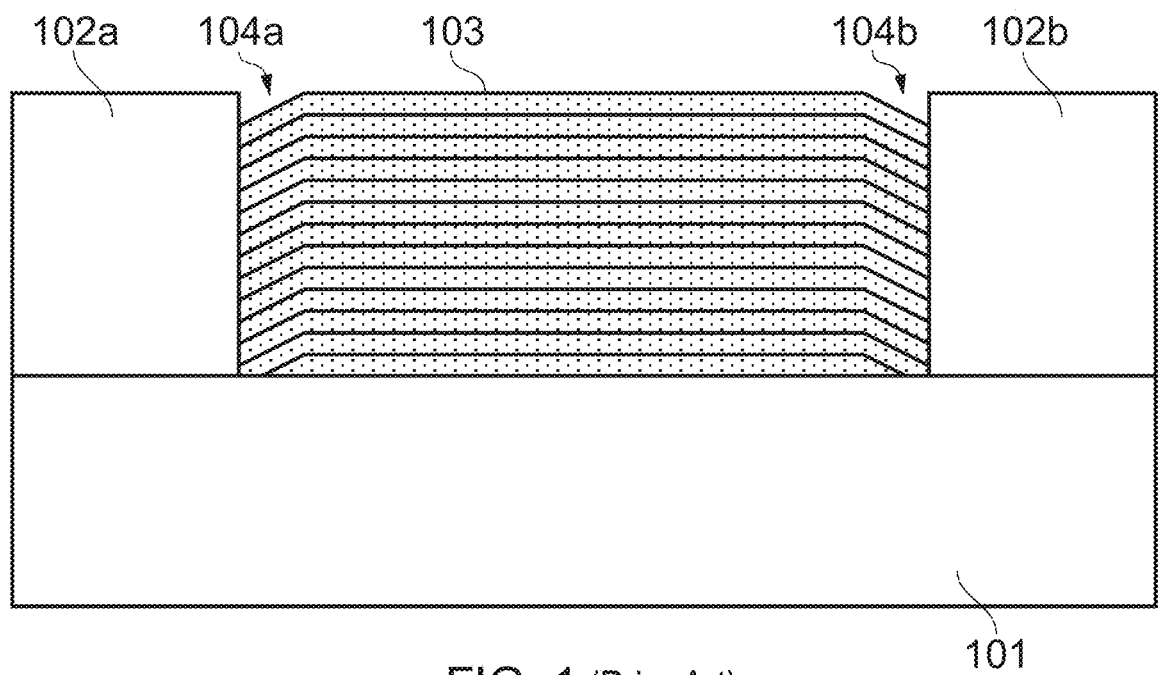
FIG. 1 shows a device according to the prior art.
Figure 3L:
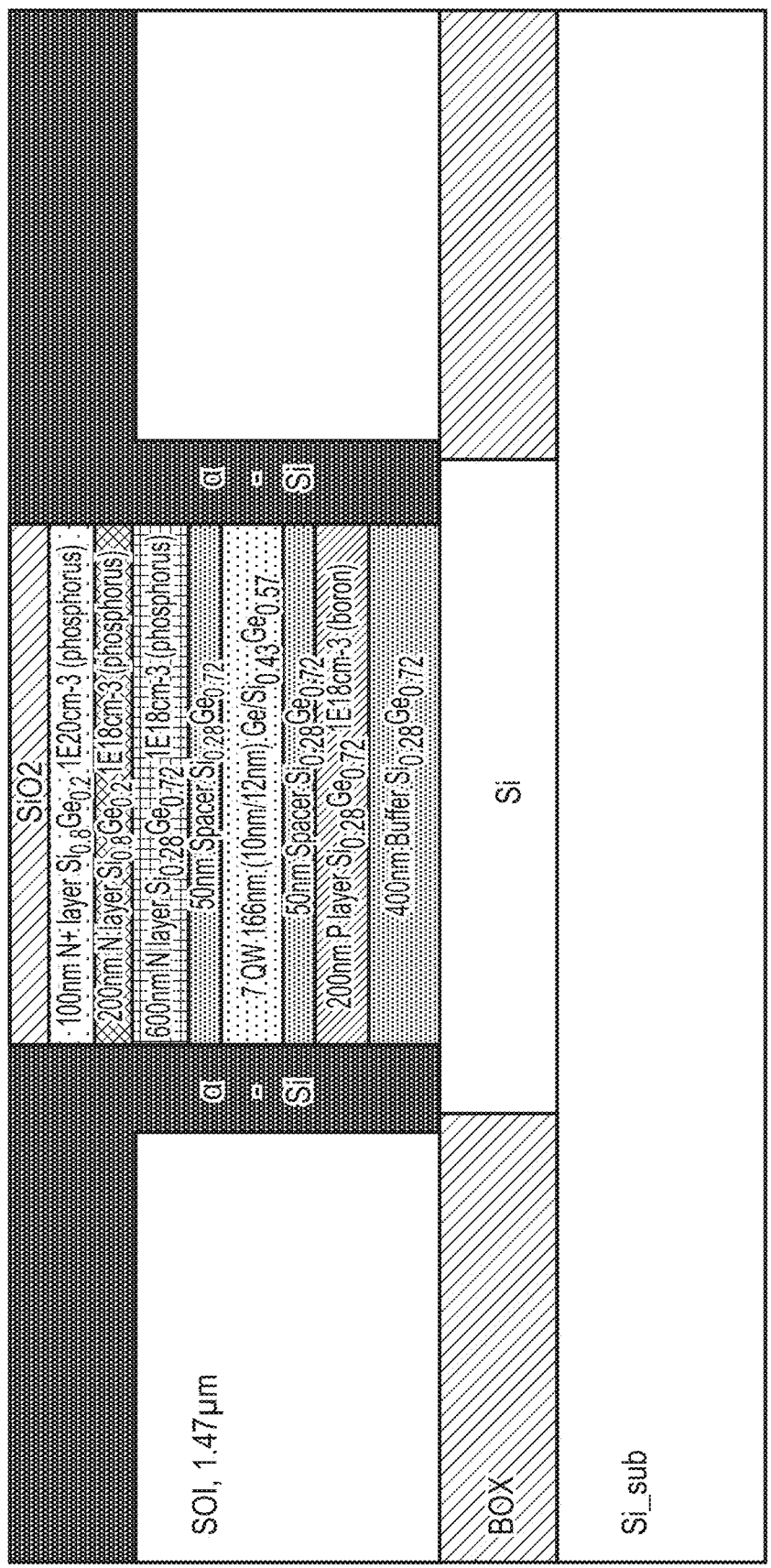
Figure 3M:
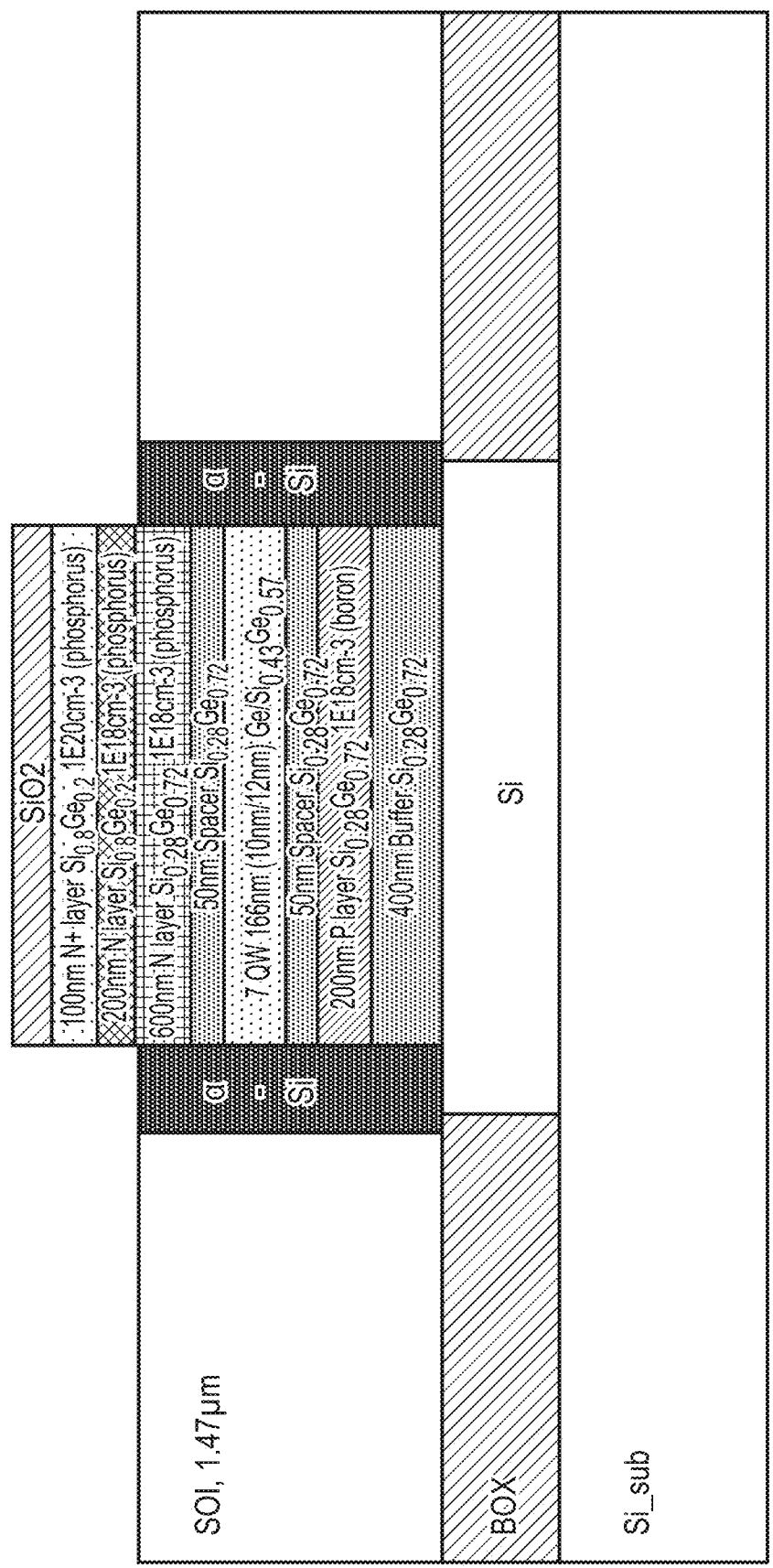
Figure 3N:
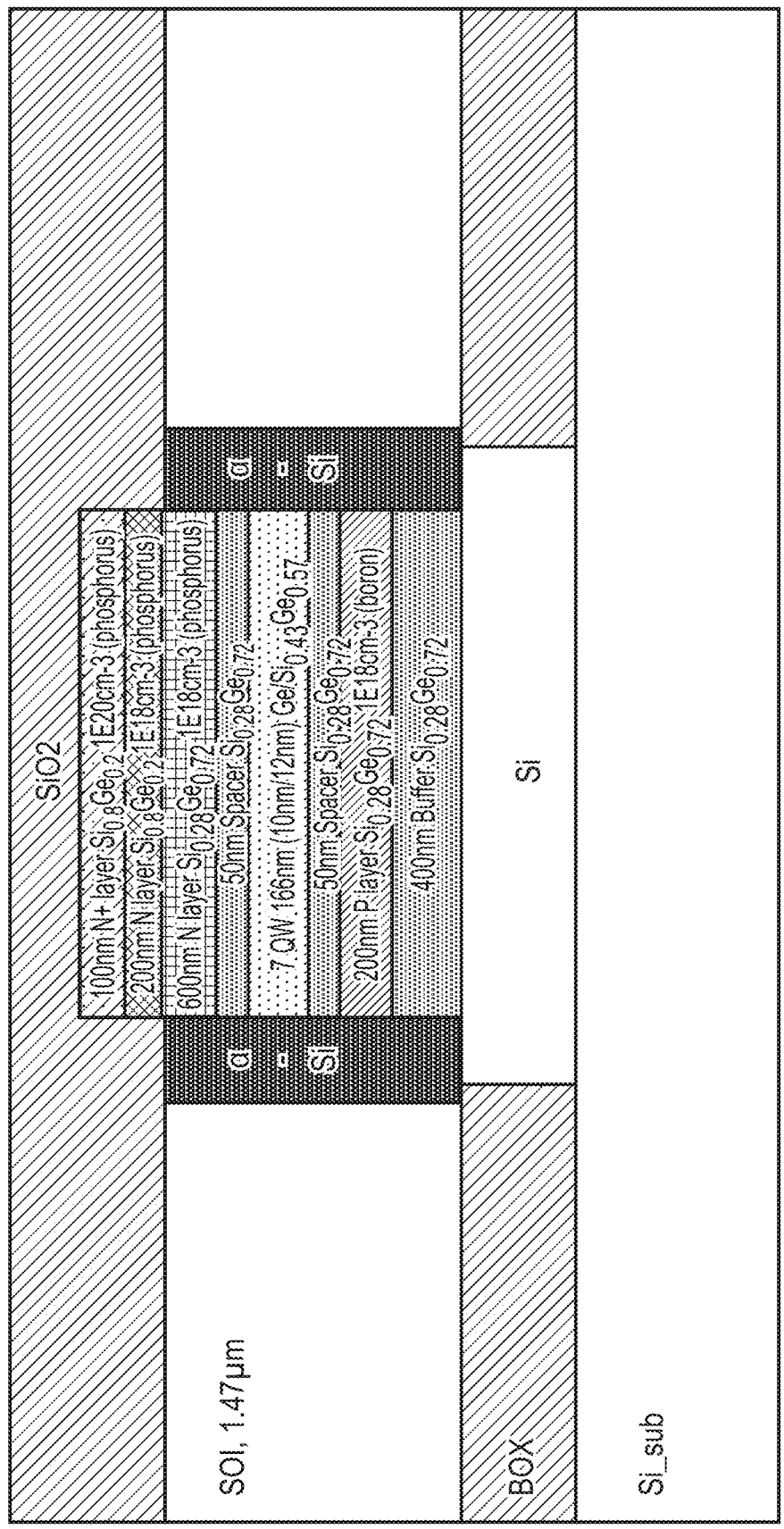

A next step involves chemical-machine polishing the device so as to planarize the uppermost surface as shown in FIG. 3L. The amorphous silicon can then be etched away until only the amorphous silicon which fills the channels remains (see FIG. 3M). A $SiO_2$ capping layer is then provided over the device as shown in FIG. 3N. This completes the steps for producing an electro-optically active stack which does not include faceted regions evident in FIG. 1. Next steps from FIG. 3O to FIG. 3S show the waveguide and metallization process procedures from top view with a self-aligned etching process.

Figure 3O:
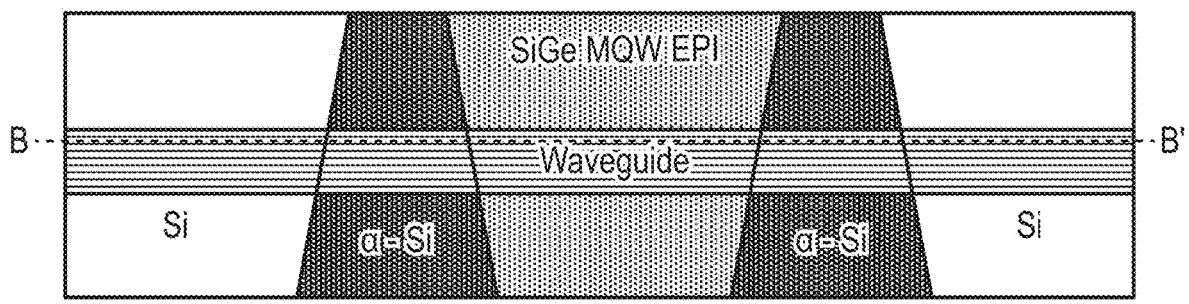
Figure 3P:
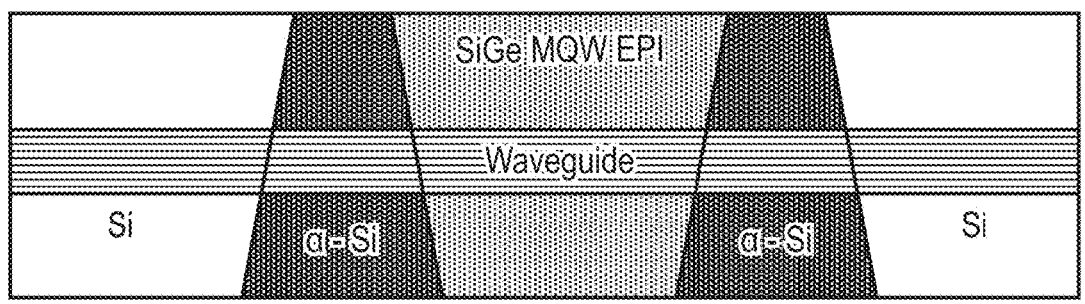

FIG. 3O shows the device of FIG. 3N from above i.e. looking down on the device. A waveguide lithography process is performed to make a SiO2 waveguide hard mask. It results in a strip SiO2 waveguide hard mask structure upstanding from the top surface of SOI, α-Si, and MQW EPI stack. Then another mask ($Si_3N_4$) is used to cover SiGe MQW EPI region (shown as covered in FIG. 3O), so the SOI and α-Si regions are exposed for etching to make SOI and α-Si rib waveguides. Next, as shown in FIG. 3P, the Si and α-Si waveguides are etched to the same height of P—SiGe layer to form rib waveguide (or etched to point with 600 nm Si slab and α-Si slab left to form rib waveguides from the top surface of BOX). Therefore, as viewed from an end, the Si strip waveguide is parallelogramal bar on top of the BOX layer (or inverted T shape for Si rib waveguide); the α-Si strip waveguide is parallelogramal bar on top of the Si EPI layer (or inverted T shape for α-Si rib waveguide).

Figure 3Q:
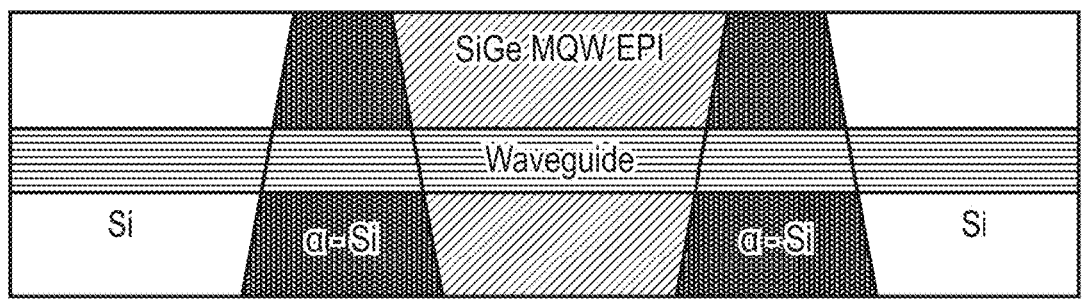
Figure 3R:
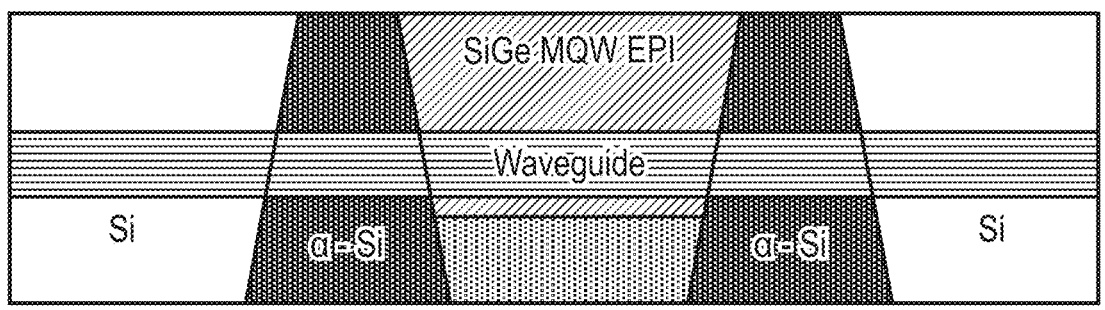

A subsequent step is shown in FIG. 3Q where the multiple quantum well (MQW) rib waveguide is formed by etching the MQW EPI stack region to the top of the 200 nm P-layer. FIG. 3R shows a next step, where the waveguide hard mask is removed and the exposed portion of the stack on one side of the MQW active waveguide is etched so that the P doped region can be etched away to make room for the top electrode pad.

Figure 3S:
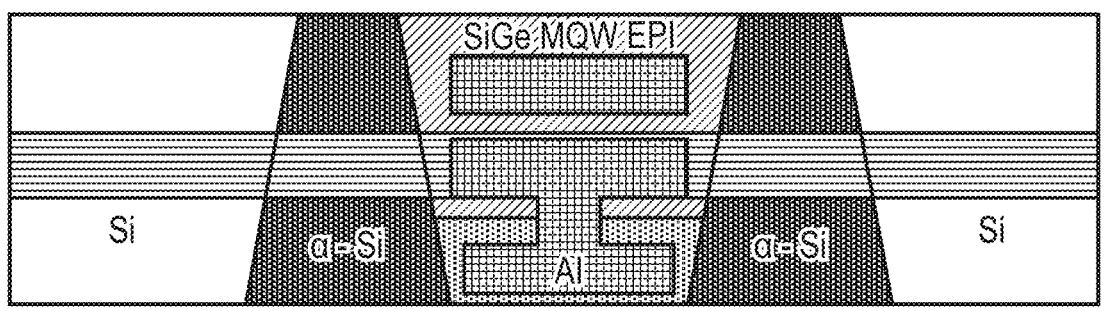

Therefore, as shown in FIG. 3S, VIA and metallization processes are performed, and electrodes are made to contact the n-doped top layer of the waveguide with contact pad on the bottom side and the p-doped layer, and the device is fabricated.

Figure 4:
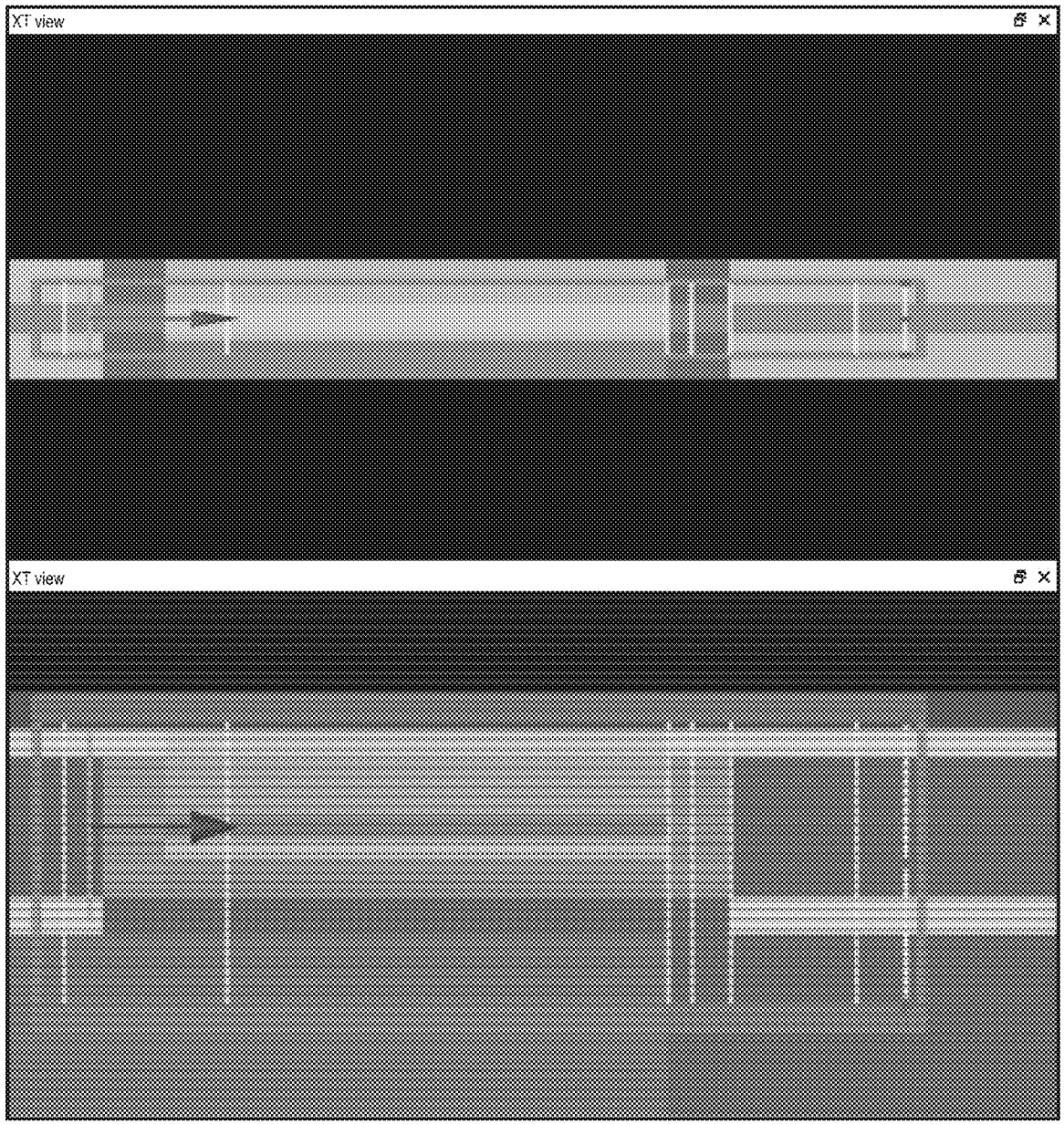
FIG. 4 shows simulation results of the device coupling efficiency shown in FIG. 2.
Figure 4:
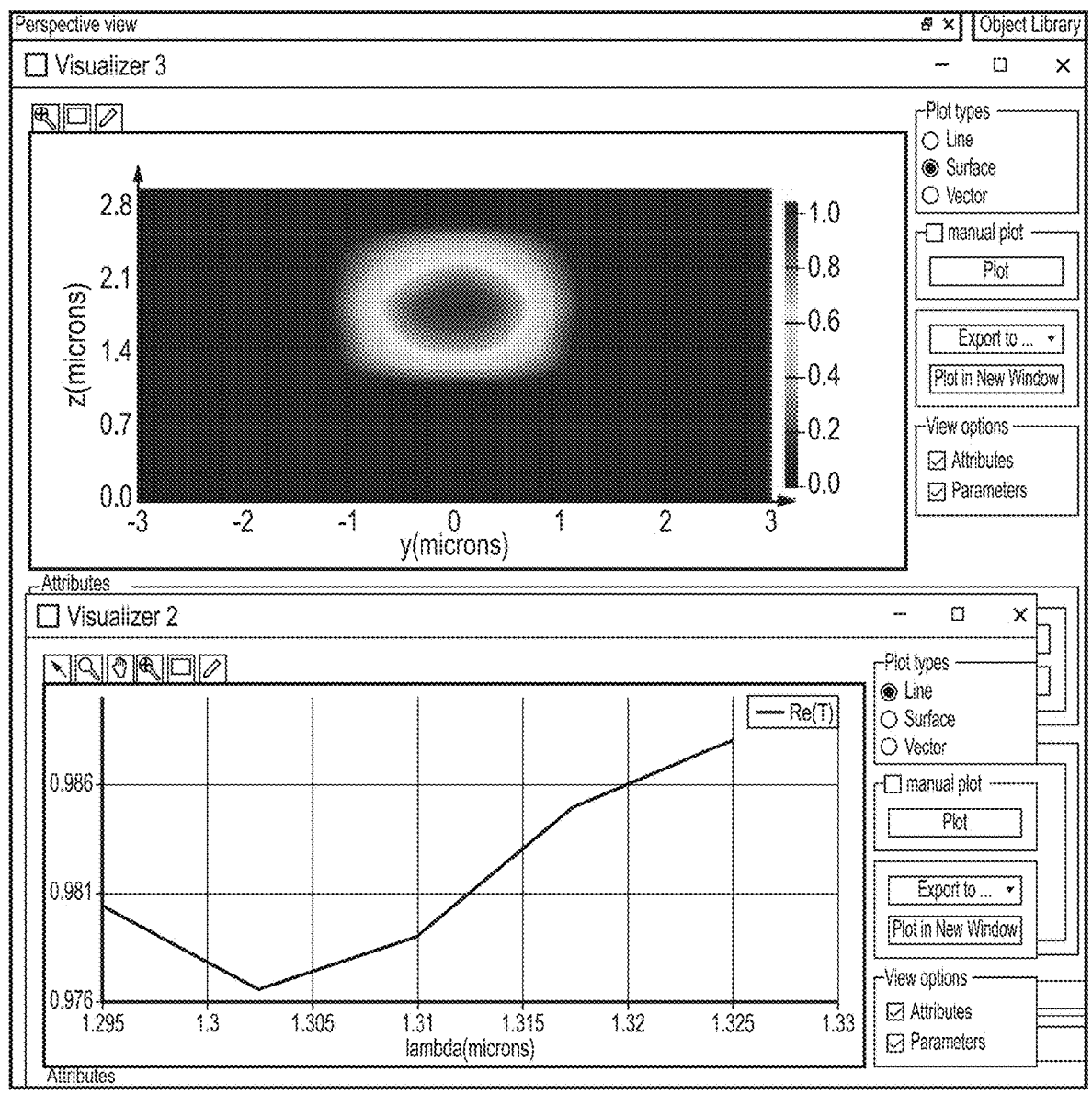
Figure 6A:
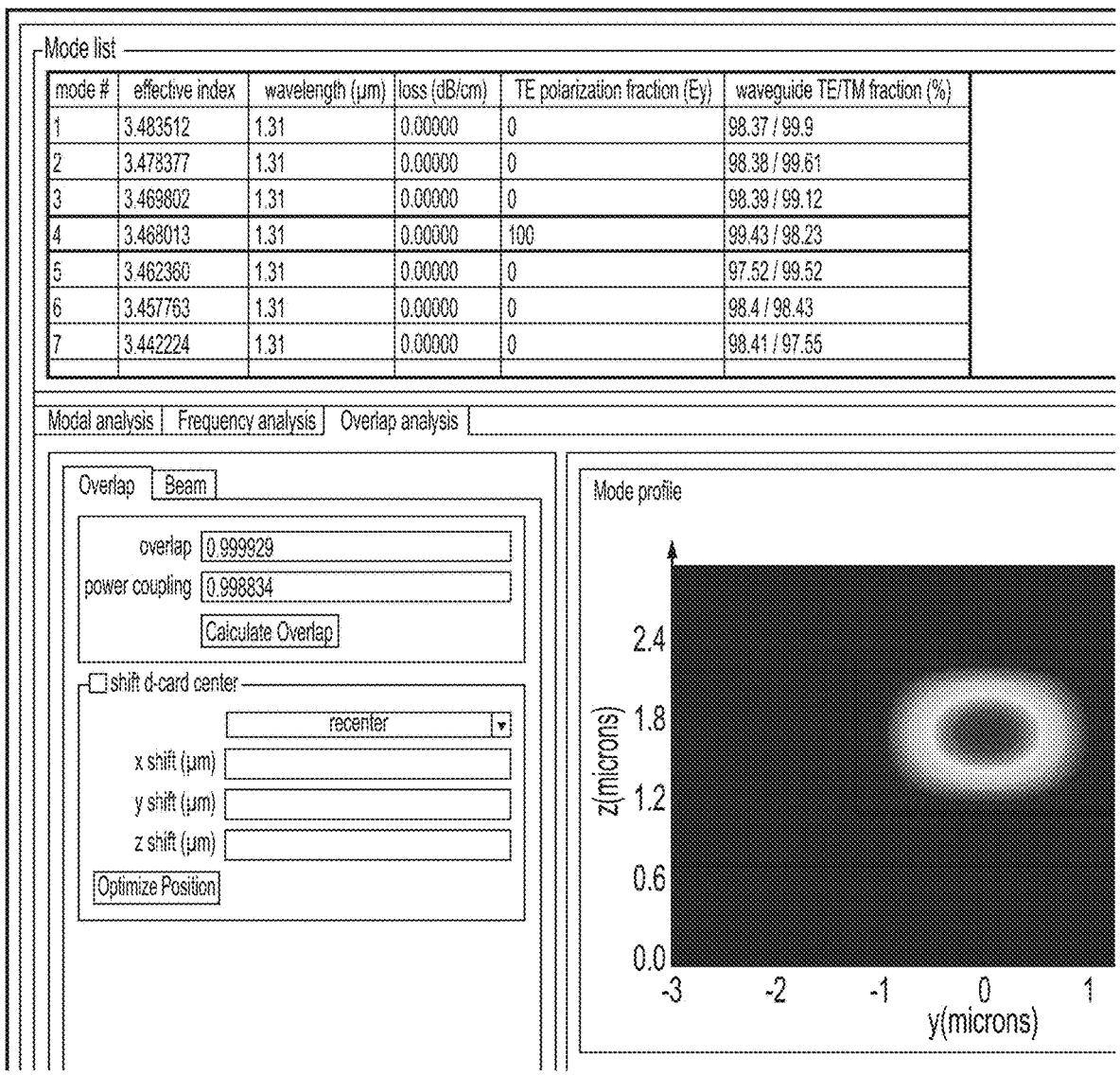
FIG. 6A-6C show optical mode coupling efficiency simulation results of the device at 1310 nm shown in FIG. 2.
Figure 6A:
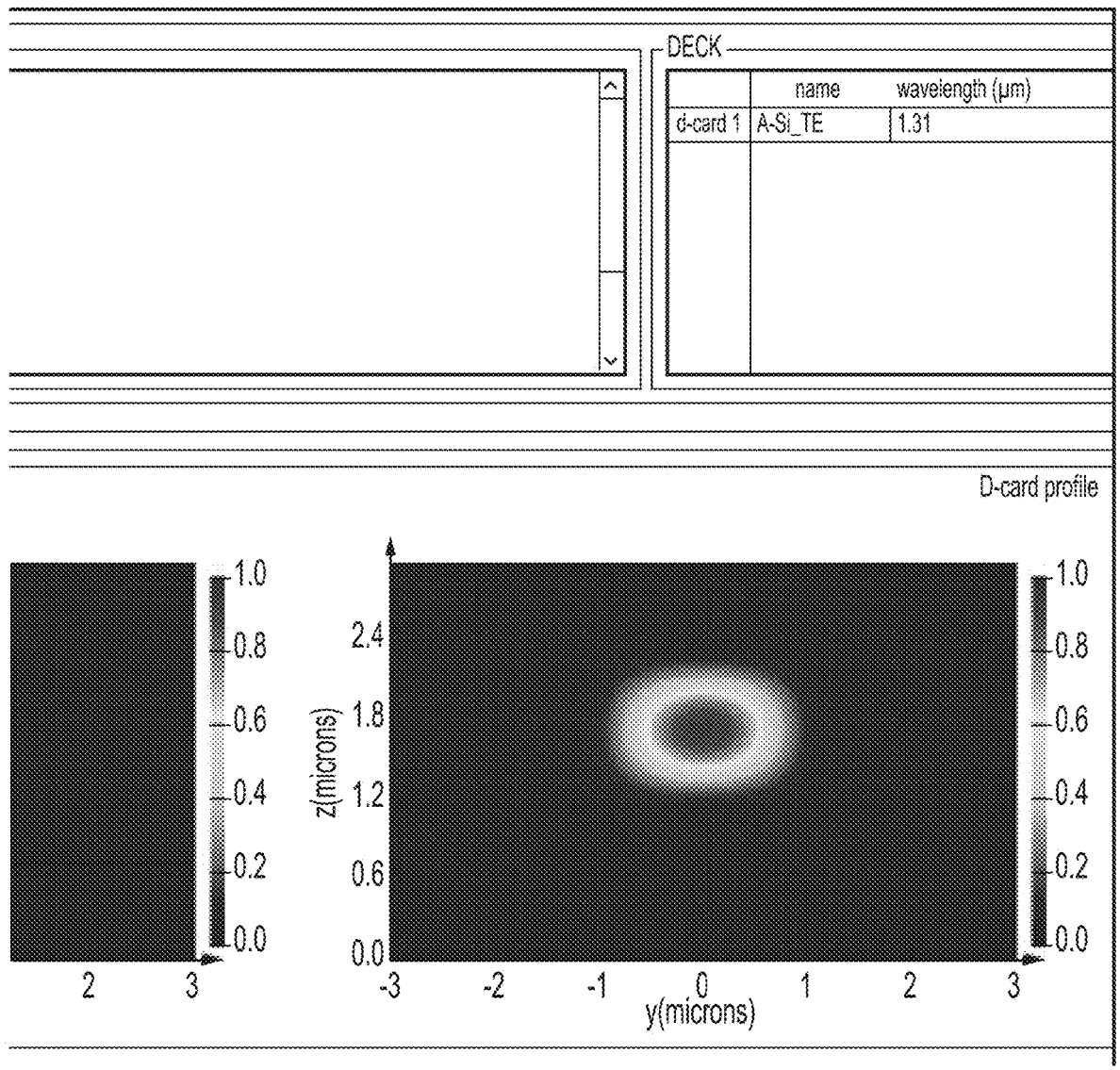
Figure 6B:
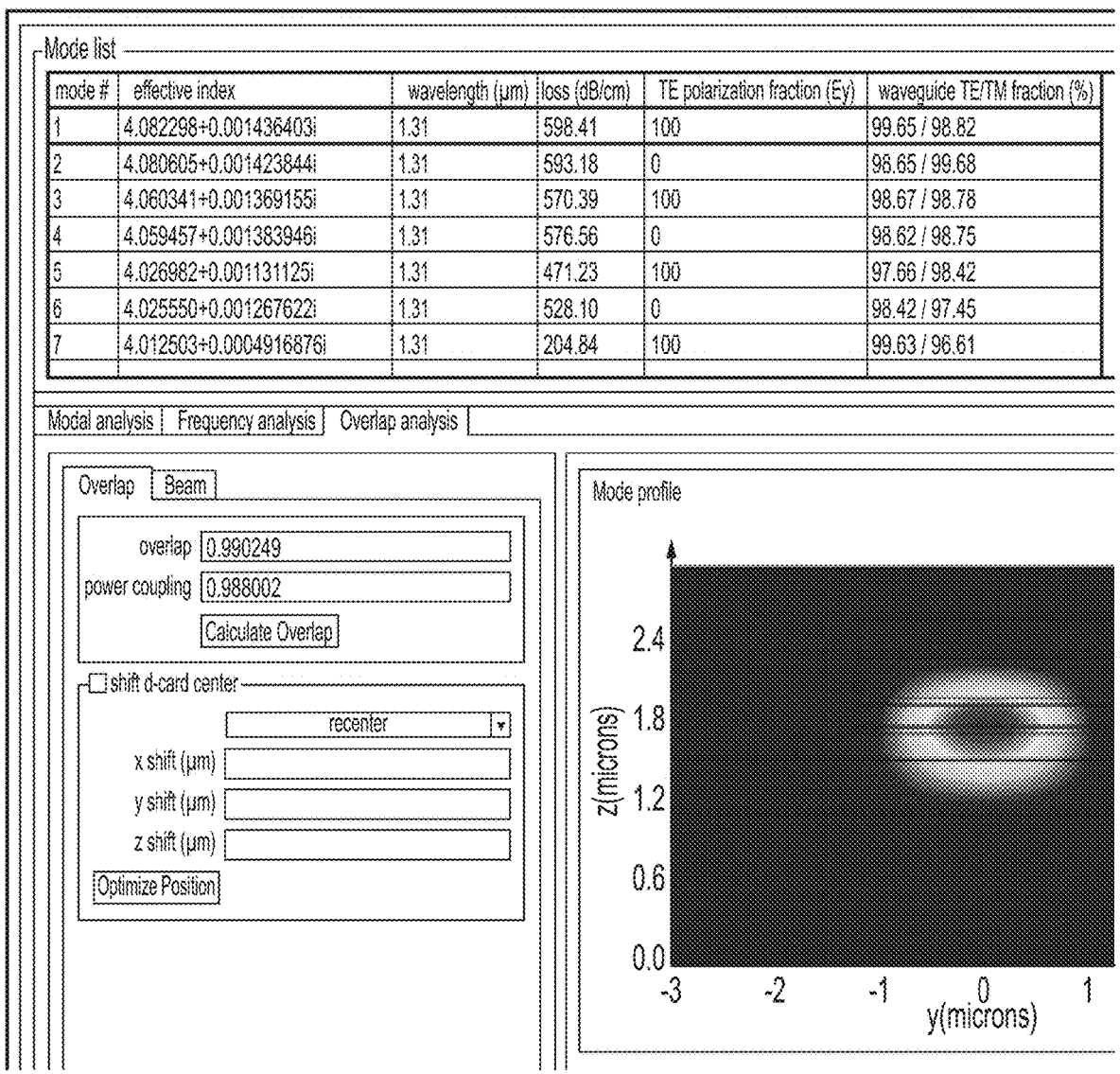
Figure 6B:
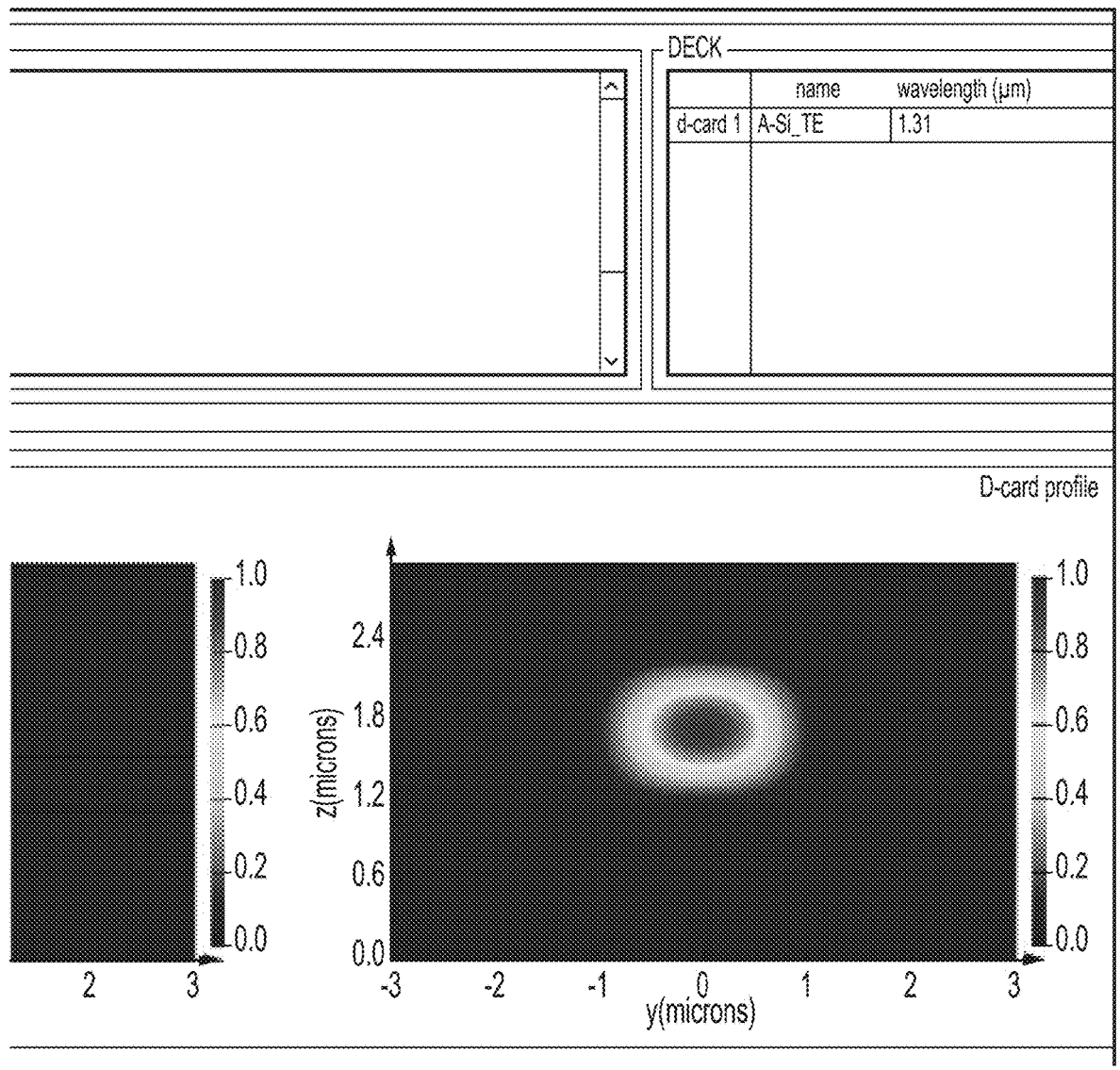
Figure 6C:
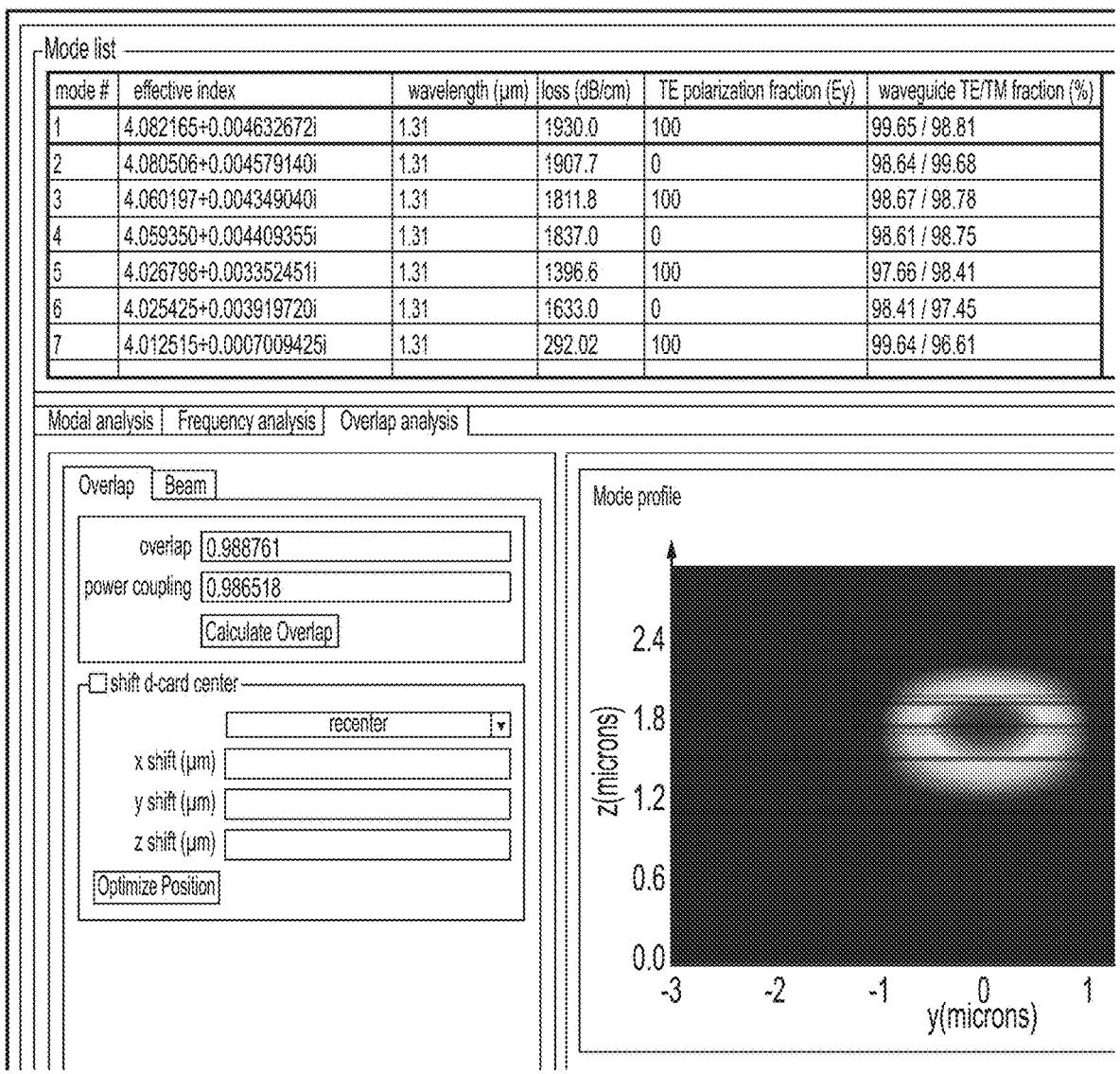
Figure 6C:
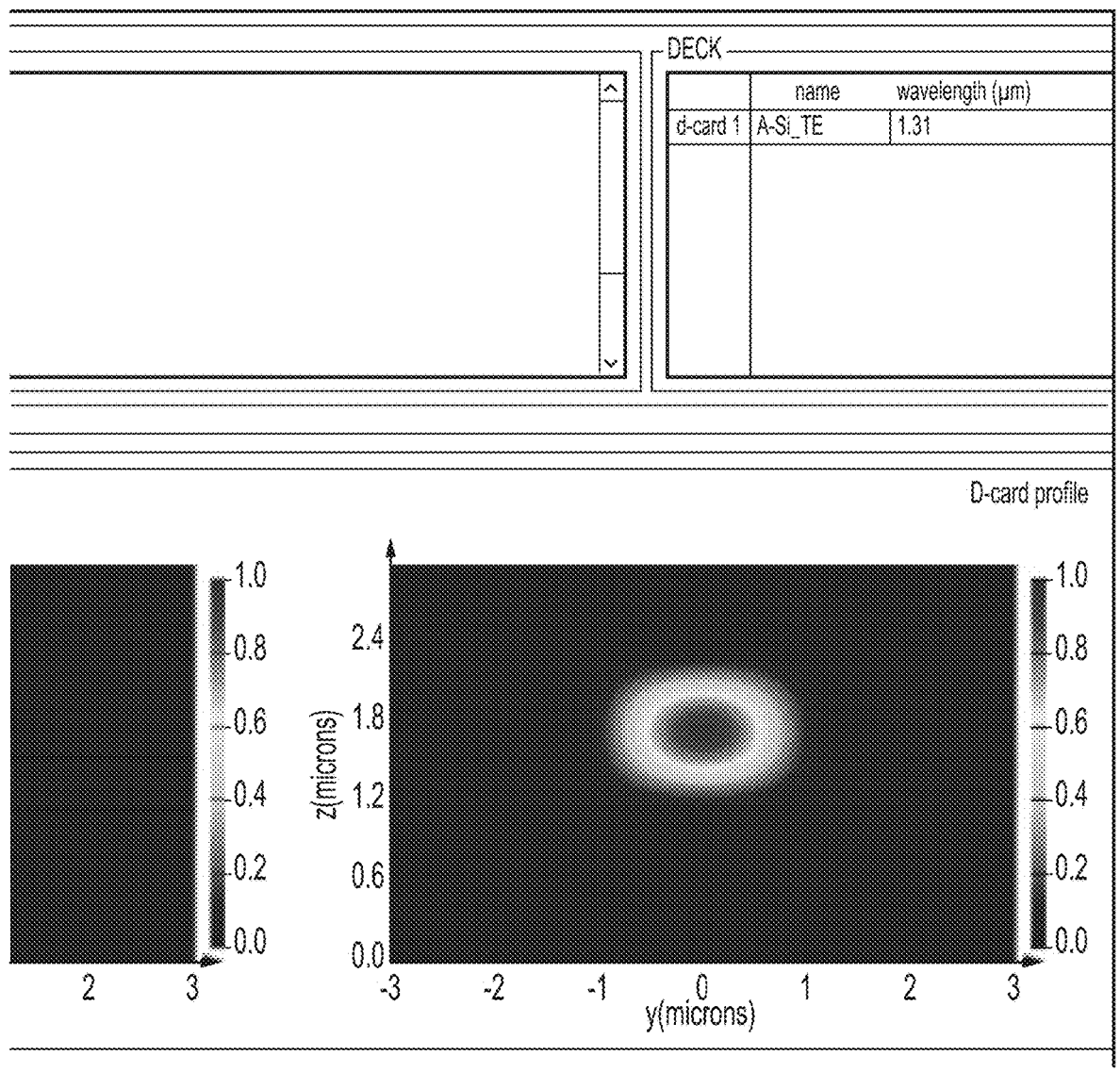

FIG. 4 shows a simulated device according to FIG. 2 and corresponding passive optical coupling efficiency results with a finite difference time domain (FDTD) method at wavelengths around 1310 nm. As can be seen from the plot in the upper-right the optical mode within the waveguide is well contained after propagating through Si waveguides, α-Si waveguides, MQW waveguides and the interfaces. FIG. 5 shows results of the simulation of FIG. 4. A notable result is that the device as simulated can provide an insertion loss of 2.52 dB, an extinction ratio of 5.33 dB, and a power link penalty of 7.03 dB at a wavelength of 1310 nm FIG. 6A-6C each show the optical mode coupling efficiencies between α-Si waveguide and SOI waveguide (FIG. 6A), between α-Si waveguide and SiGe MQW waveguide at 0V bias (FIG. 6B), and between α-Si waveguide and SiGe MQW waveguide at 2V bias (FIG. 6C), for TE mode at 1310 nm.

Figure 7:
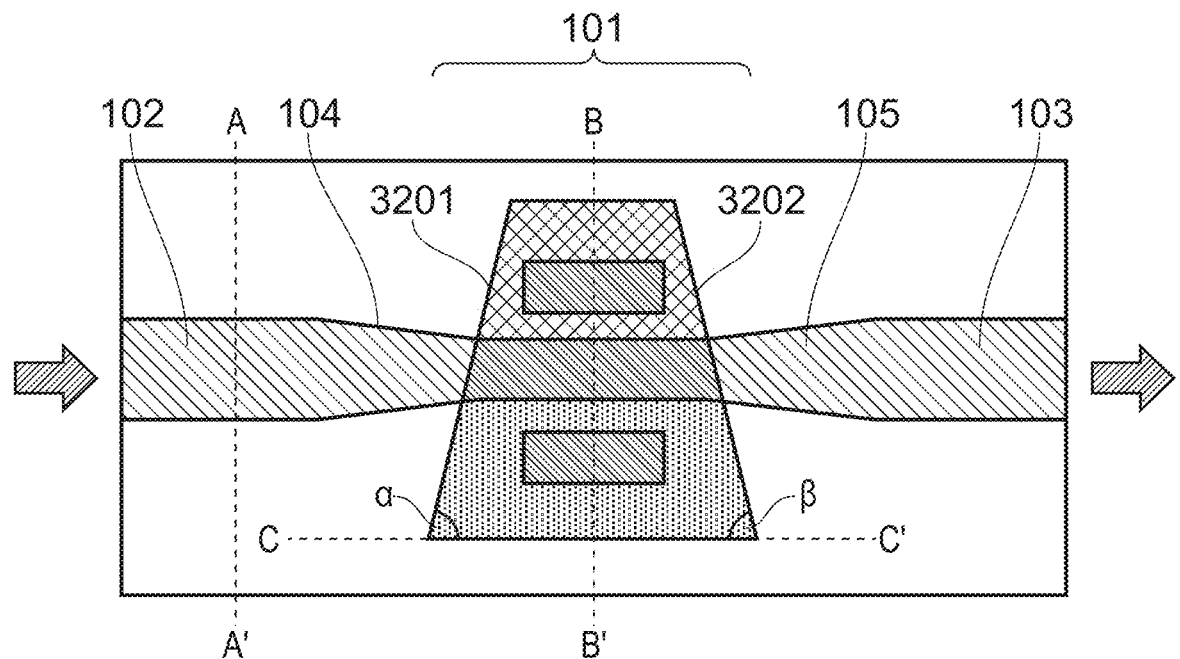
FIG. 7 shows a top down view of electro-optically active device, also shown is an input waveguide with an input taper waveguide region and an output waveguide with an output waveguide taper region.

The embodiments discussed above may be arranged to have angled interfaces between the electro-optically active stack and adjacent input and output (e.g. the SOI and α-Si waveguides). In such angled embodiments, the cross-section along B-B' (shown in FIG. 3O) would be the same or substantially the same as that shown in the previous figures, but the device as viewed from above would exhibit angled interfaces. An example of such a further embodiment of an electro-optically active device is shown in FIG. 7 (SOI and α-Si waveguides are shown together outside of the electro-optically active stack region).

This embodiment differs from the previous embodiments in that a first interface 3201 and second interface 3202 (or first and second angled facets) of the electro-optically active device 101 are respectively angled relative to a line C-C' which is parallel to the direction of light propagation through the device (indicated by the arrows) i.e. it is aligned with the guiding direction of the input waveguide 102 and output waveguide 103. The guiding direction is the direction along which the waveguides transmit light. In this example, the guiding direction of input waveguide 102 is from the left most surface (indicated by the left most arrow) towards the first interface 3201 in a direction generally perpendicular to the plane A-A'. The electro-optically active device can be described has having a trapezoidal geometry.

The first interface 3201 is the interface between the input region 104 of the input waveguide and the electro-optically active device 101. This first interface is at an angle α relative to the guiding direction of the input waveguide. α may take values of between 89° and 80°, and is in some examples 81°. Said another way, the vector of a plane coincident with the interface would be non-parallel with respect to the guiding direction of the input waveguide.

The second interface 3202 is the interface between the output region 105 of the output waveguide 103 and the electro-optically active device 101. This second interface is at an angle β relative to the direction of light through the device. β may take values of between 89° and 80°, and is in some cases 81°. Said another way, the vector of a plane coincident with the second interface would be non-parallel to the guiding direction of the output waveguide.

The angles α and β may be equal or may be different. In the example shown in FIG. 7, the angles are equal but have an opposite sense i.e. one is measured clock-wise and the other anti-clockwise such that they are not parallel. The interfaces may be parallel, and in which case they would have the same sense. It may be that only one of the angles has a value which is not equal to 90°.

Figure 8:
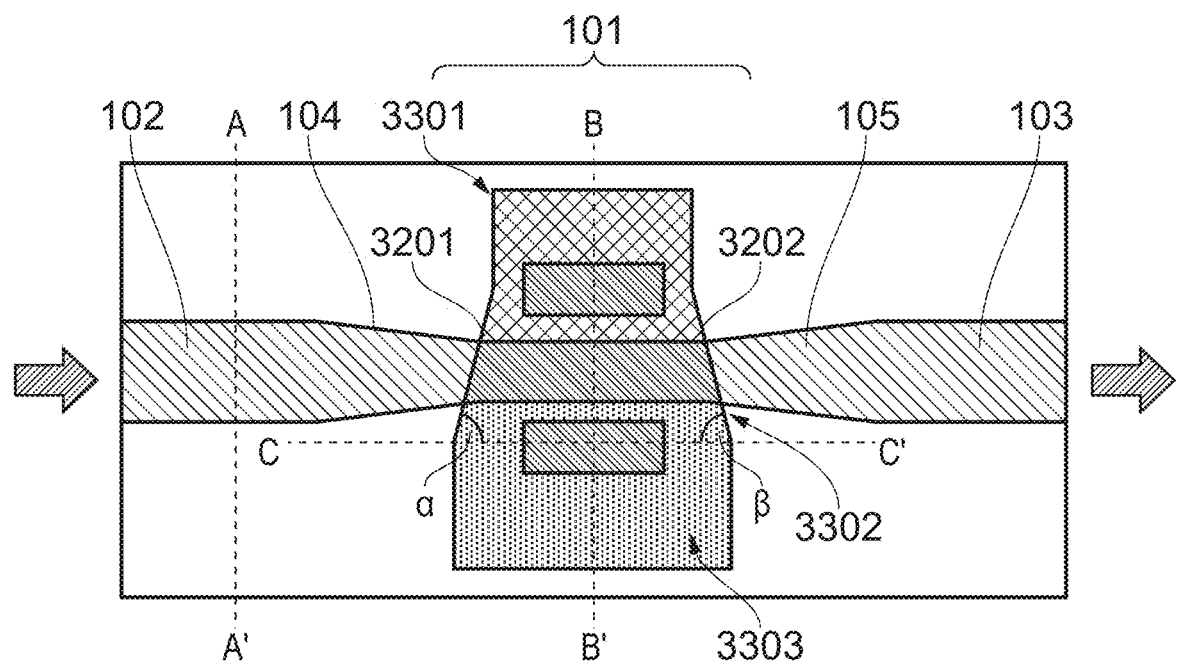
FIG. 8 shows a top down view of an electro-optically active device, also shown is an input waveguide with an input taper waveguide region and an output waveguide with an output waveguide taper region where a part of the electro-optically active device has a trapezoidal geometry.

A further embodiment of an electro-optically active device is shown in FIG. 8.

This embodiment differs from the embodiment shown in FIG. 7 in that, whilst a first interface 3201 and second interface 3202 are still angled relative to the line C-C', the entire geometry of the component is not trapezoidal. Instead, the electro-optically active device can be generally discussed as having three regions: a first and second rectangular region 3301 and 3303, and a trapezoidal region 3302 between the first and second rectangular regions. Therefore, the angled interfaces are provided by trapezoidal region 3302 whilst the first and second rectangular regions may provide electrical contacts that may be easier to form. In this embodiment the waveguide interfaces can be provided at non-perpendicular angles with respect to the direction of propagation of light through the device, and can also minimize the portion of the walls of the optically active material interface that are non-parallel to each other, and not parallel to the crystal planes of the Si wafer. A further embodiment of an electro-optically active device is shown in FIG. 9.

This embodiment differs from the embodiments shown in FIG. 7 and FIG. 8 in that the electro-optically active device has a generally parallelogramal geometry. Therefore the first and second interface 3201 and 3202 are provided by the parallel sides of the parallelogram which intersect the first and second waveguide regions 104 and 105. In this embodiment the walls of the optically active material may be parallel along their entire lengths whilst still having the waveguide interfaces at non-perpendicular angles with respect to the direction of propagation of light through the device, but the corners are not 90°, and two sides are not parallel to the crystal planes of the Si wafer.

Figure 10:
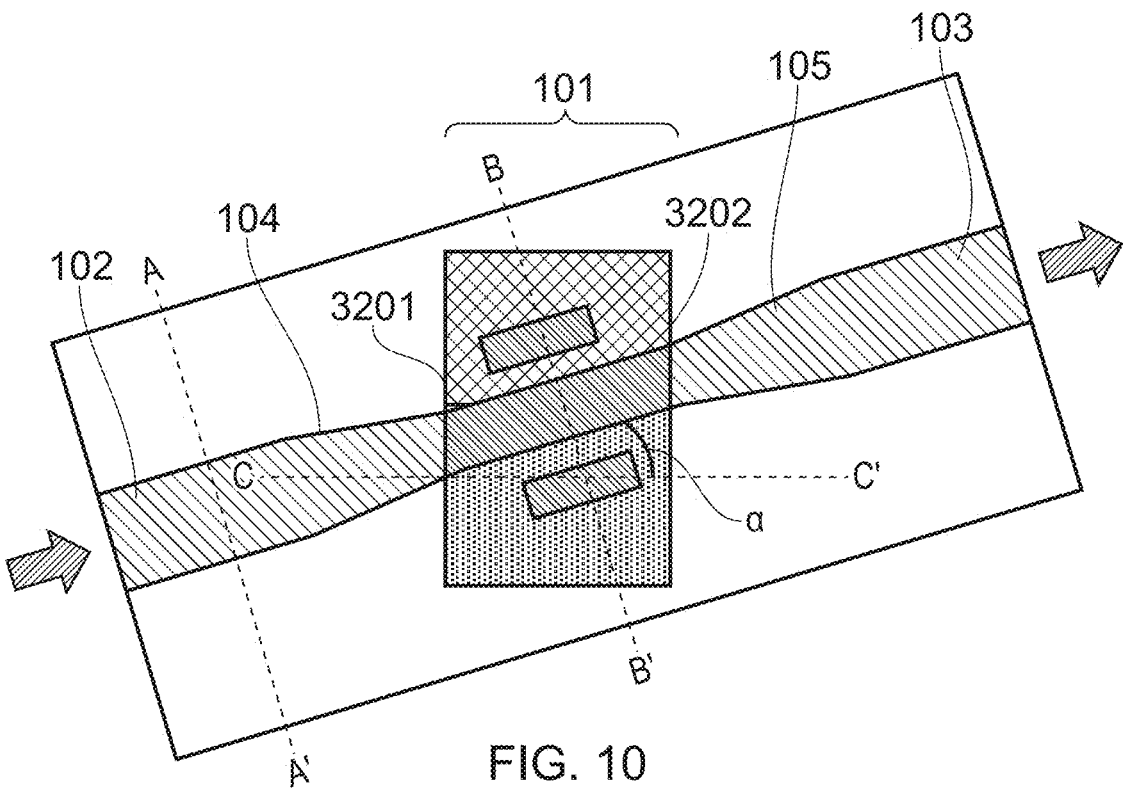
FIG. 10 shows a top down view of an electro-optically active device, also shown is an input waveguide with an input taper waveguide region and an output waveguide with an output waveguide taper region where the electro-optically active device has a rectangular geometry but has been disposed at an angle relative to the input and output waveguides.

A further embodiment of an electro-optically active device is shown in FIG. 10.

Figure 9:
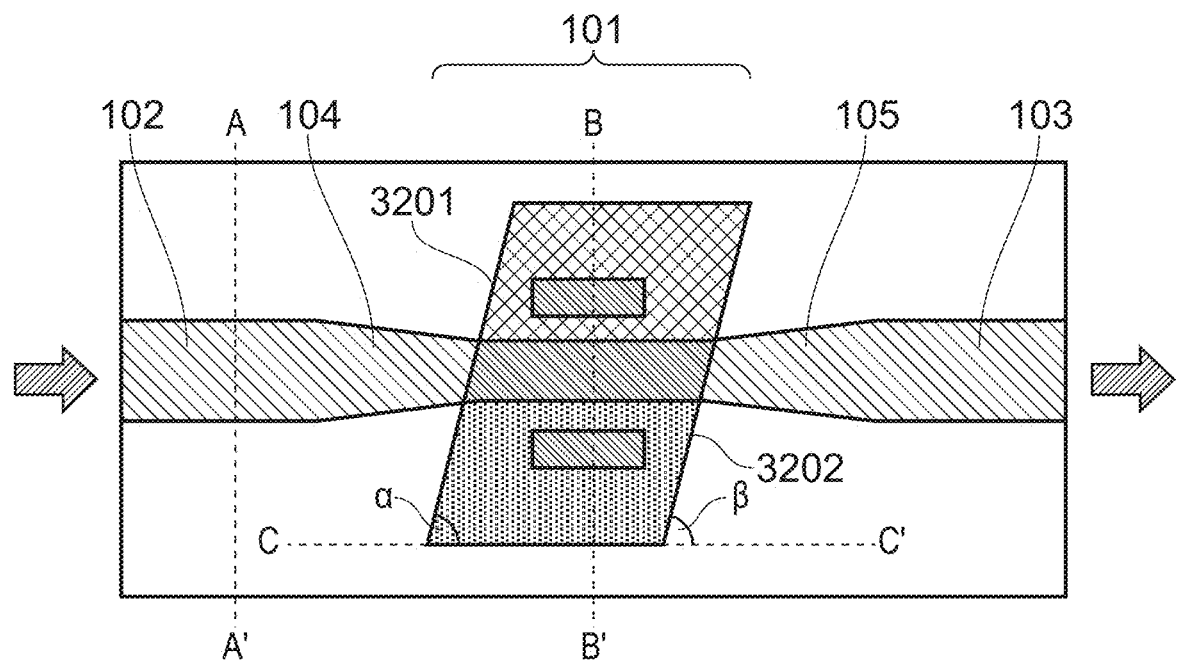
FIG. 9 shows a top down view of an electro-optically active device, also shown is an input waveguide with an input taper waveguide region and an output waveguide with an output waveguide taper region where the electro-optically active device has a parallelogramal geometry.

This embodiment differs from the embodiments shown in FIGS. 7-9 in that the electro-optically active device 101 has a generally rectangular geometry. However, the component 101 is disposed at an angle α relative direction C-C'. Therefore the two sides of the rectangle which intersect the first and second waveguide regions provide the first and second interfaces 3201 and 3202. In this embodiment, the walls of the optically active material may be parallel along their entire lengths, and keep all corners at 90°, and still have the waveguide interfaces at non-perpendicular angles with respect to the direction of propagation of light through the device, but all four sides are not parallel to the crystal planes of the Si wafer. Alternatively, the walls could be orientated parallel to the Si wafer crystal planes, and instead the waveguides can be angled with respect to the Si wafer crystal planes. A further embodiment of an electro-optically active device is shown in FIG. 11.

This embodiment differs from embodiments shown previously in that the input waveguide 104 and output waveguide 105 are disposed at respective angles φ and γ to the guiding direction of the electro-optically active stack (the guiding direction of the electro-optically active stack being parallel to line C-C').

Figure 12:
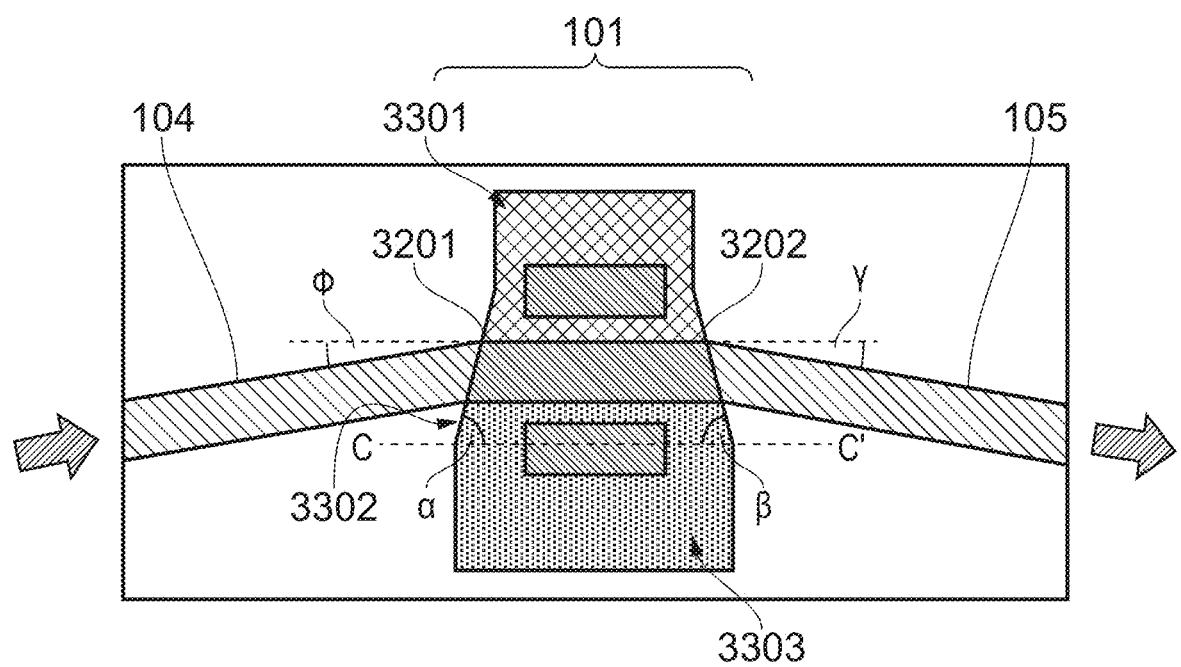
FIG. 12 shows a top down view of an electro-optically active device, also shown is an input waveguide and output waveguide which are disposed at angles φ and γ to the guiding direction of the OAR.

A further embodiment of an optoelectronic is shown in FIG. 12.

Figure 11:
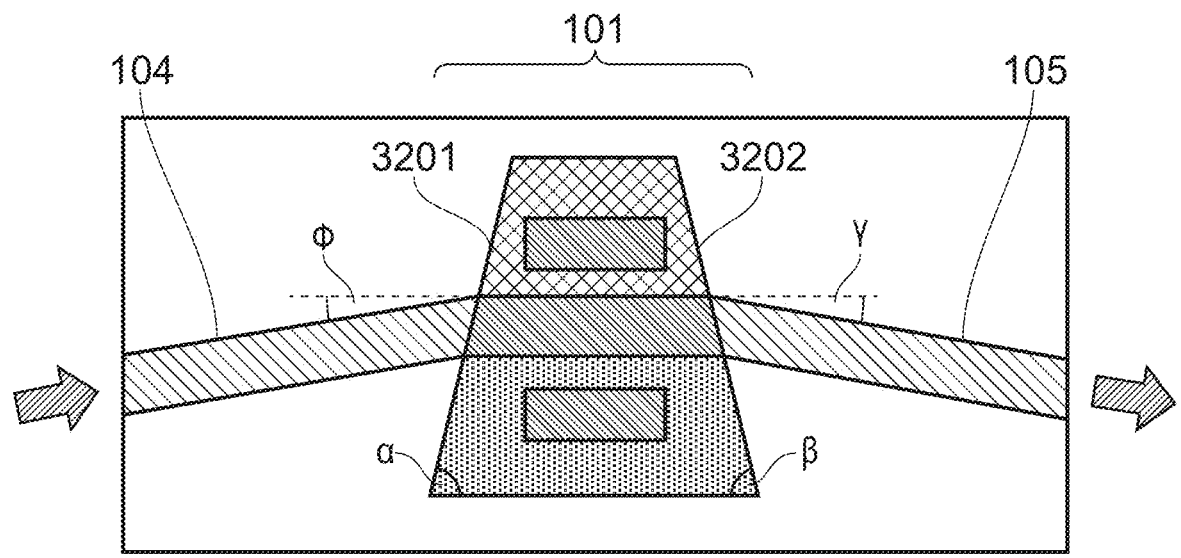
FIG. 11 shows a top down view of an electro-optically active device, also shown is an input waveguide and output waveguide which are disposed at angles φ and γ to the guiding direction of the OAR.

This embodiment differs from that shown in FIG. 11 in that it can be described as having generally three regions: a first and second rectangular region 3301 and 3303, and a trapezoidal region 3302 between the first and second rectangular regions. Therefore, the angled interfaces are provided by trapezoidal region 3302 whilst the first and second rectangular regions may provide electrical contacts that may be easier to form. In this embodiment the waveguide interfaces can be provided at non-perpendicular angles with respect to the direction of propagation of light through the device, and can also minimize the portion of the walls of the optically active material interface that are non-parallel to each other, and not parallel to the crystal planes of the Si wafer.

Figure 13:
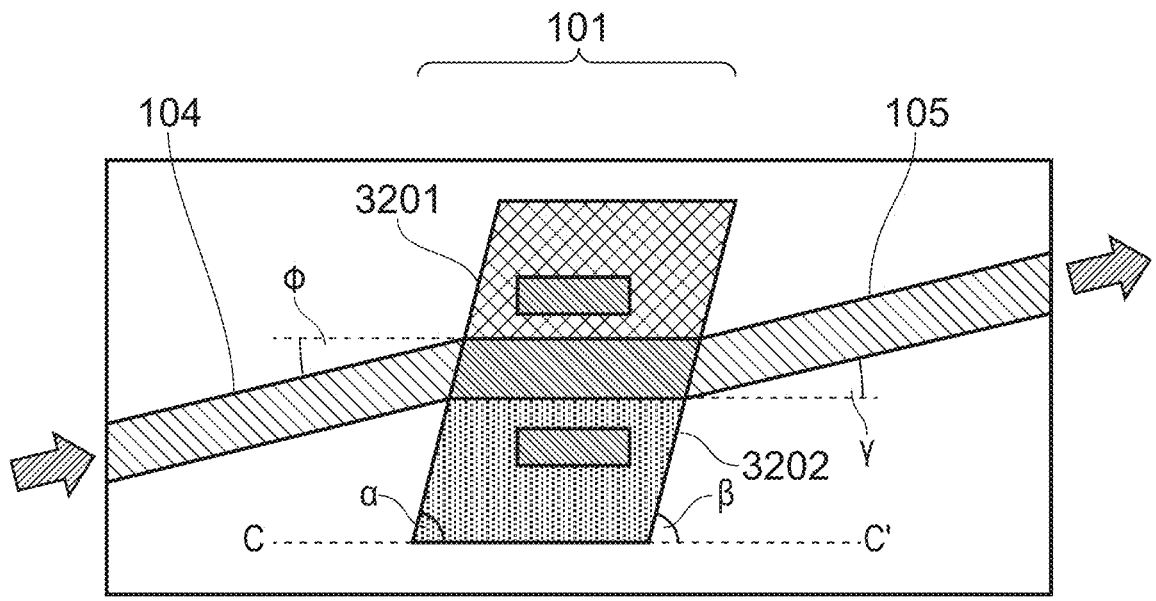
FIG. 13 shows a top down view of an electro-optically active device, also shown is an input waveguide and output waveguide which are disposed at angles φ and γ to the guiding direction of the OAR and are arranged such that their guiding directions are parallel.

A further embodiment of an electro-optically active device is shown in FIG. 13.

This embodiment differs from the embodiments shown in FIGS. 11 and 12 in that the electro-optically active device has a generally parallelogramal geometry (as viewed from above). Therefore, the first and second interfaces 3201 and 3202 are provided by the parallel sides of the parallelogram which intersects the first and second waveguides 104 and 105. In this embodiment, the walls of the optically active material may be parallel along their entire lengths whilst still having the waveguide interfaces at non-perpendicular angles with respect to the direction of the light through the device, but the corners are not 90°, and the two sides are not parallel to the crystal planes of the Si wafer.

Figure 14:
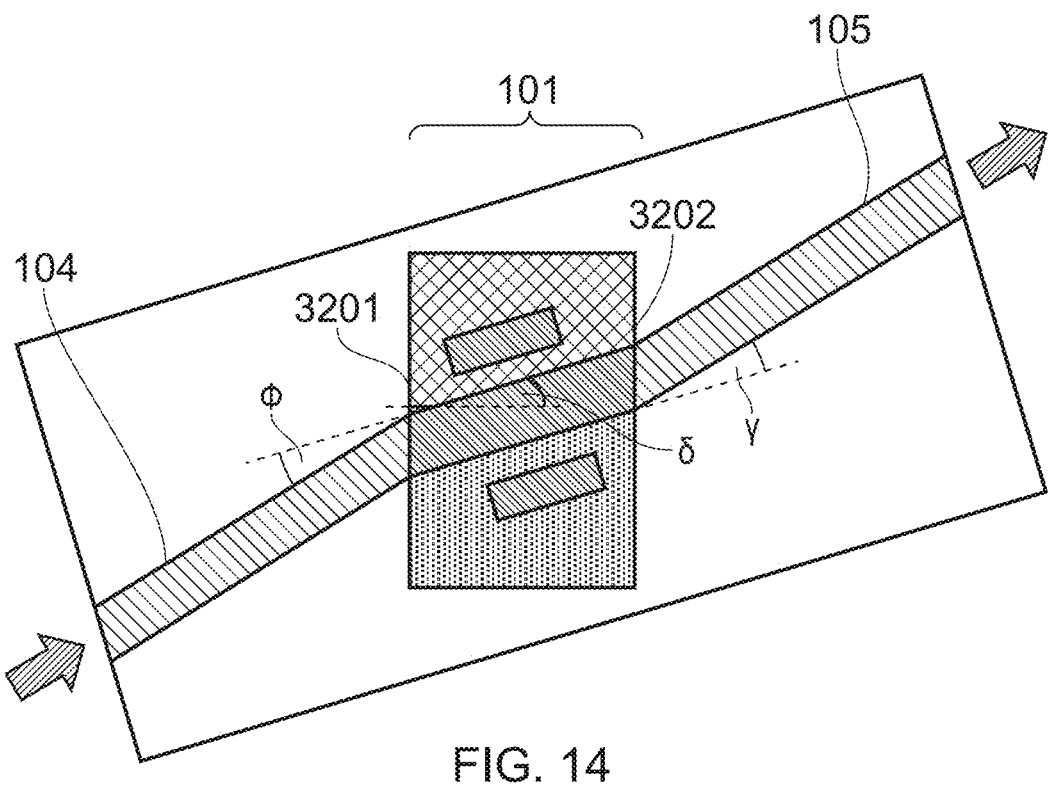
FIG. 14 shows a top down view of an electro-optically active device, also shown is an input waveguide and output waveguide which are disposed at angles φ and γ to the guiding direction of the OAR and are arranged such that their guiding directions are parallel and the entire component has been rotated by an angle δ relative to a global horizontal.

A further embodiment of an electro-optically active device is shown in FIG. 14.

This embodiment differs from the embodiment shown in FIG. 13 in that the electro-optically active device 101 has a generally rectangular geometry. However, the component 101 is disposed at an angle δ relative to a guiding direction of the electro-optically active stack (this indicated by the dotted line labeled δ). Therefore, the two sides of the rectangle which intersect the first and second waveguides provide the first and second interfaces 3201 and 3202. In this embodiment, the walls of the optically active material may be grown to be parallel along their entire lengths, and keep all corners at 900, and still have the waveguide interfaces at non-perpendicular angles with respect to the direction of propagation of light through the device, but all four sides are not parallel to the crystal planes of the Si wafer. Alternatively, the walls could be orientated parallel to the Si wafer crystal planes, and instead the waveguides can be angled with respect to the Si wafer crystal planes. In the embodiments discussed above and below, the angled interfaces may extend beyond the waveguide. For example, the angled interfaces 3201 and 3202 in FIG. 14 extend beyond a width of the waveguide.

A further embodiment of an electro-optically device is described below with reference to FIGS. 15 to 17.

Figure 15:
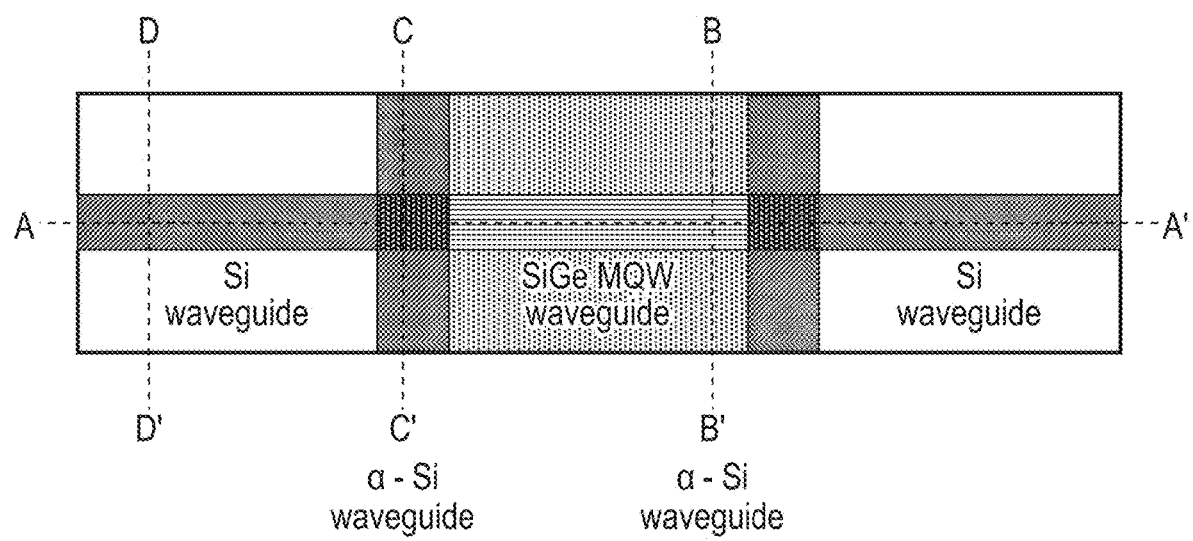
FIG. 15 shows a top down view of a further embodiment of an electro-optically active device according to embodiments of the present invention.

FIG. 15 shows a top down view of the further embodiment of an electro-optically active device.

Figure 16A:
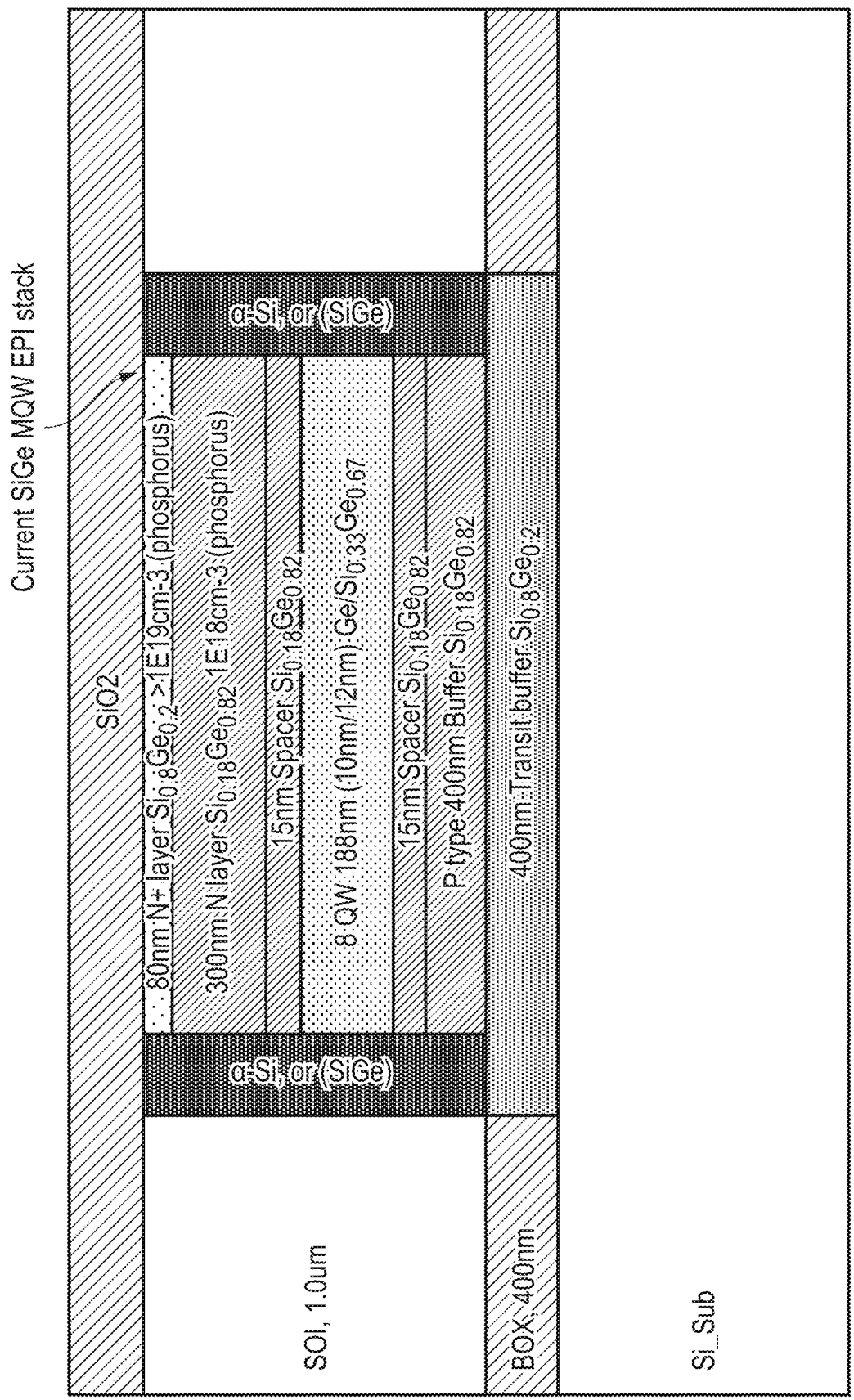

FIG. 16A shows cross-sectional view at the locations of AA' in FIG. 15. This embodiment differs from that in FIG. 2 in following aspects: 1) different SOI thickness. The SOI thickness is 1 um; 2) different electro-optically active EPI stack in which the P-doped layer is 400 nm. the P doped layer also functions as buffer layer with germanium composition of 0.82; there is no un-doped buffer layer; the germanium composition in the MQW is 0.67; and the electro-optically active EPI stack has substantially the same thickness of that of SOI, 1 um; 3) the BOX region that is etched in the cavity is filled with Si0.8Ge0.2 instead of silicon.

FIG. 16B shows the MQW rib waveguide cross-sectional view at the locations of BB' in FIG. 15.

FIG. 16C shows the α-Si (or SiGe) waveguide cross-sectional view at the locations of CC' in FIG. 15.

FIG. 16D shows the SOI waveguide cross-sectional view at the locations of DD' in FIG. 15.

Figure 17A:
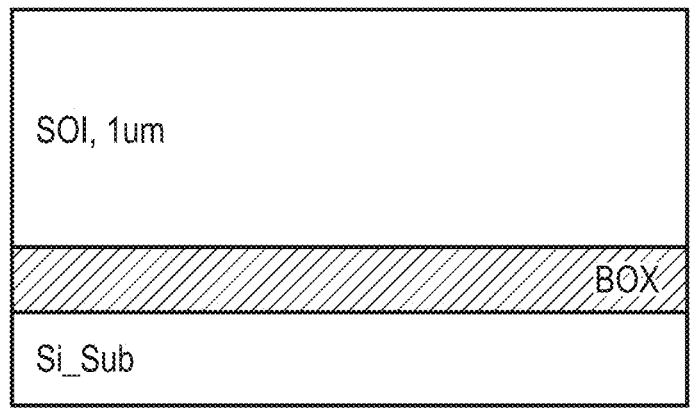
FIGS. 17A-Q show various stages of a method producing the device shown in FIG. 15.

FIGS. 17A-Q depict example fabrication steps for the device in FIG. 15.

The majority of fabrication steps can be understood as described above in more detail in relation to FIGS. 3A-S above. However, there are some differences. In particular, it is noted that the initial fabrication process shown in FIG. 17A starts with a 1 μm SOI substrate.

Figure 17B:
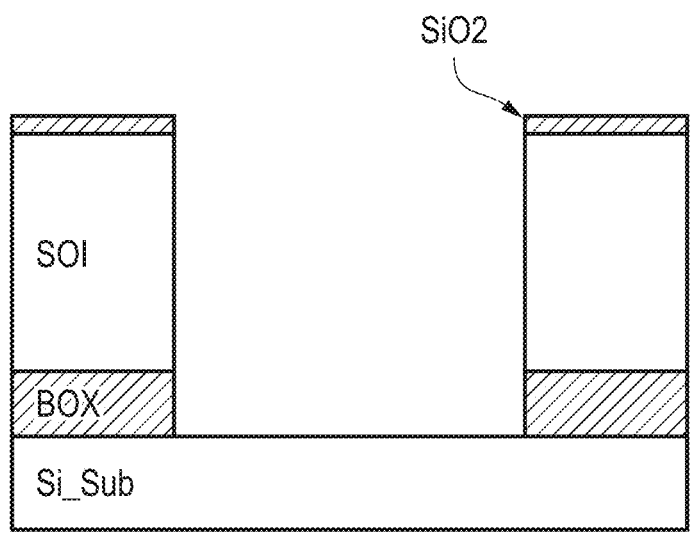
Figure 17C:
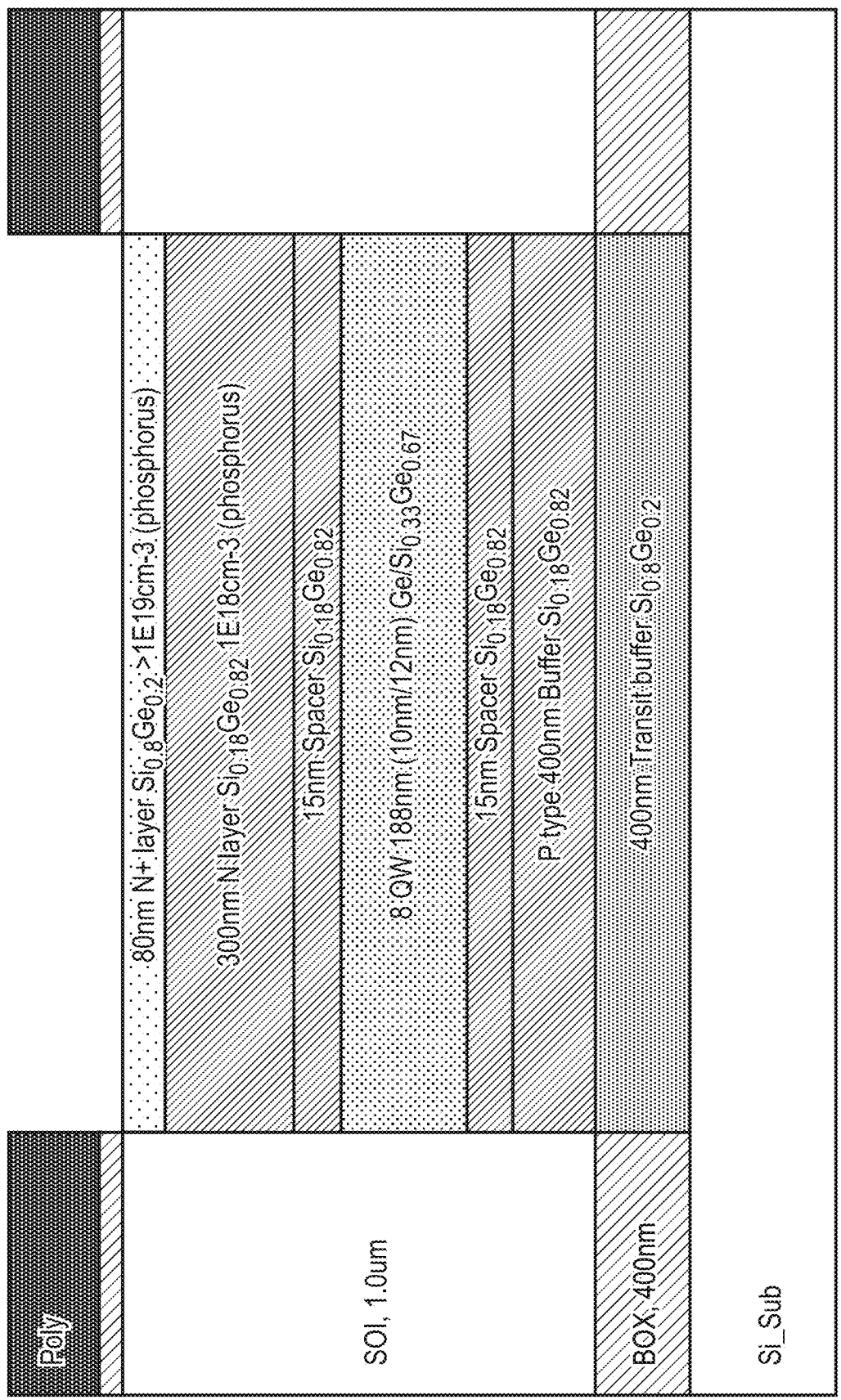
Figure 17D:
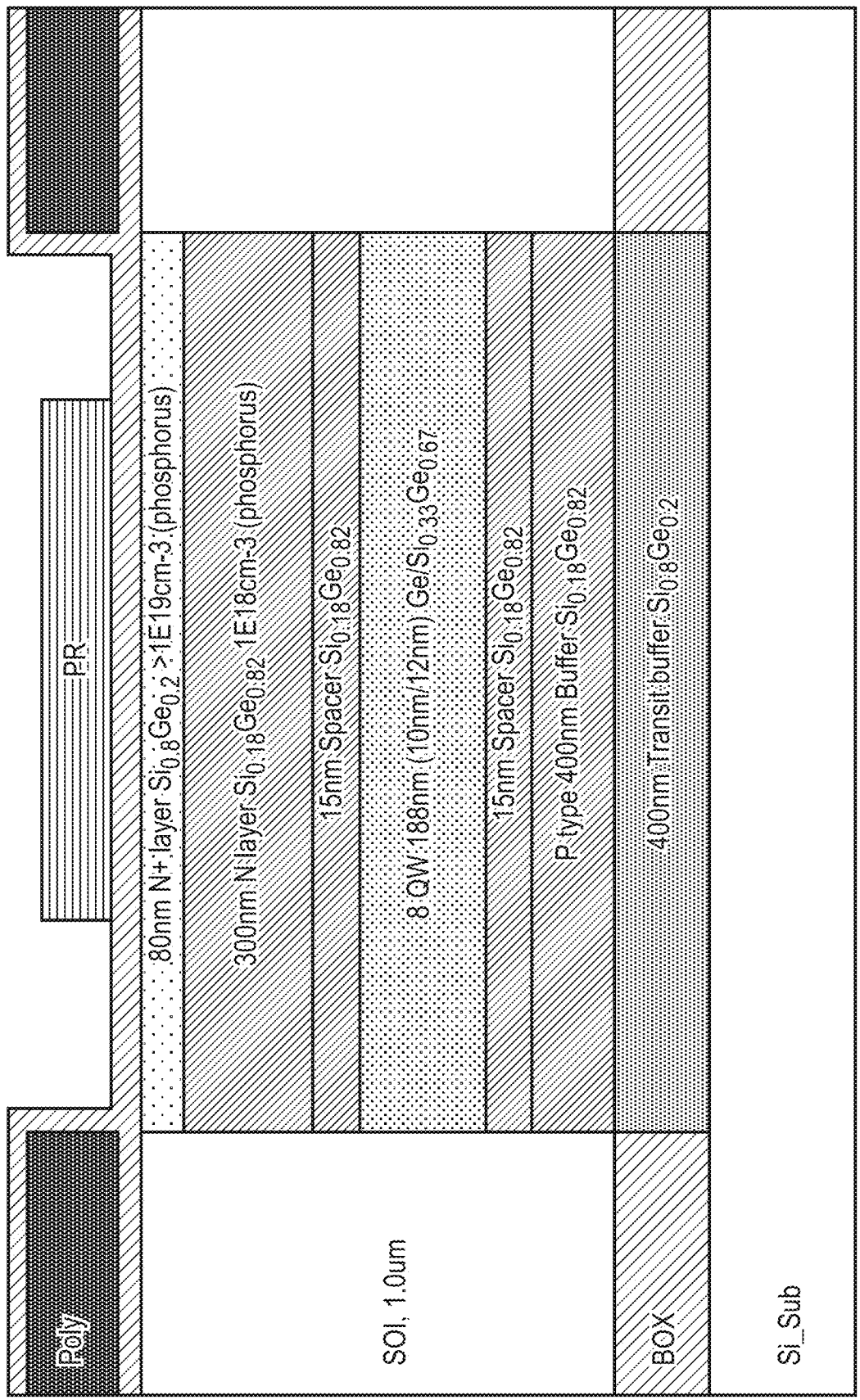
Figure 17E:
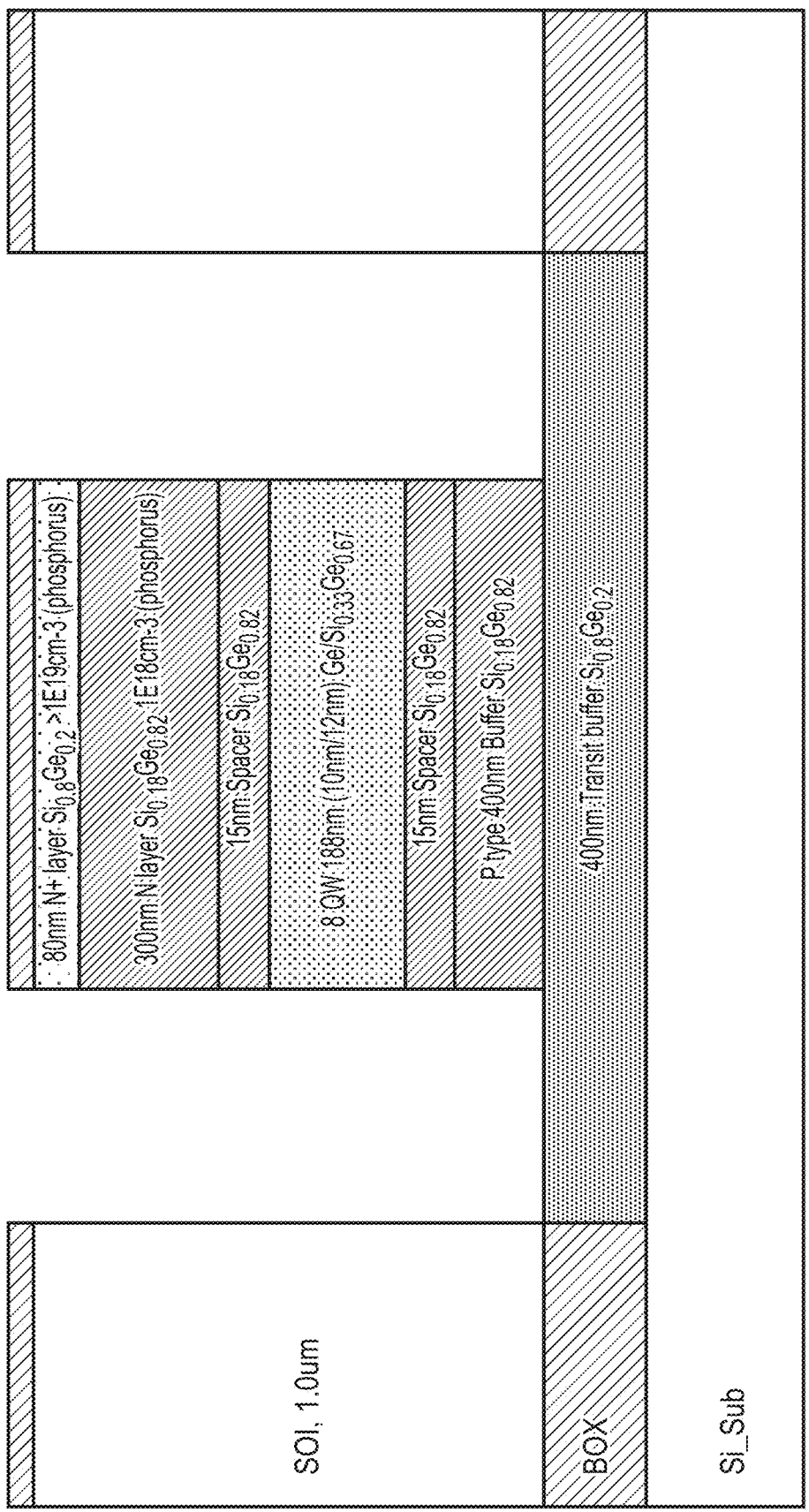
Figure 17F:
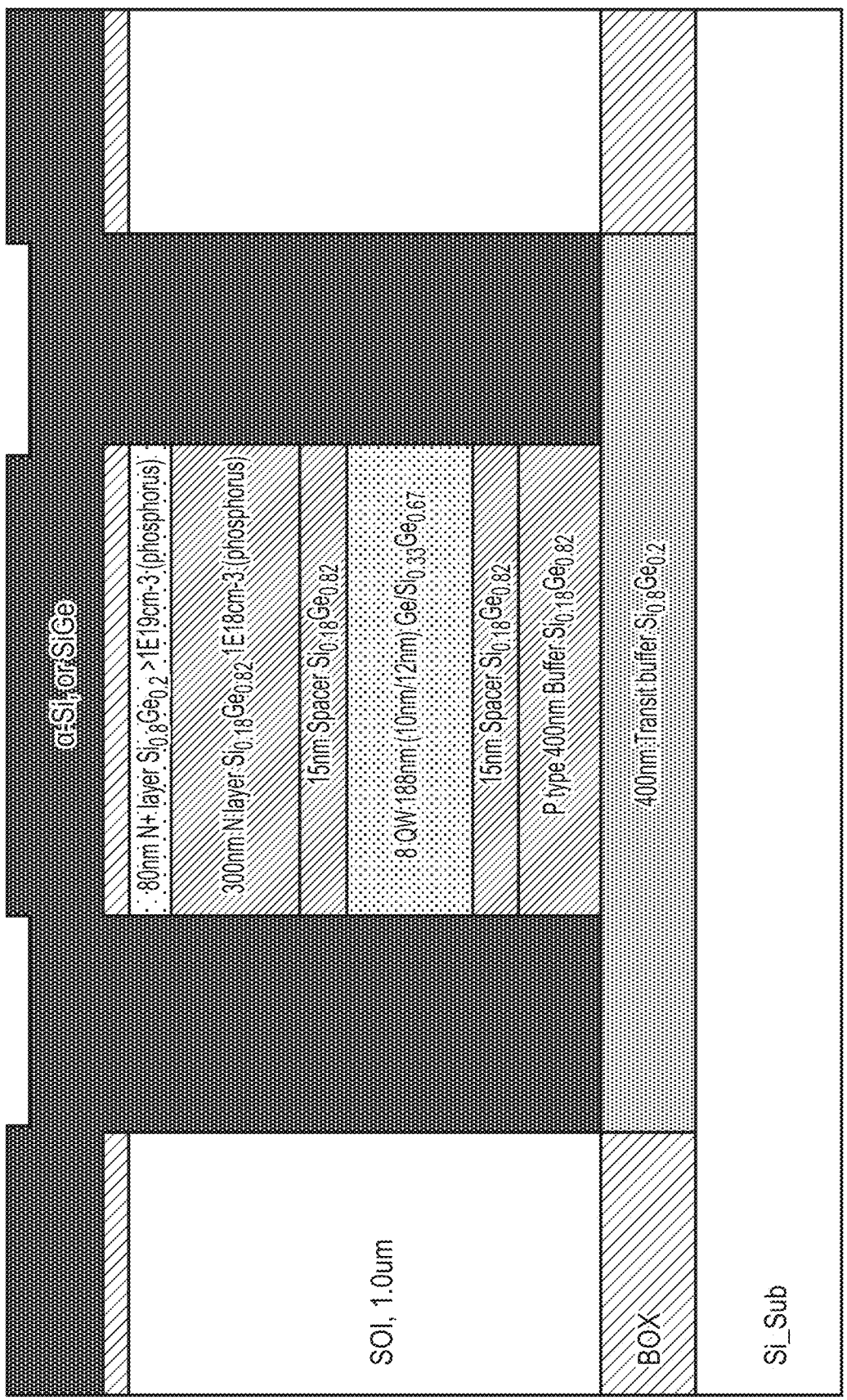
Figure 17G:
Figure 17H:
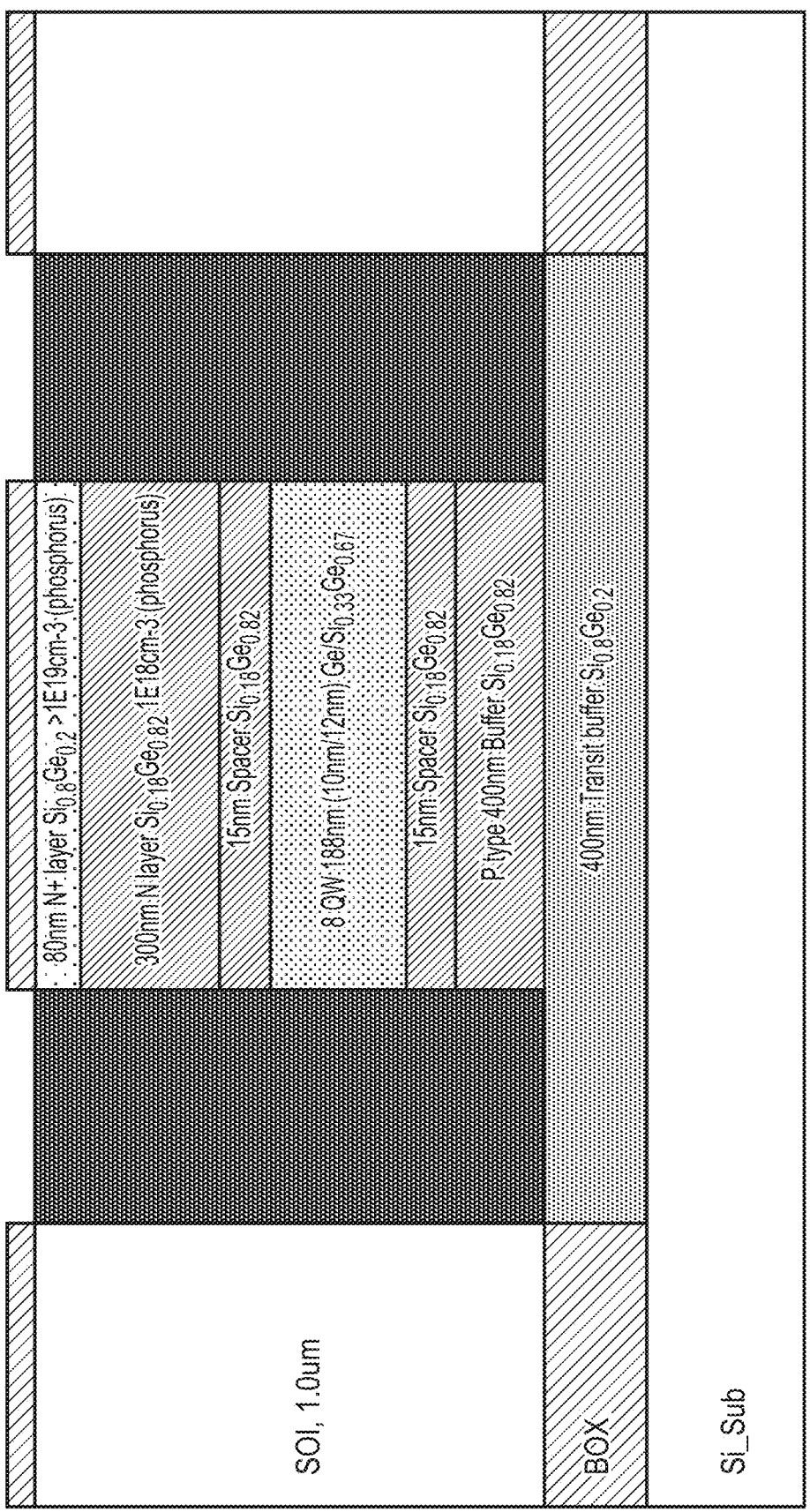
Figure 17I:
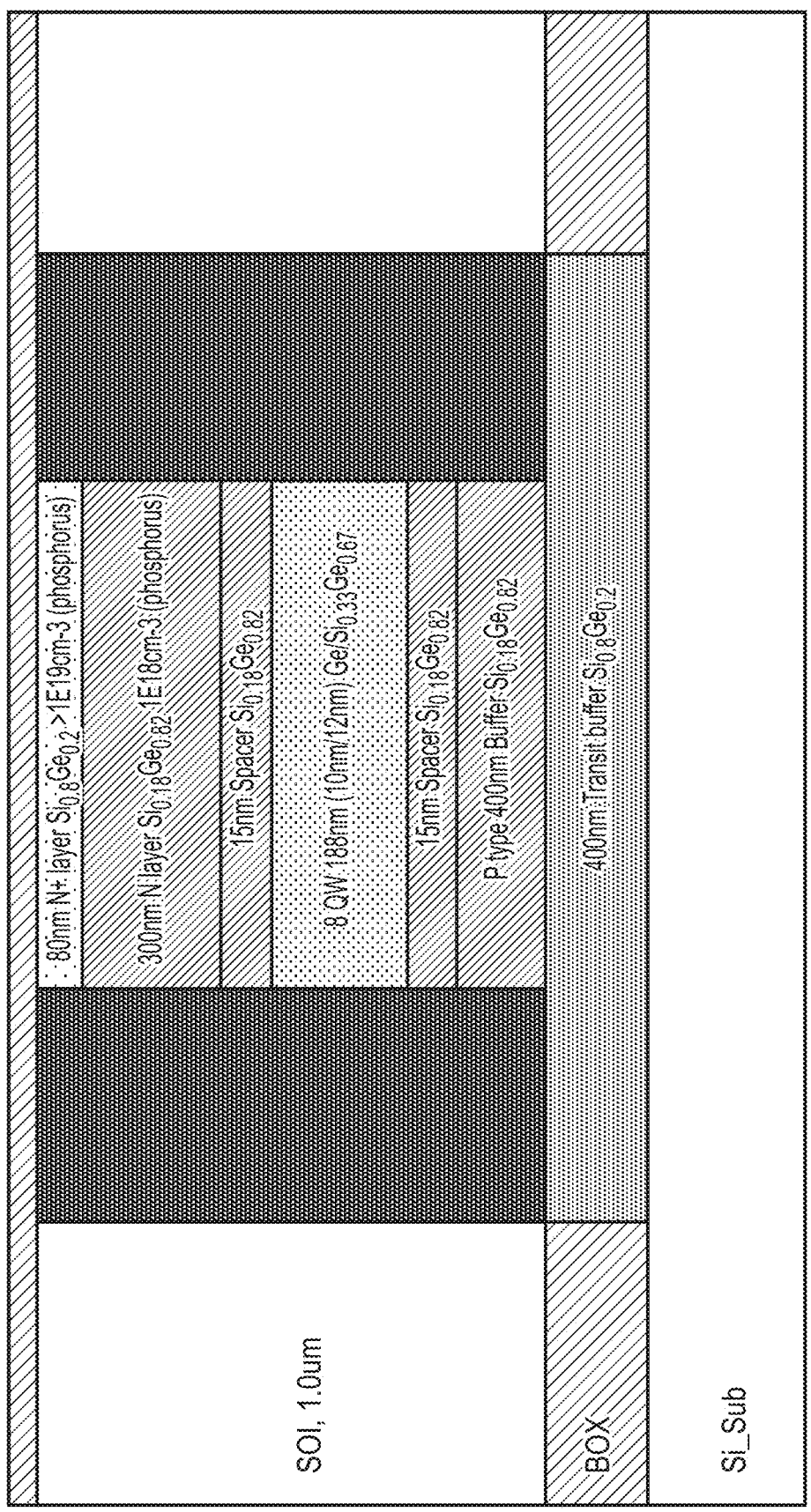
Figure 17J:
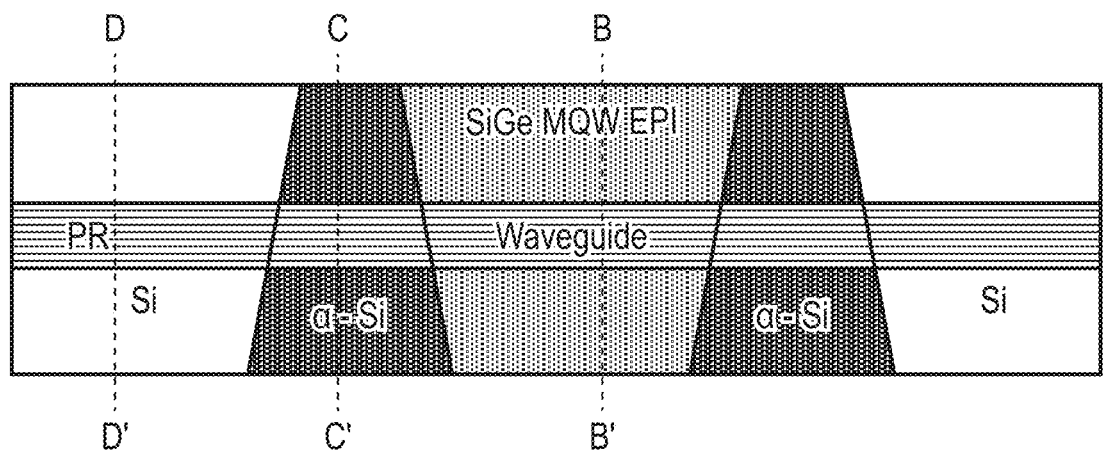
Figure 17K:
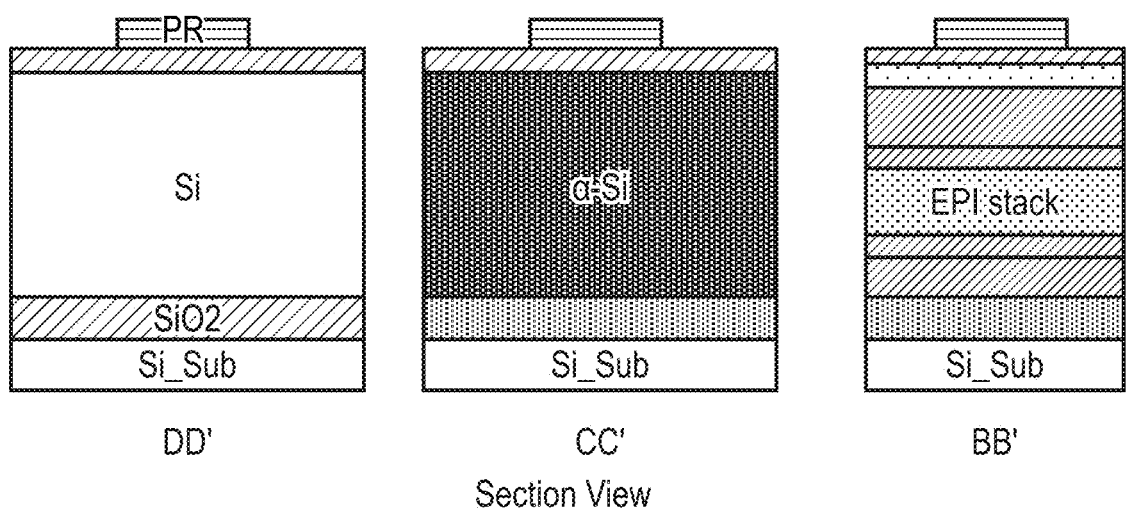
Figure 17L:
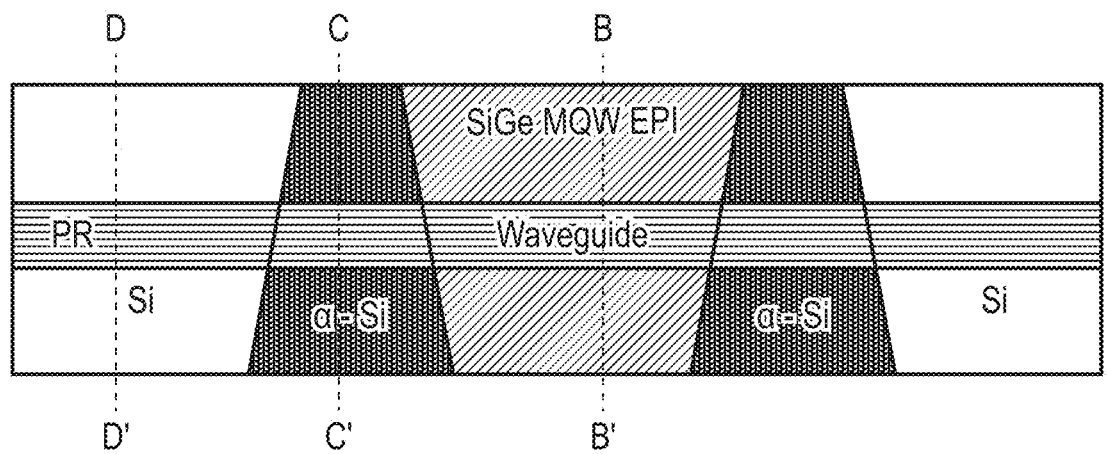
Figure 17M:
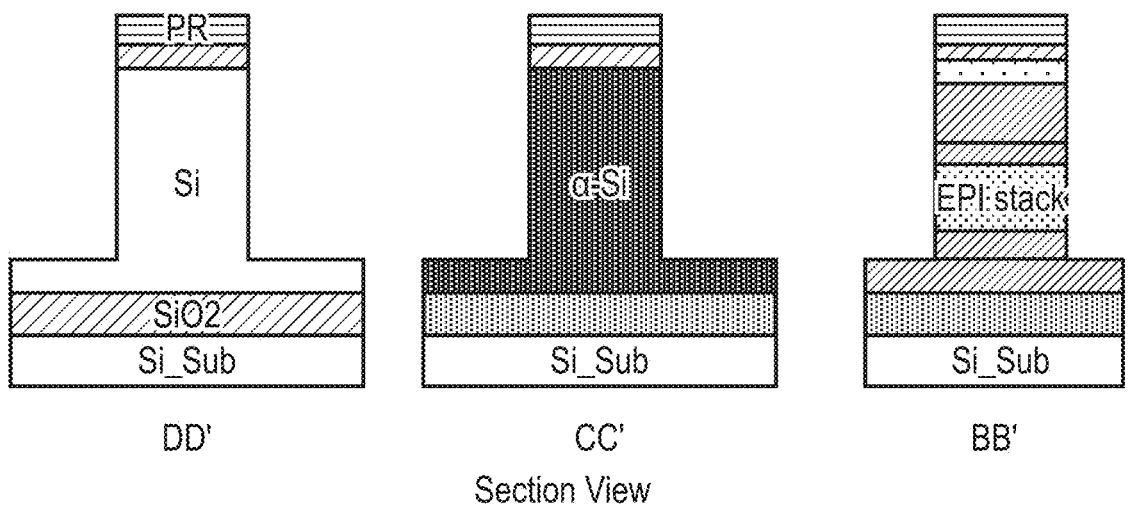
Figure 17N:
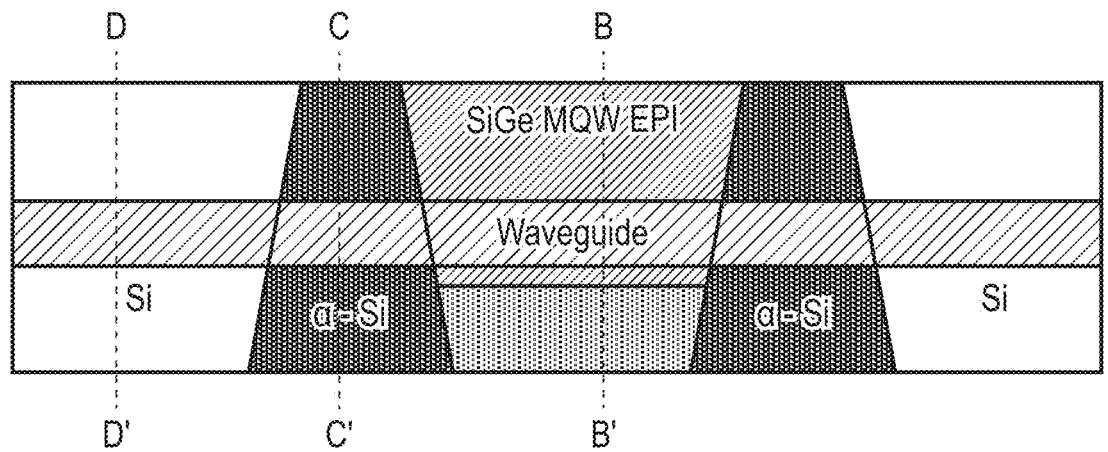
Figure 17O:
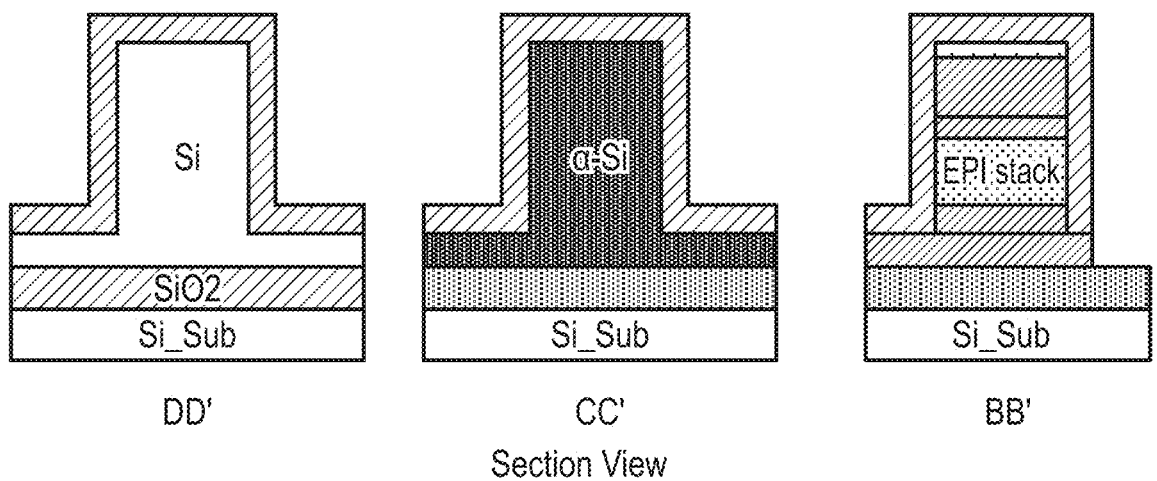
Figures 17P, 17Q:
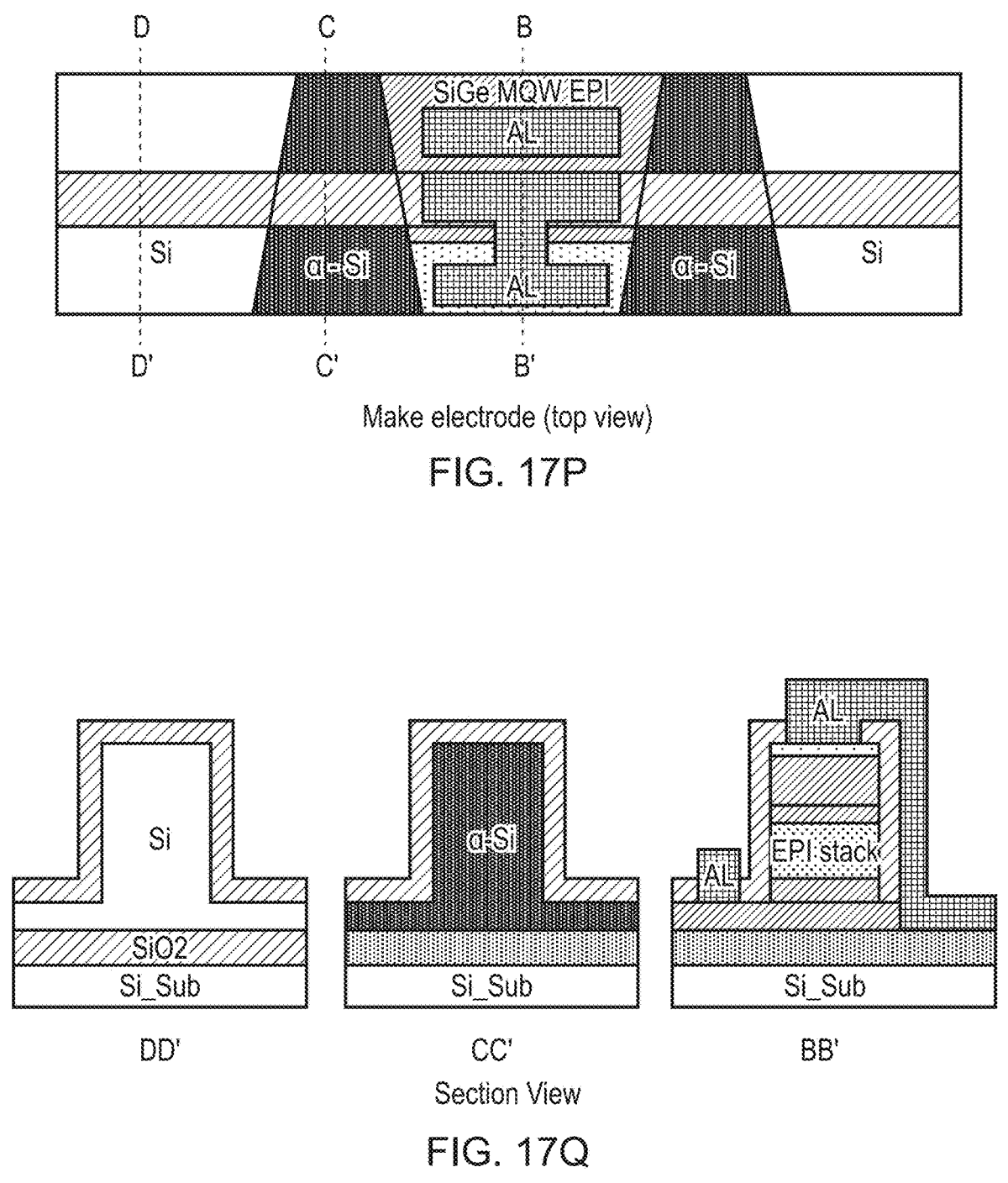

As depicted in FIG. 17B, the fabrication method for this embodiment includes the step of creating a box-less cavity by etching down past the buried oxide layer (BOX). An epitaxial cladding layer is grown within the cavity to replace the BOX layer, wherein the epitaxial cladding layer has a refractive index which is less than the refractive index of the buffer layer of the optically active region, such that an optical mode of the optoelectronic device is confined to the optically active region. The epitaxial cladding layer is shown to be a SiGe layer, but could alternatively take the form of a silicon layer.

In FIG. 17C, the electro-optically active stack is grown by LEPECVD method, but the electro-optically active stack can also be grown by selective grown method.

A further embodiment of an electro-optically device is described below with reference to FIGS. 18 to 20.

Figure 18:
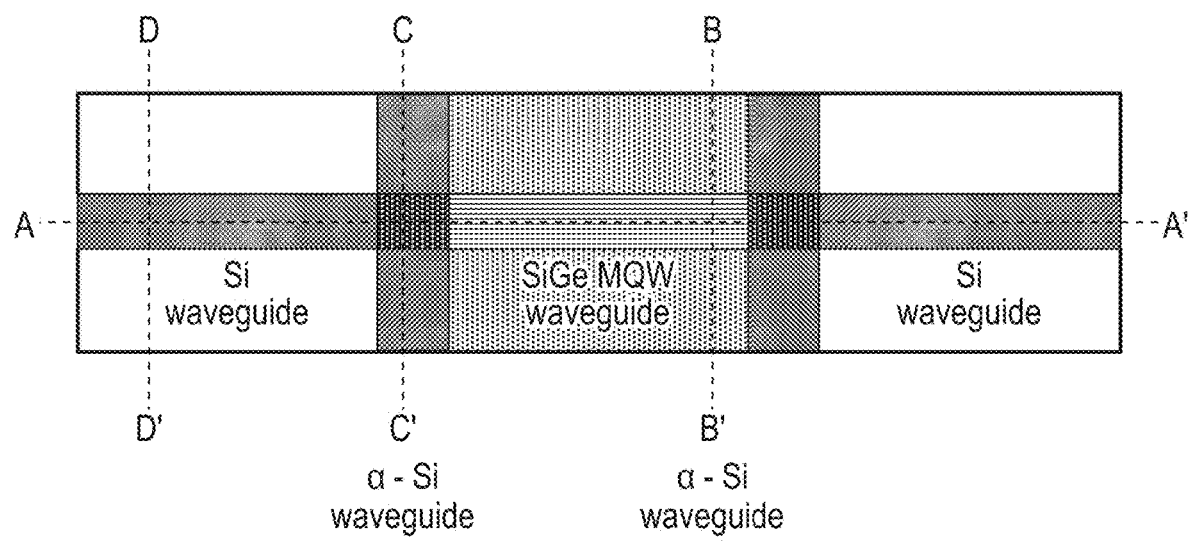
FIG. 18 shows a top down view of a further embodiment of an electro-optically active device according to embodiments of the present invention.

FIG. 18 shows a top down view of the further embodiment of an electro-optically active device.

Figure 19A:
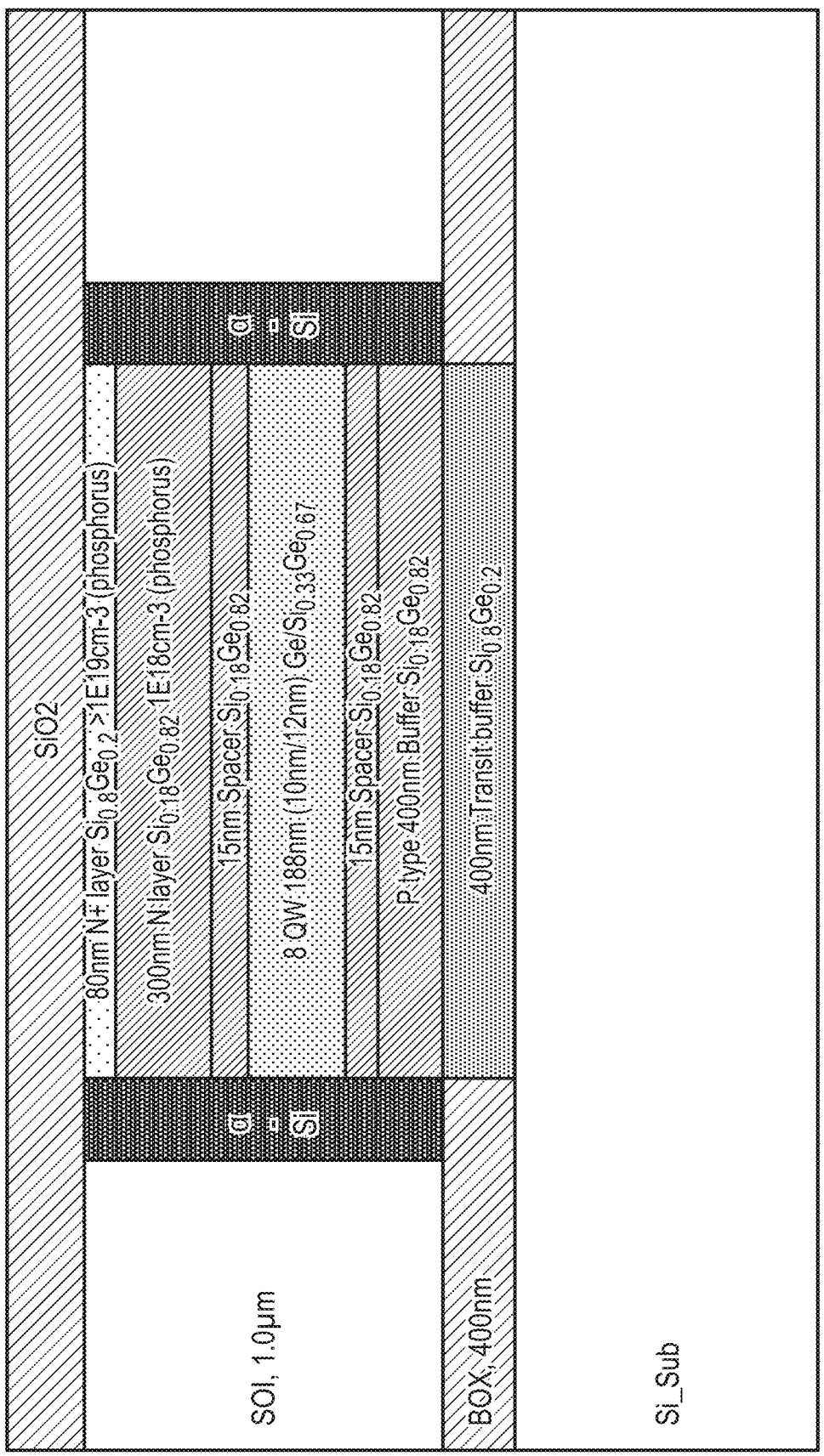

FIG. 19A shows cross-sectional view at the locations of AA' in FIG. 18. This embodiment differs from that in FIG. 15 in following aspects: 1) the channel is etched to BOX surface; 2) the channel is refilled with $SiO_2$ first, 3) the upper surface is chemical-mechanical planarized, and 4) then etched back to the same level of BOX surface.

Figure 19B:
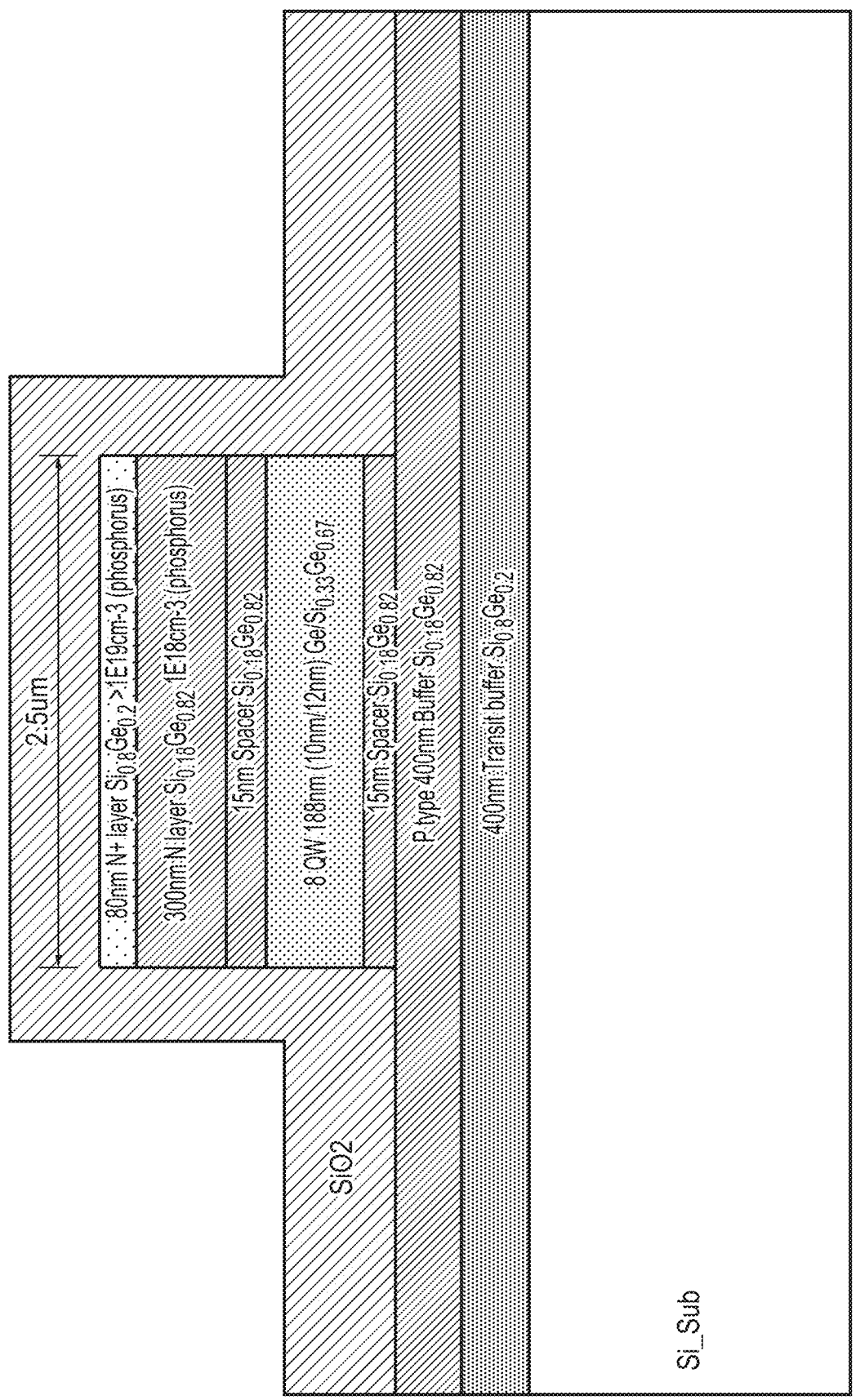

FIG. 19B shows the MQW rib waveguide cross-sectional view at the locations of BB' in FIG. 18.

FIG. 19C shows the α-Si (or SiGe) waveguide cross-sectional view at the locations of CC' in FIG. 18.

FIG. 19D shows the SOI waveguide cross-sectional view at the locations of DD' in FIG. 18.

FIGS. 20A-L depict example fabrication steps for the device in FIG. 18 with remaining processes the same as those in FIG. 17J to FIG. 17Q.

Figure 20A:
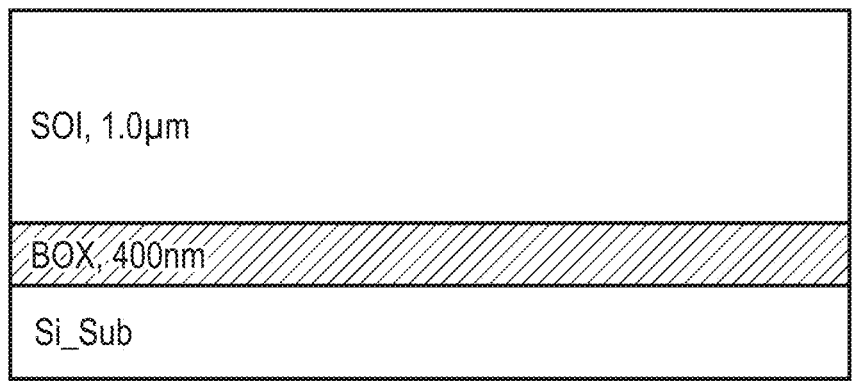

The fabrication process shown in FIG. 20A starts with a 1 μm SOI substrate.

Figure 20B:
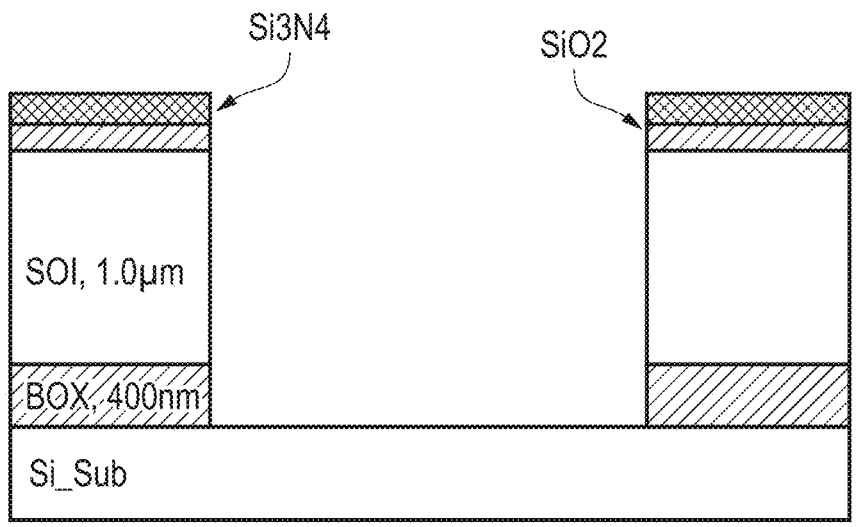

In FIG. 20B, two layers of hard mask comprising $SiO_2$ and silicon nitride ($Si_3N_4$) are used to etch the box-less cavity. This extra $Si_3N_4$ hard mask layer will be used as hard mask later for refilled $SiO_2$ etch back.

Figure 20C:
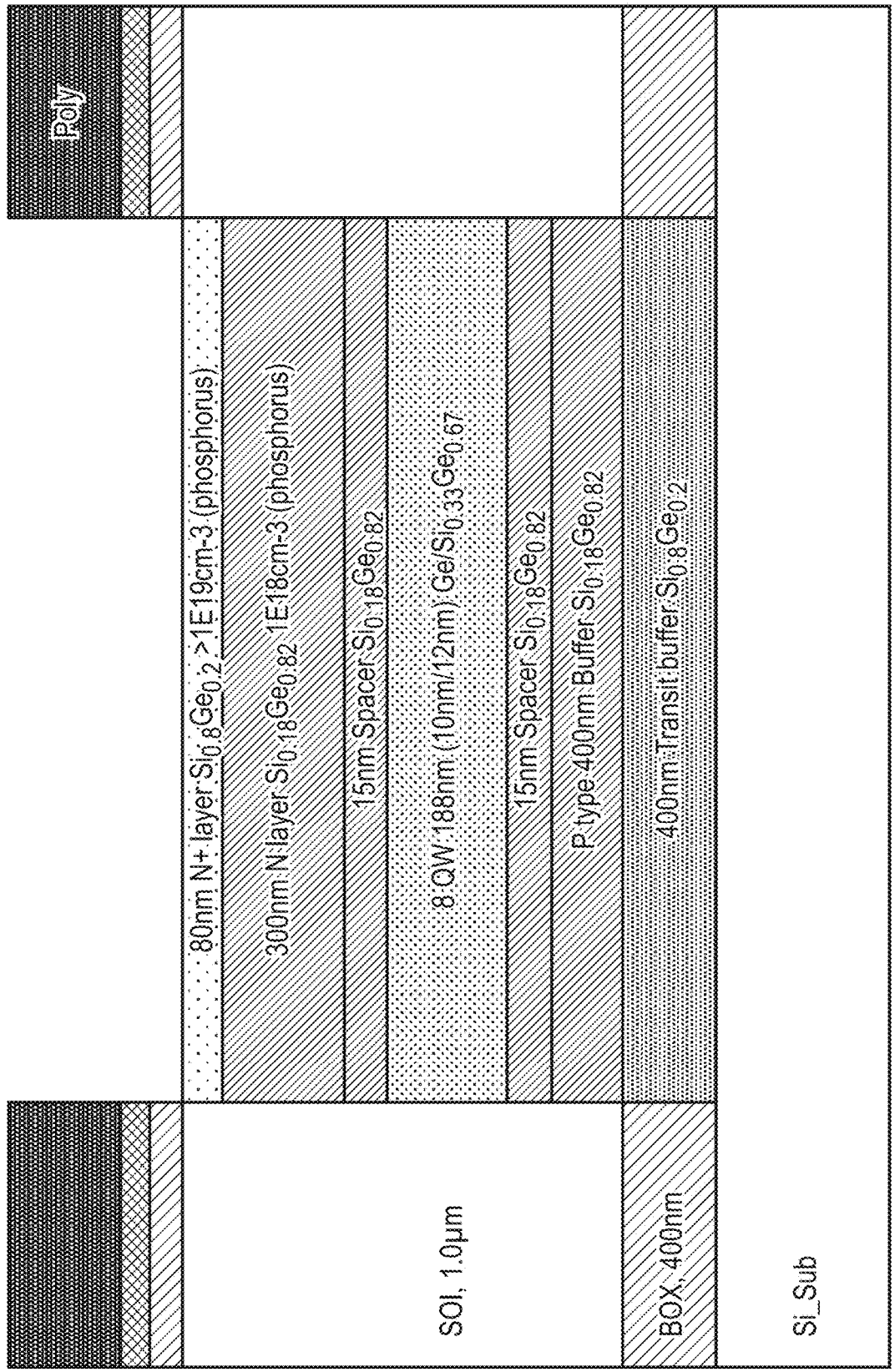

In FIG. 20C, the SiGe MQW EPI stack is grown.

FIG. 20D shows the preparation for the channel etching, in which two layers of hard mask comprising $SiO_2$ and $Si_3N_4$ are used. The channel etching result is shown in FIG. 20E.

Figure 20F:
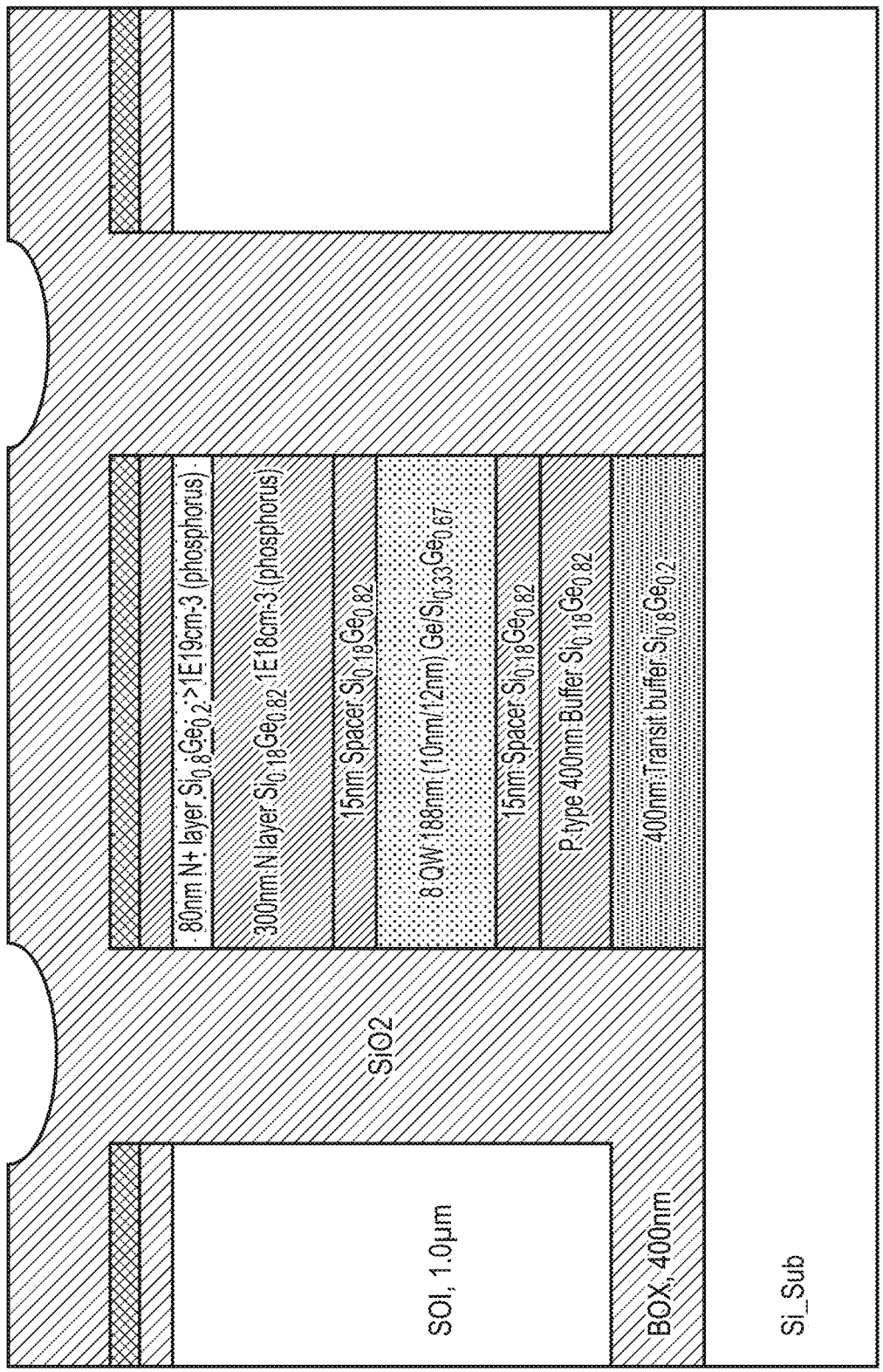
Figure 20G:
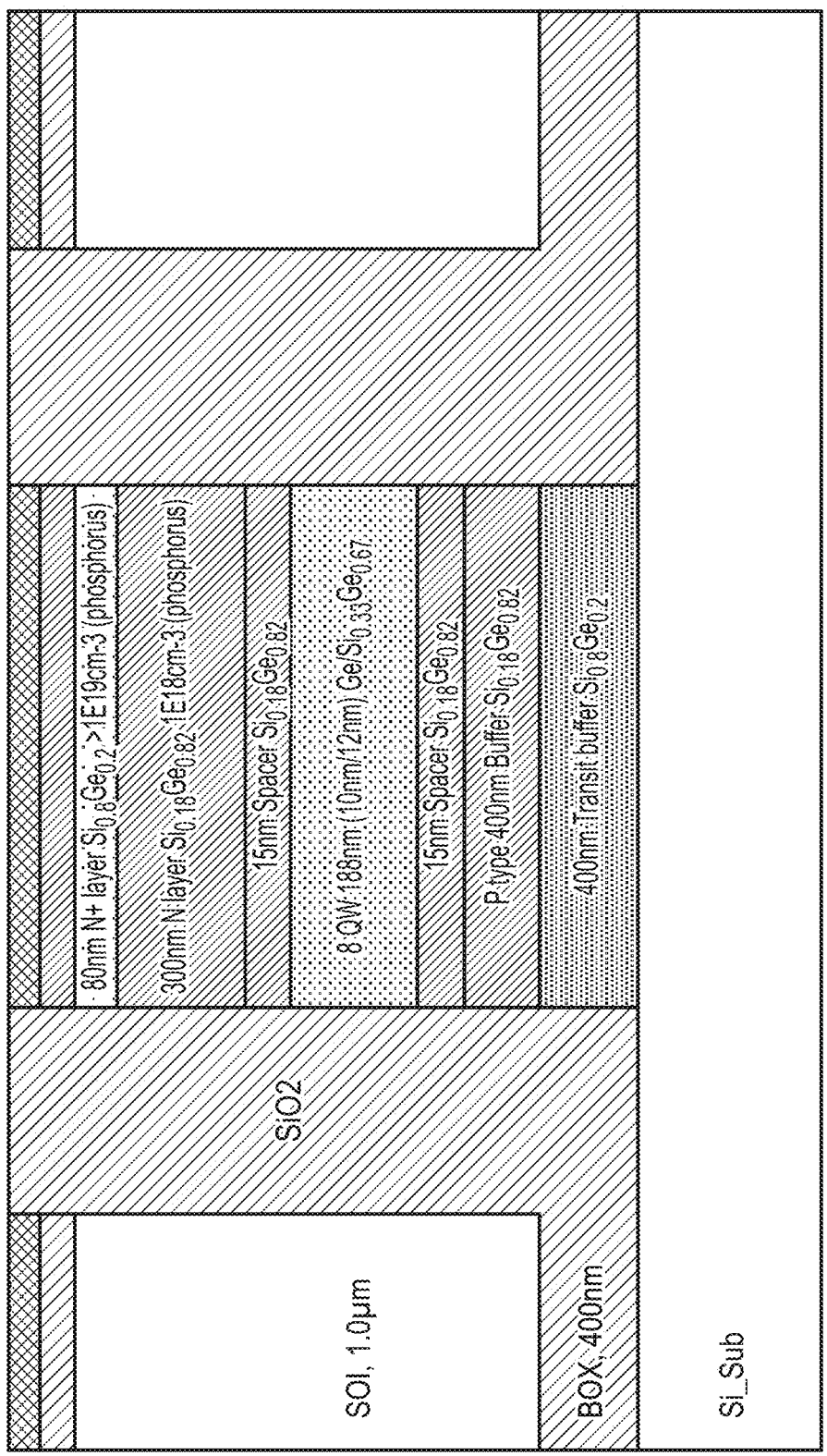

FIG. 20F shows the channel is refilled with $SiO_2$, then this refilled $SiO_2$ is planarized by CMP, which is shown in FIG. 20G. The hard mask layer of $Si_3N_4$ is used as the stop layer of CMP process. Then the refilled $SiO_2$ is etched back to the same level of BOX surface with the $Si_3N_4$ as hard mask, which is shown in FIG. 20H.

Figure 20I:
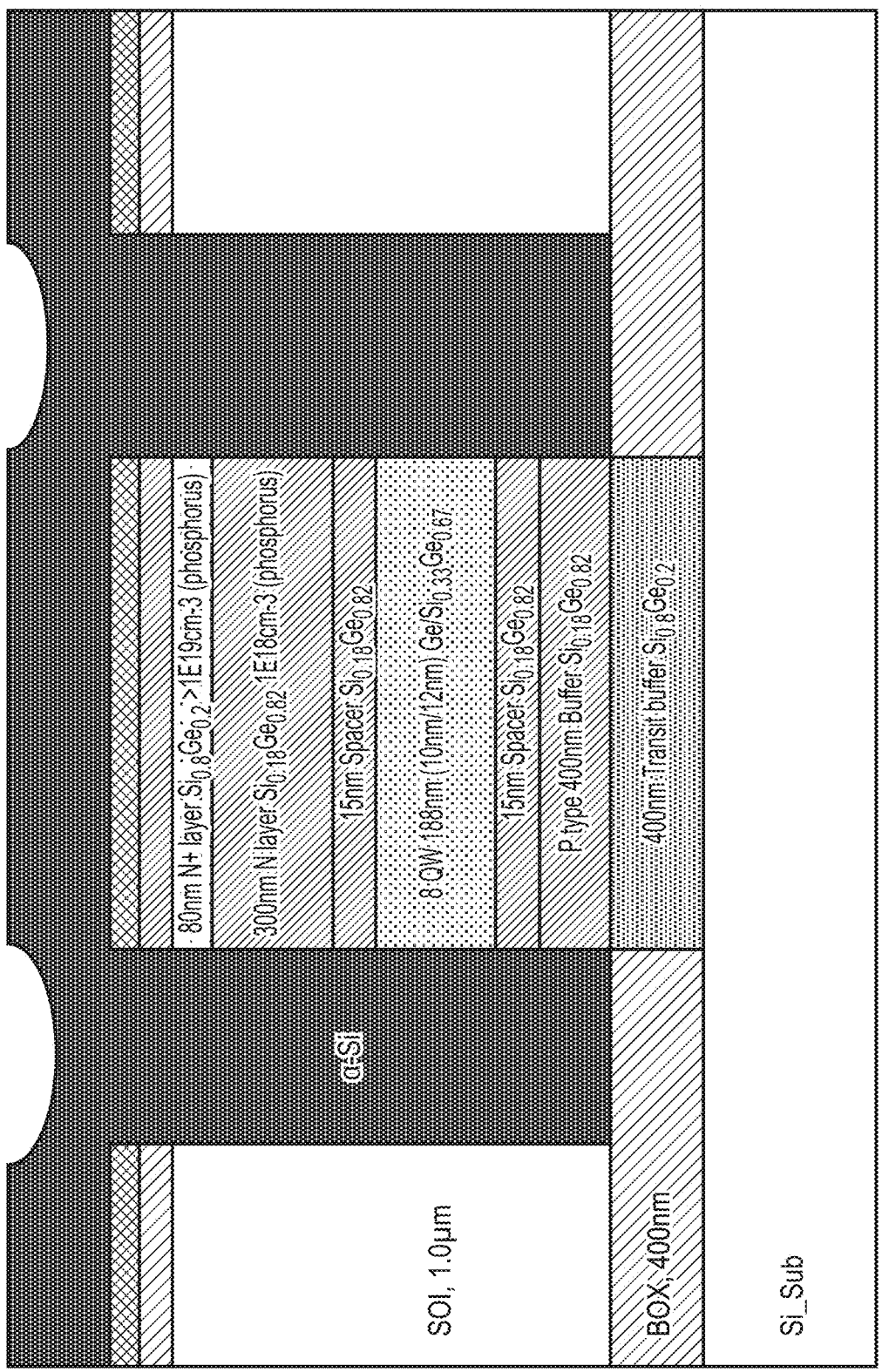

In FIG. 20I, the channel is refilled with amorphous silicon. The refilling material may be other material that has bigger refractive index than that of SOI and smaller than that of germanium.

Figure 20J:
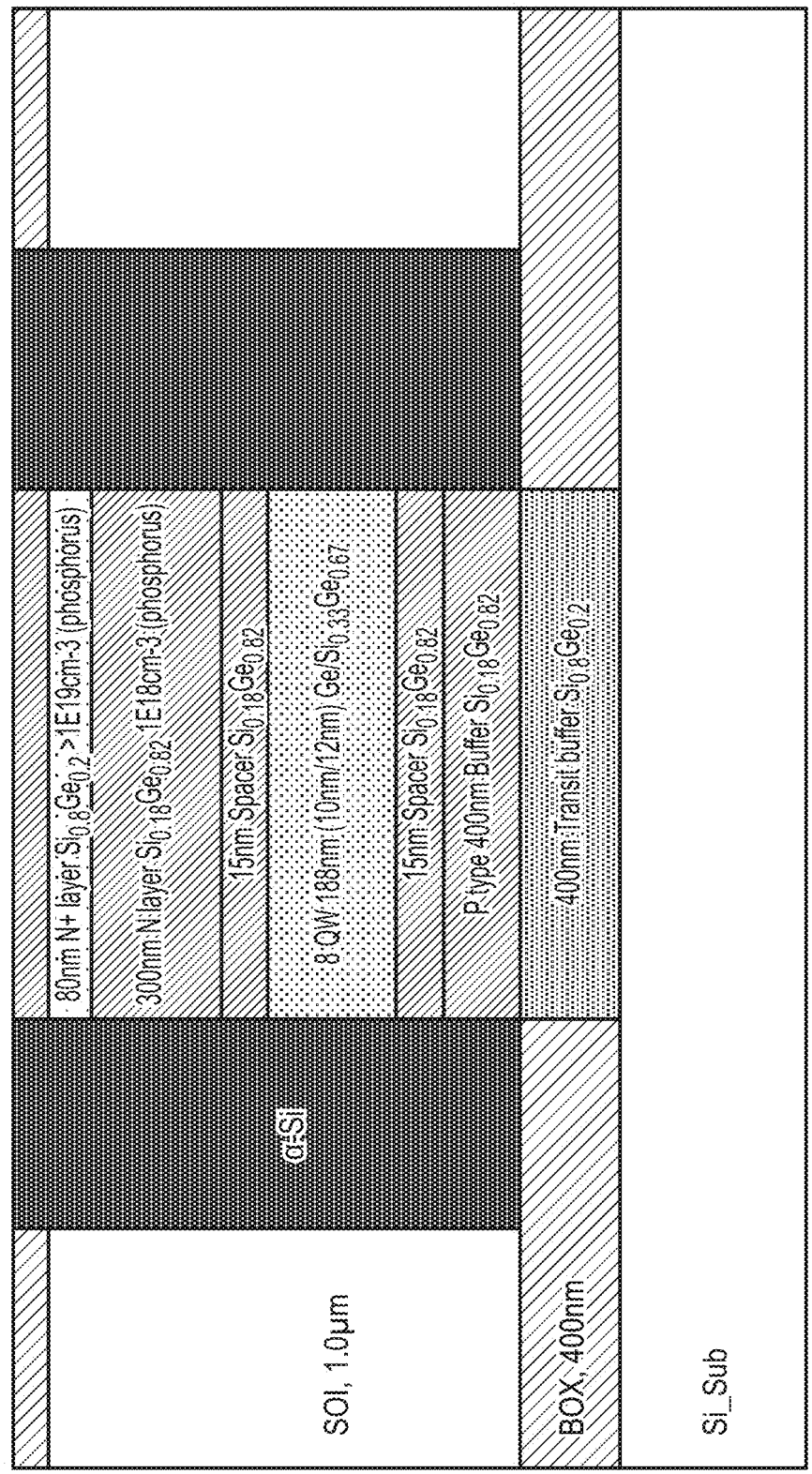
Figure 20L:
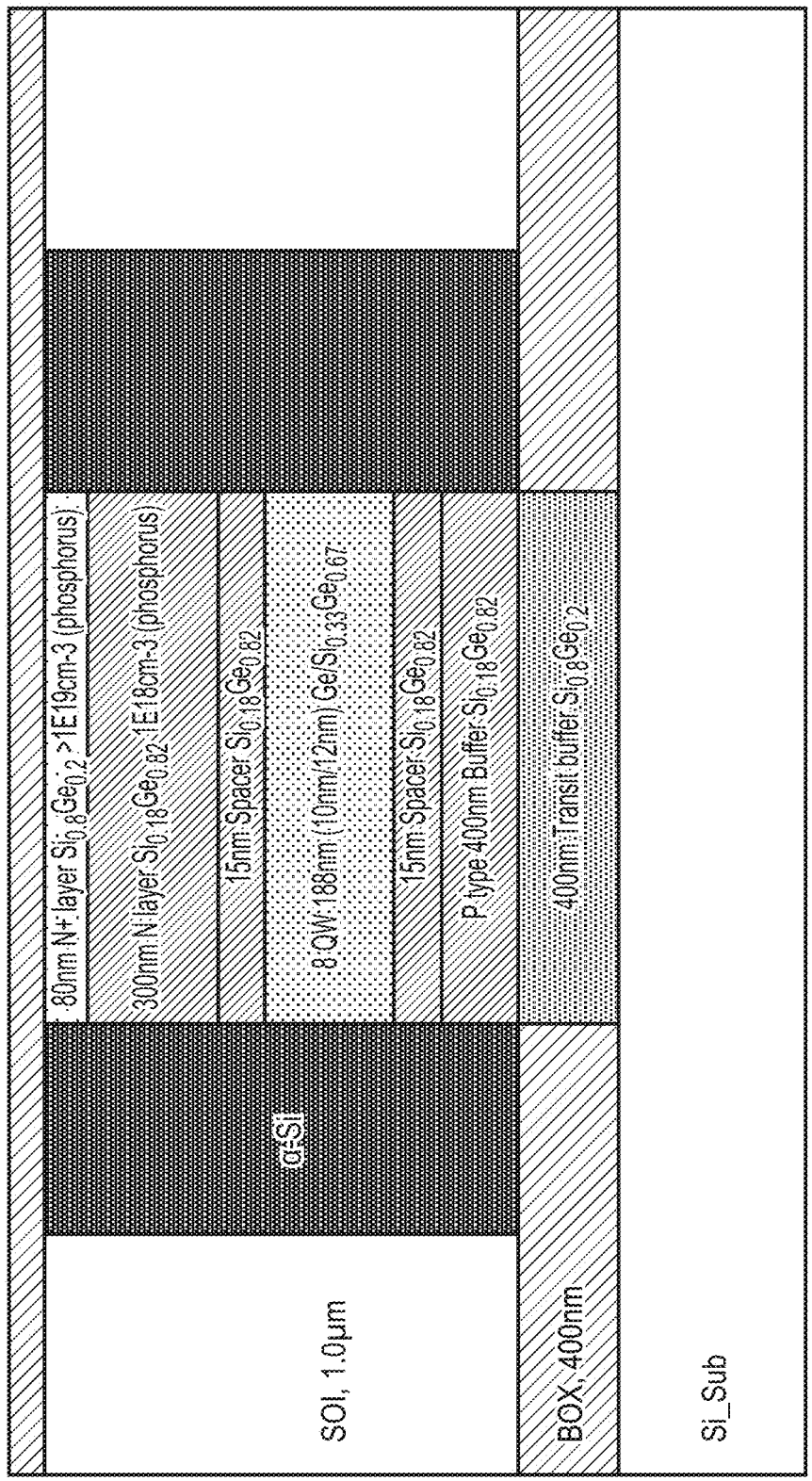

In FIG. 20J, the refilled amorphous silicon is planarized by CMP process again, followed by an optional process of etching back to have the amorphous silicon surface the same level as that of MQW EPI stack, which is shown in FIG. 20K, then the $SiO_2$ hard mask is removed and a new layer of $SiO_2$ hard mask is deposited for waveguide fabrication, which is shown in FIG. 20L. The remaining fabrication processing steps are the same as those shown in FIG. 17J to FIG. 17Q to make the device shown in FIG. 18.

It should be appreciated that this "box-less" fabrication method could also be applied to other embodiments described herein such as that of FIG. 3.

This arrangement may have the advantage that the number of features with a small feature size is reduced (for example, as compared to more complicated evanescent coupling structures). Since small structures can be sensitive when it comes to process tolerance, this arrangement can therefore reduce the sensitivity to process tolerance during fabrication.

Figure 21:
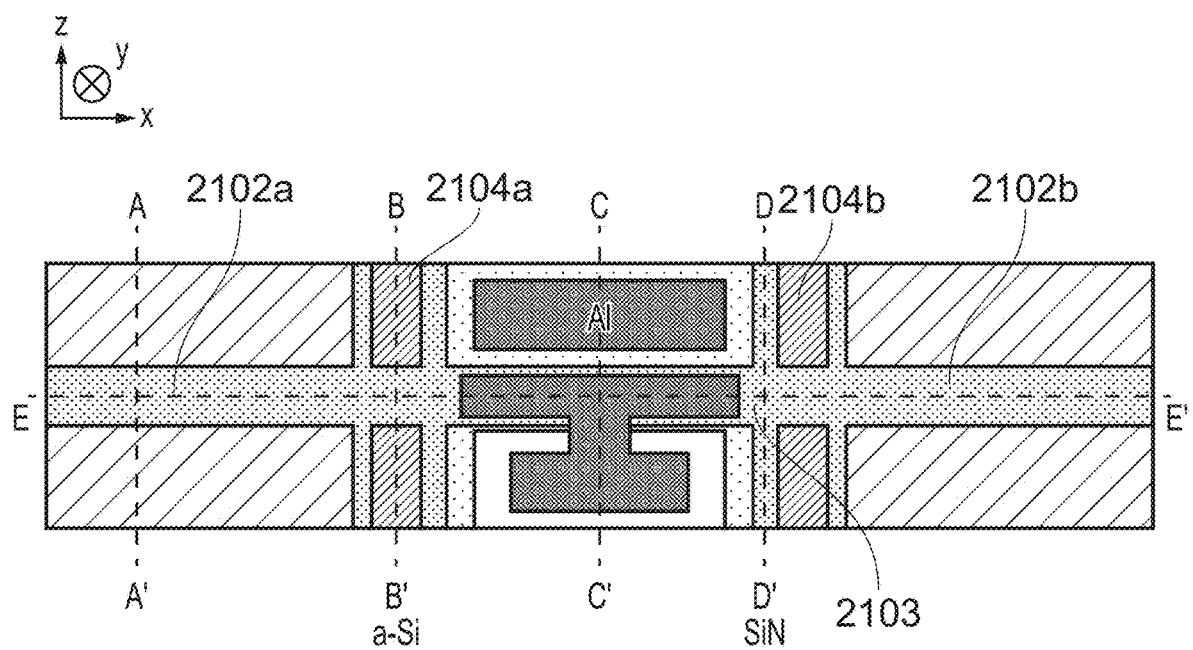
FIG. 21 shows a top down view of an embodiment of an electro-optically active device according to embodiments of the present invention.

FIG. 21 shows an electro-optically active device which comprises a silicon substrate. Disposed above the substrate is a buried oxide layer (which is around 400 nm thick), which functions as a lower cladding layer for the waveguides present in the device. On top of the buried oxide layer are first and second passive silicon waveguides 2102a and 2102b which are similar to 202a and 202b discussed previously. These waveguides may be 1.1 μm thick. In between the first and second passive silicon waveguides is an electro-optically active stack 2103, and either side of the stack are first and second channels 2104a and 2104b which have been lined with a liner and filled with amorphous silicon (α-Si) or SiGe, or another material which has a higher refractive index than silicon, thereby providing a bridge-waveguide. The liner is, in this example silicon nitride (SiN). A capping oxide layer (e.g. $SiO_2$) is disposed over the top of the stack, channels, liner, and passive SOI waveguides. The electro-optically active stack is connected to first and second electrodes, each formed of aluminium.

Figure 22A:
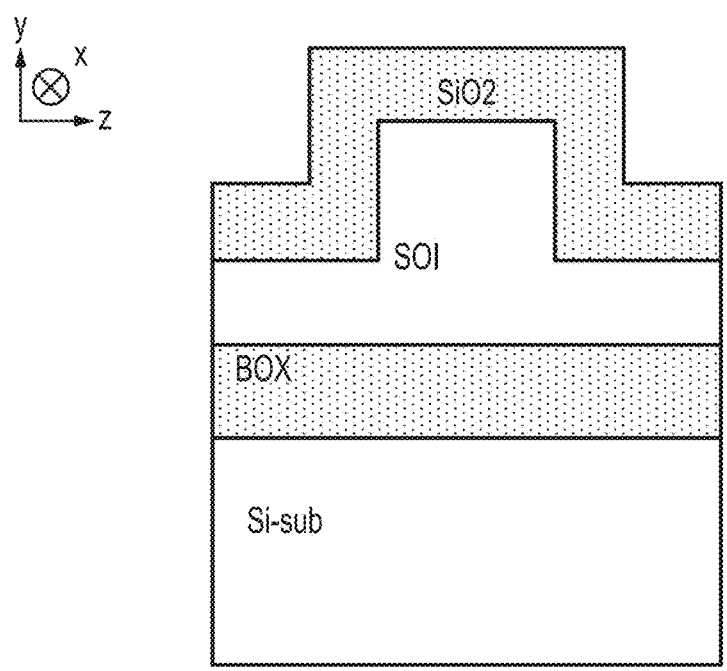
FIGS. 22a-22e show cross-sectional views of the device of FIG. 21 along the lines A-A', B-B', C-C', D-D', and E-E' respectively.
Figure 22B:
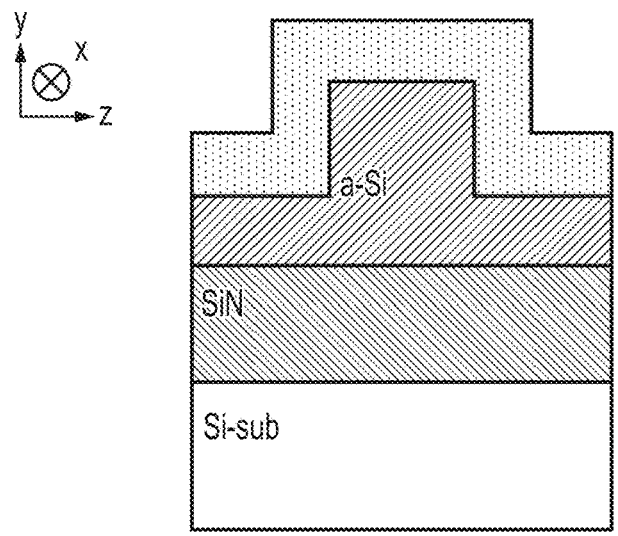
Figure 22C:
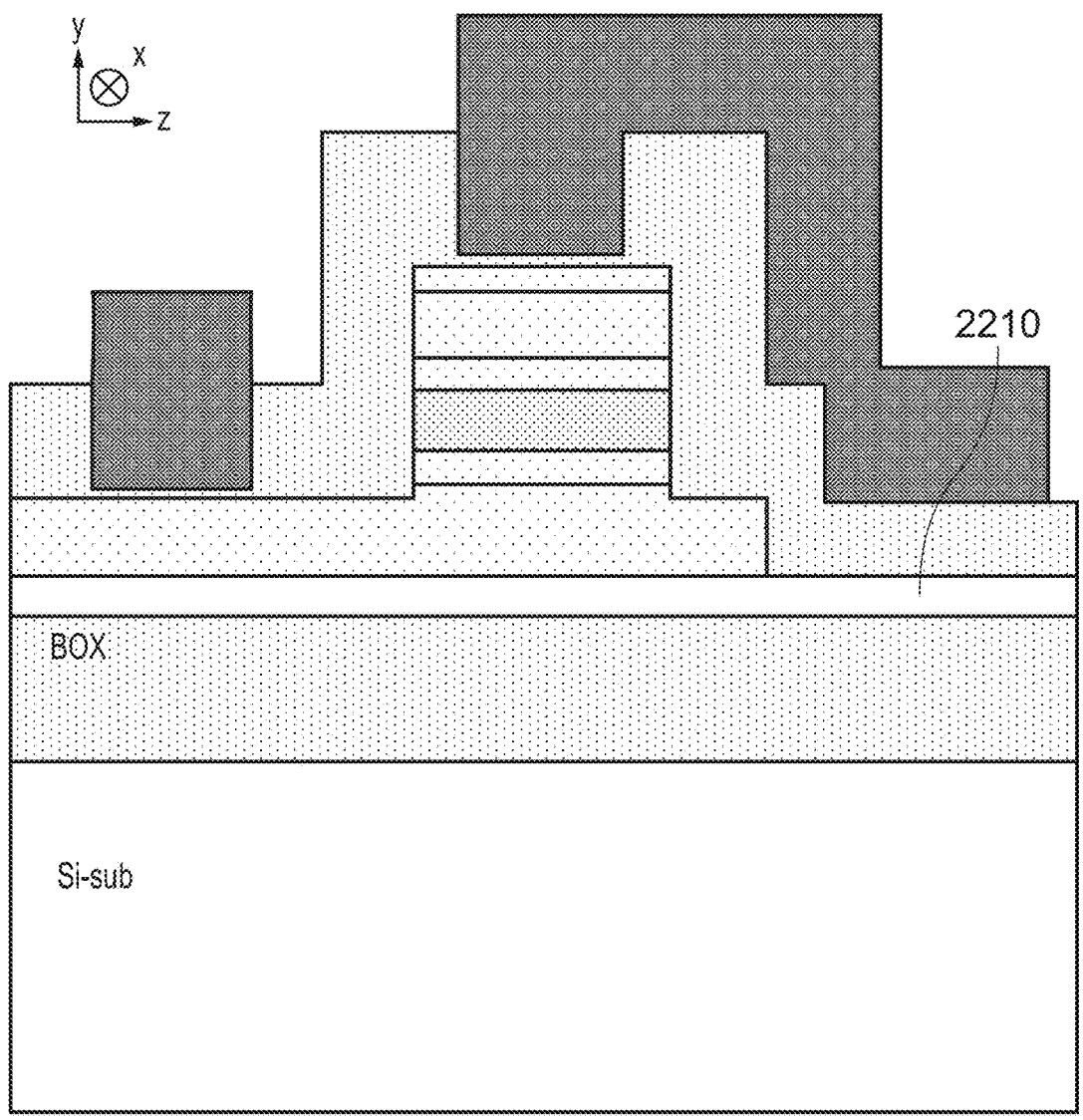
Figure 22D:
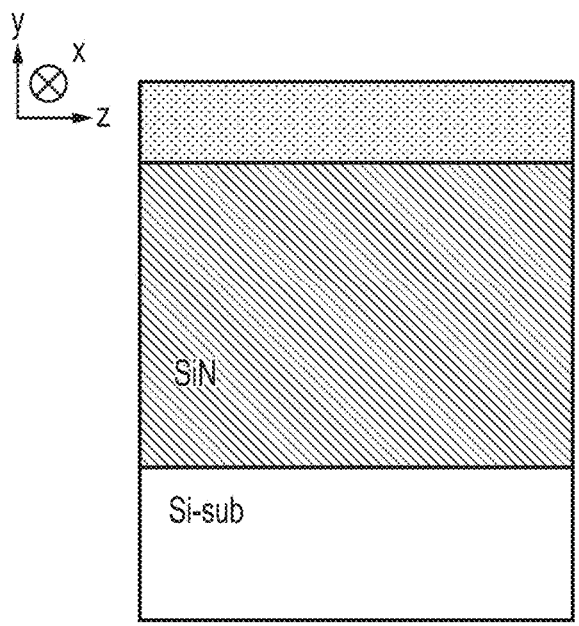
Figure 22E:
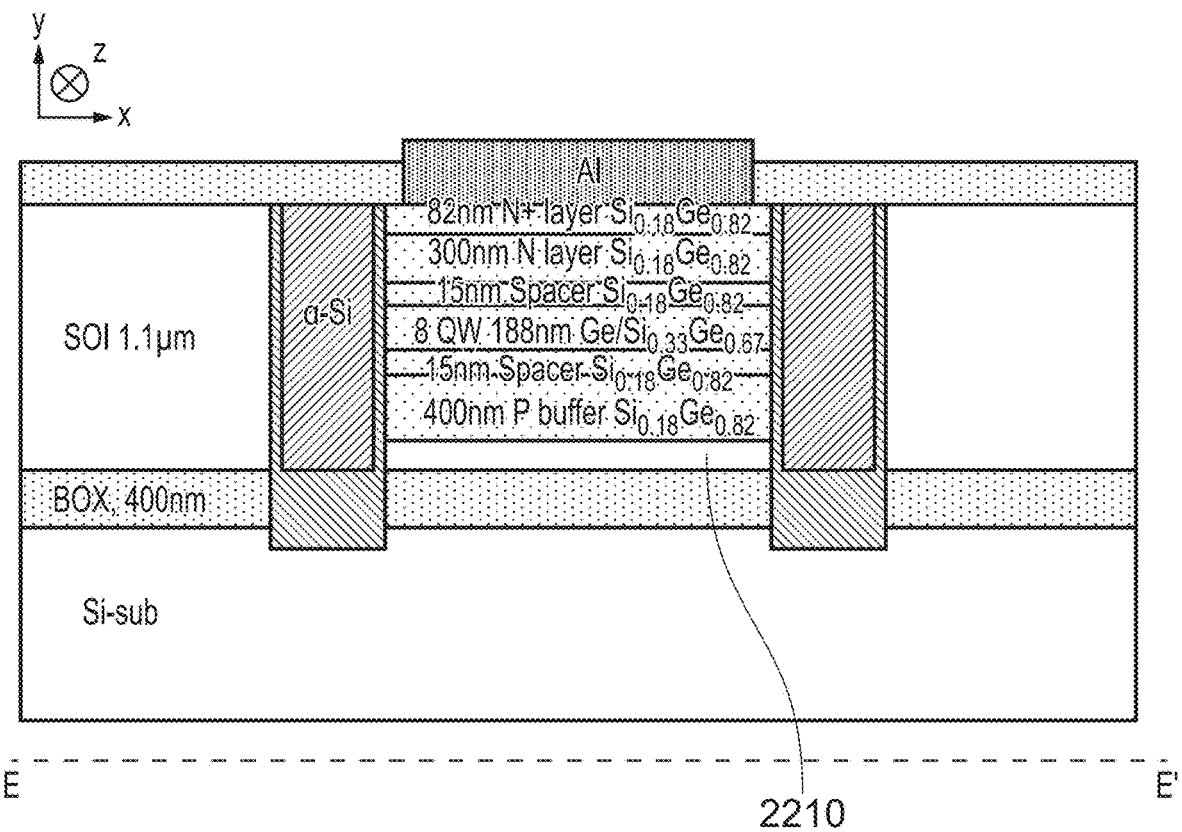

FIGS. 22a-22e show various cross-sections of the device shown in FIG. 21. FIG. 22a is a cross-section along the line A-A', FIG. 22b is a cross-section along the line B-B', FIG. 22c is across-section along the line C-C', FIG. 22d is a cross-section along the line D-D', and FIG. 22e is a cross-section along the line E-E'.

As can be seen in, for example, FIG. 22b, the channel which is filled with amorphous silicon is lined with silicon nitride. This liner lines both the sidewalls of the channel and the bed of the channel. This can also be seen in FIG. 22e, which also shows in more detail the structure of the electro-optically active stack. The stack is formed on a silicon seed layer 2210, which as discussed in detail below, is the remnant of a silicon-on-insulator layer which has been etched to provide the cavity within which the stack is formed. The seed layer is, in some examples, around 100 nm thick. The stack is ordered as follows going up from a layer immediately adjacent to the silicon seed layer: a 400 nm p doped buffer layer comprising $Si_{0.18}Ge_{0.82}$; a 15 nm spacer layer comprising $Si_{0.18}Ge_{0.82}$; 8 Germanium quantum wells located in a layer 188 nm thick and including barrier layers comprising $Si_{0.33}Ge_{0.67}$; a further 15 nm spacer layer comprising $Si_{0.18}Ge_{0.82}$; a 300 nm n doped layer comprising $Si_{0.18}Ge_{0.82}$; and an 82 nm n+ doped layer comprising $Si_{0.18}Ge_{0.82}$. The 82 nm n+ layer may be doped to a concentration of greater than $1\times10^{19}$ $cm^{-3}$ using phosphorus as the dopant. The 300 nm n doped layer may be doped to a concentration of $1\times10^{18}$ $cm^{-3}$ using phosphorus as the dopant. The 400 nm p doped layer may be doped to a concentration of $1\times10^{18}$ $cm^{-3}$ using boron as the dopant.

Figure 23:
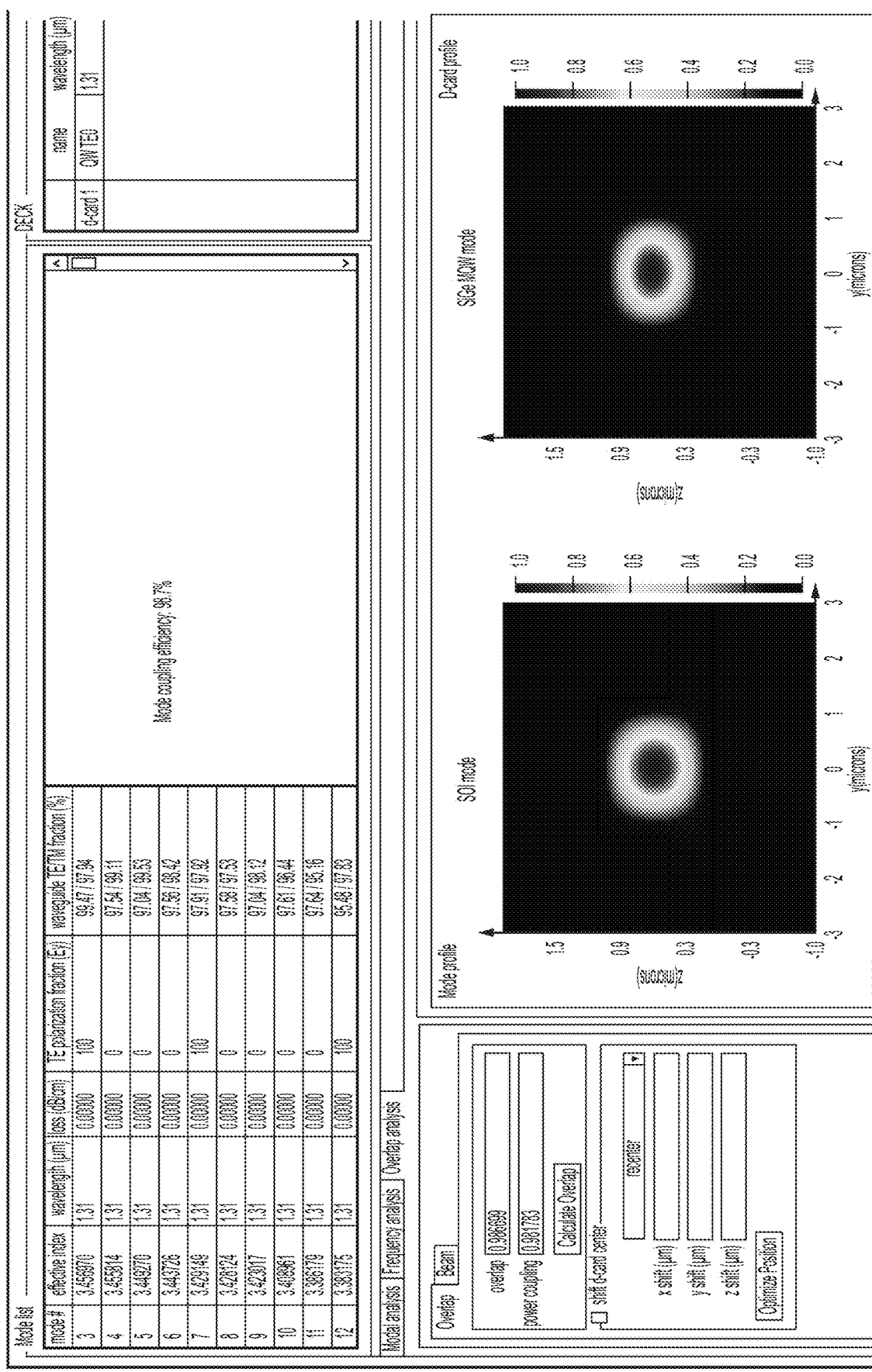
FIG. 23 shows simulation results of the device coupling efficiency shown in FIG. 21.
Figure 24A:
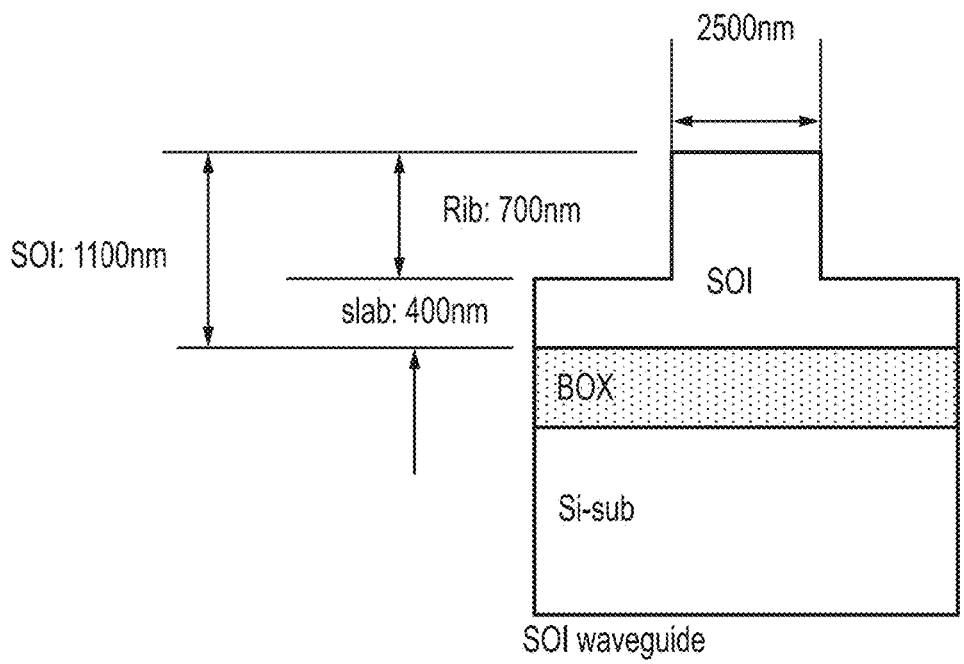
FIGS. 24a and 24b show cross-sectional views of the SOI waveguide and MQW waveguide as simulated in FIG. 23.
Figure 24B:
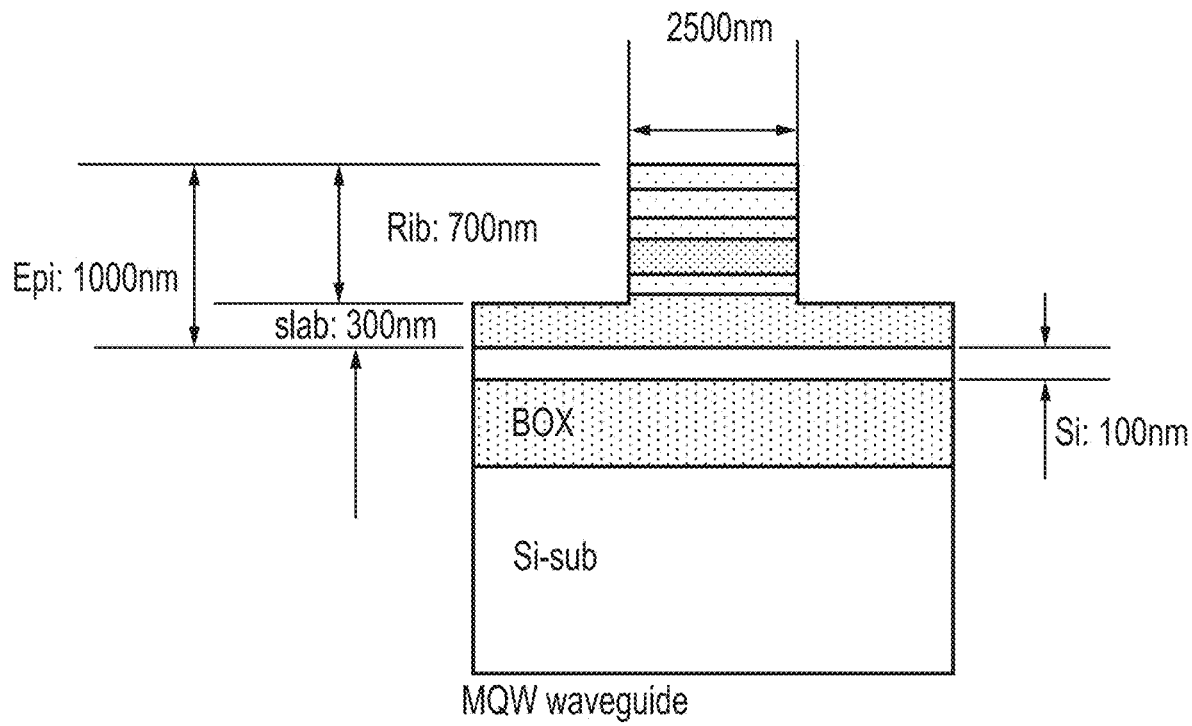

FIG. 23 shows a simulated device using the principles of the device in FIG. 22 (i.e. including a silicon seed layer on which to grow the electro-optically active stack). The left hand optical mode is for a SOI waveguide portion of the device as shown in FIG. 24a, and the right hand optical mode is for a SiGe MQW waveguide portion of the device as shown in FIG. 24b. The figure also shows the corresponding passive optical coupling efficiency results with Lumerical Mode Solution software at wavelengths of around 1310 nm. Of note is that a mode coupling efficiency of around 98.7% is achieved.

FIGS. 25a-33(d) show various manufacturing stages, and various cross-sectional views of various manufacturing stages.

Figure 25A:
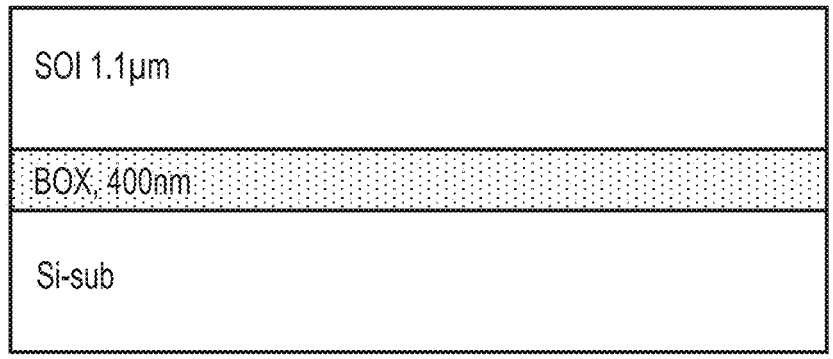

In FIG. 25a, an SOI wafer is provided. The SOI wafer comprises a 1.1 μm thick SOI layer (which may be referred to as a silicon device layer) located on top of a 400 nm BOX layer. The BOX layer is above a silicon substrate, which may have various thicknesses depending on the wafer chosen.

Figure 25B:
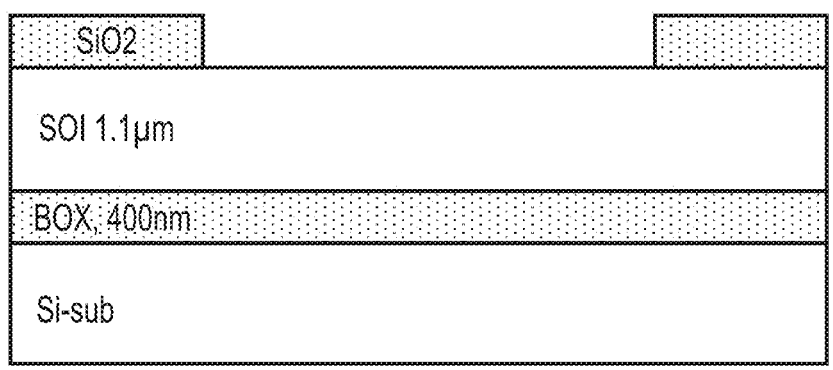
Figure 25C:
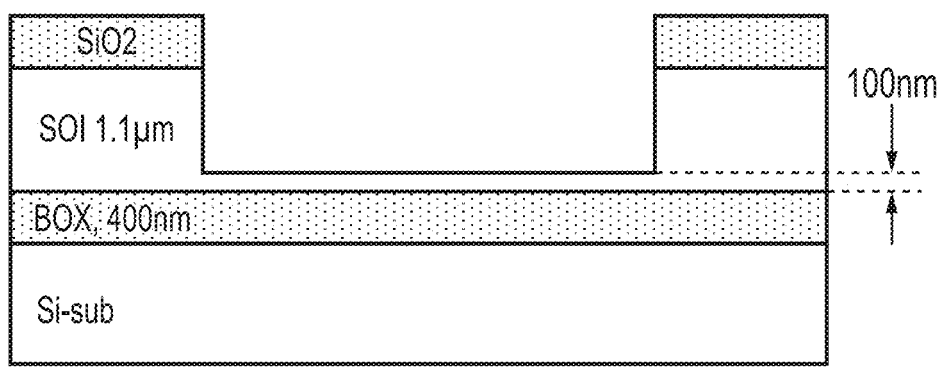

In a next step, shown in FIG. 25b, an oxide cavity window is provided. The oxide in this example is $SiO_2$ to provide a hard mask for etching. The window is in between the two non-continuous parts and defines the width of the cavity. The window is then etched, and the result is shown in FIG. 25c. In contrast to the methods discussed previously, the cavity is etched only partially through the 1.1 μm thick SOI layer. A 100 nm silicon seed layer is retained, from which the electro-optically active stack will be grown, which may include SiGe components.

Figure 25D:
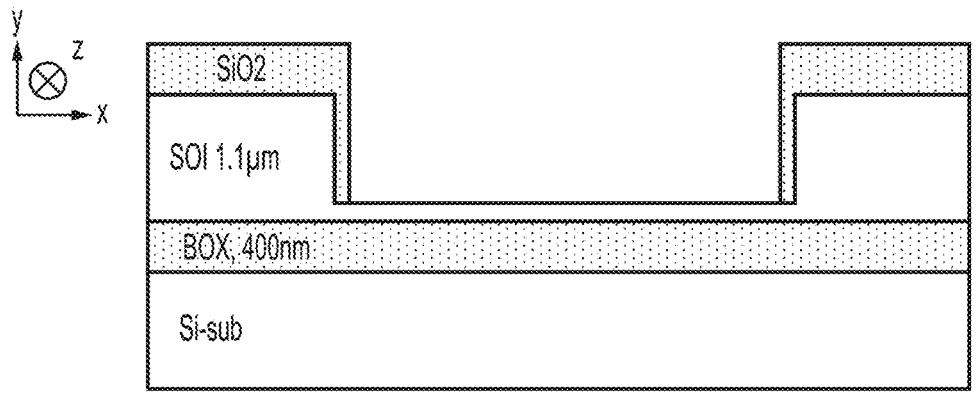

An oxide spacer layer is then deposited within the cavity as shown in FIG. 25d. In contrast to the oxide spacer layer discussed previously, no oxide is provided on the bed of the cavity. This can be achieved either through thermal oxidation or through PECVD deposition followed by an etch to remove the oxide spacer layer present on the bed of the cavity. The oxide spacer layer is $SiO_2$ and has a thickness of 20 nm. This means that the spacer layer lines sidewalls of the now formed cavity with a 20 nm thick lining.

Figure 25E:
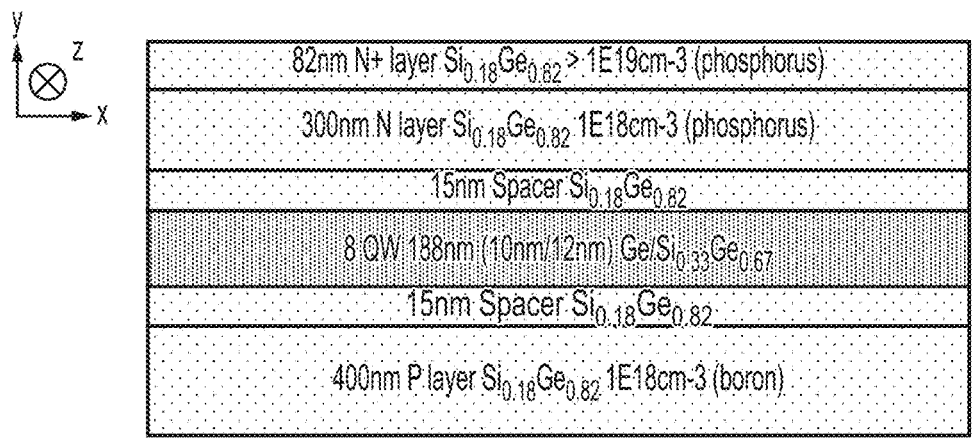
Figure 25F:
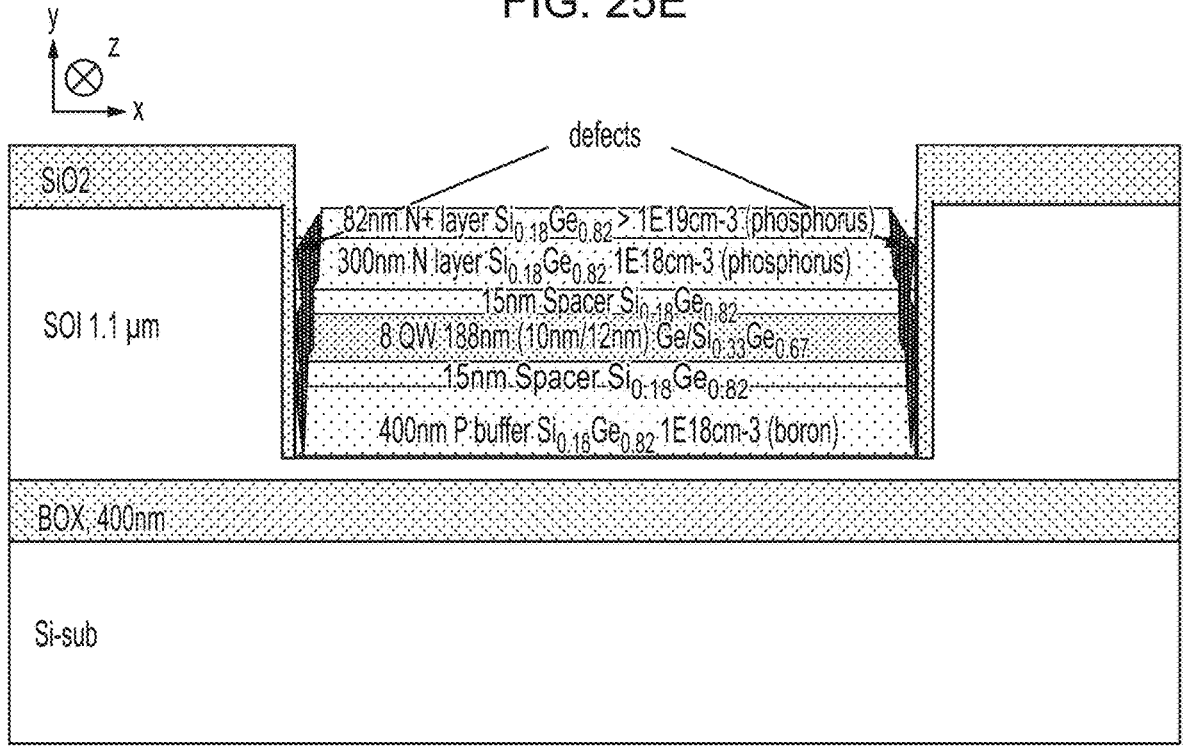

FIG. 25e shows the structure of the electro-optically active stack which is to be grown in the cavity. FIG. 25f shows the device after the electro-optically active stack has been provided. The electro-optically active stack is selectively grown within the cavity defined by the sidewalls, bed, and spacer layer. The spacer layer helps ensure that the epitaxy process used to grow the stack produces a relatively uniform crystalline structure to the stack i.e. the stack grows only from the bed of the cavity and not from the side regions. The electro-optically active stack can also be grown by LEPECVD (Low-Energy Plasma-Enhanced Chemical Vapour Deposition), if so, there will be a poly-crystalline stack on top of the side regions. As can also been seen in FIG. 25f, there are two faced regions either side of the stack adjacent the sidewalls (as indicated as defects). The surfaces of the stack which is immediately adjacent to the sidewalls may be described as grown-surfaces as the result of epitaxial growth. Faceted regions (indicated as 'defects' in FIG. 25f) exist after the growth, as a result of the sidewall shadow effect.

Figure 25G:
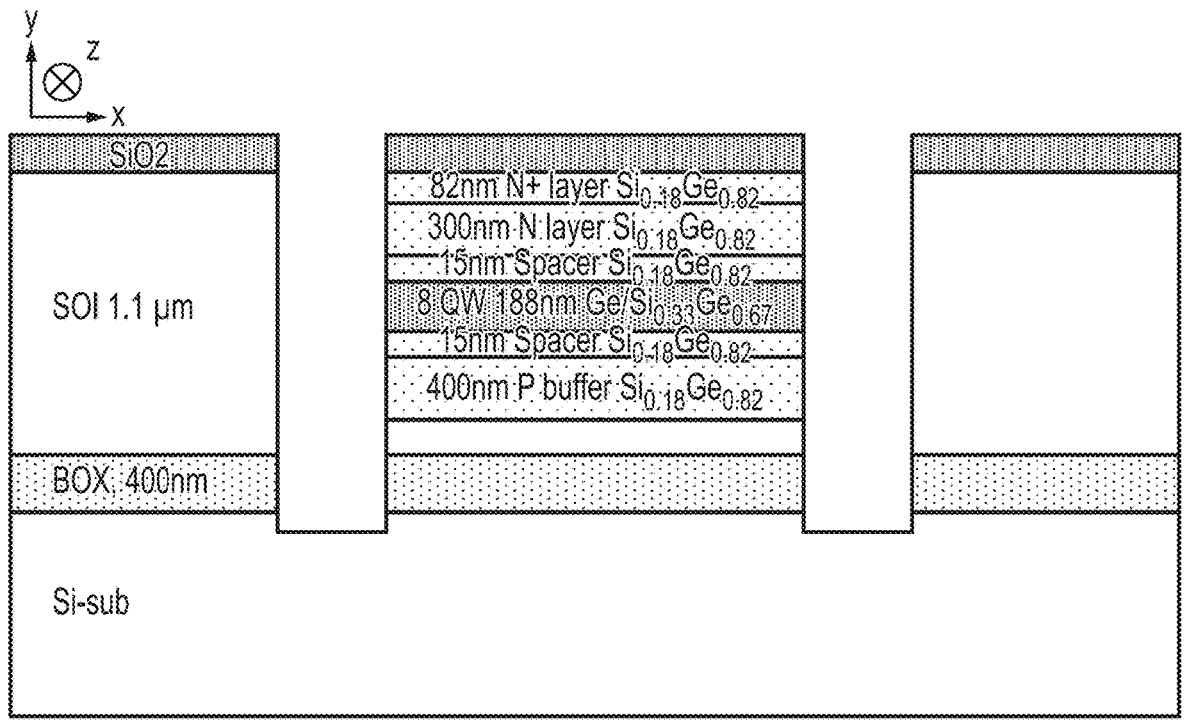

As shown in FIG. 25g, the stack is then etched to remove the faceted regions. This results in two channels, each adjacent to a respective sidewall, and the faces of the stack immediately adjacent to the channels are now etched-faces as opposed to grown-faces. The etch to remove the channels extends, in this example, through the buried oxide layer and partially through the silicon substrate. The etch is generally between 3 μm and 10 μm wide. The depth of the etch is around 120 nm into the silicon substrate. The depth of the etch allows the top surface of the buried oxide layer (within and adjacent to the cavity) to be aligned the silicon nitride layer subsequently grown).

Figure 25H:
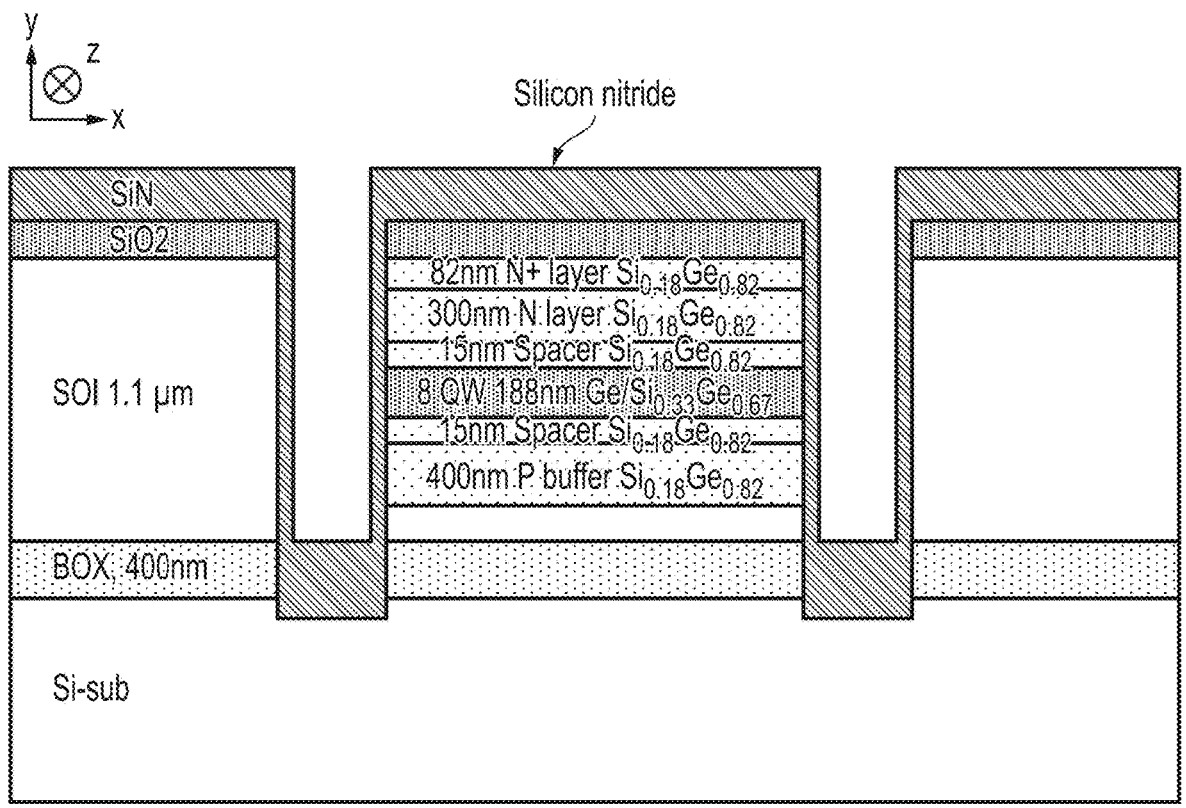

The channels are then lined, as shown in FIG. 25h, with a silicon nitride layer. The silicon nitride layer covers the exposed sidewalls of both the SOI layer and the electro-optically active stack, as well as the bed of the channel. The silicon nitride layer on the bed of the channel has a height which is substantially equal to the uppermost height of the buried oxide layer. The silicon nitride layer functions as an anti-reflective layer. The silicon nitride layer on the bed may have a height of between 500 nm and 520 nm, and the silicon nitride layer on the sidewalls may have a thickness of between 230 nm and 260 nm. The silicon nitride layer on the uppermost surfaces (i.e. above the stack and the SOI waveguides) may have a thickness of between 500 nm and 520 nm.

Figure 25I:
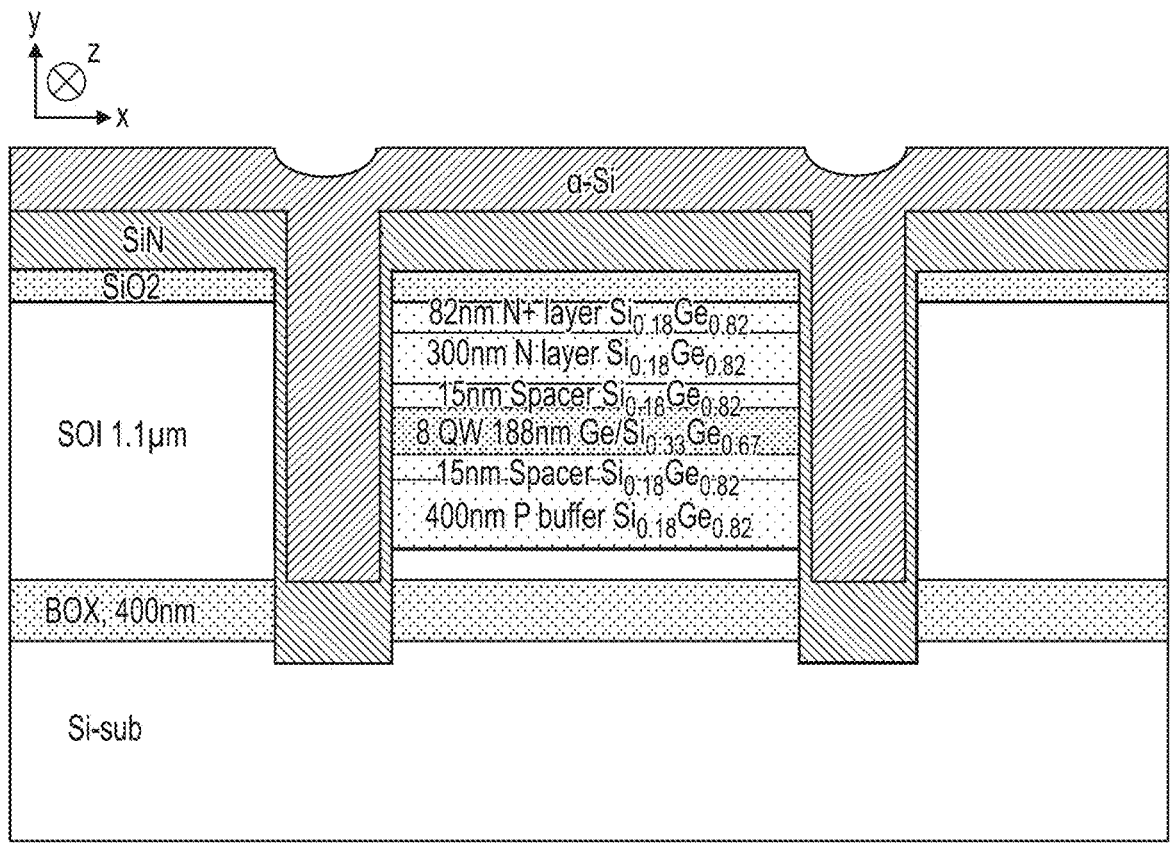

Next, as shown in FIG. 25i, amorphous silicon (α-Si), or SiGe, is deposited on the device. The α-Si fills the two channels, as well as providing a capping layer to the sidewalls. The deposition takes place at a temperature lower than a lowest EPI growth temperature of the stack.

Figure 25J:
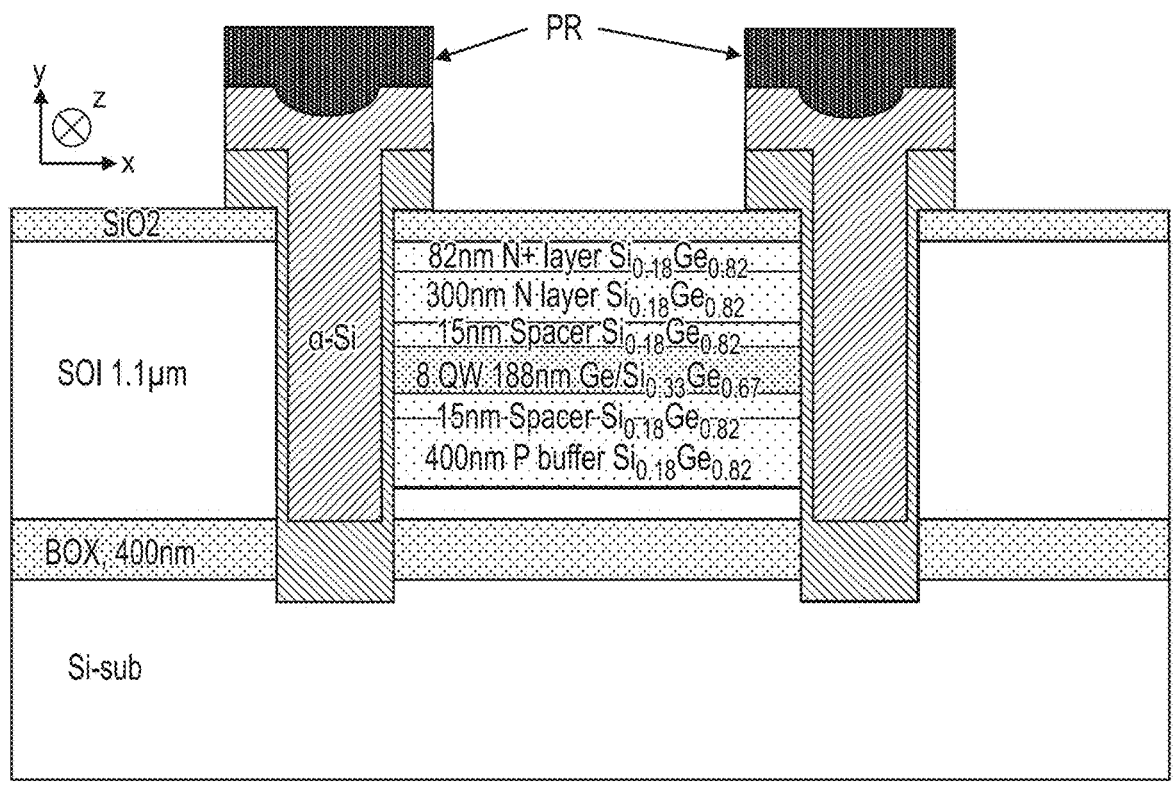

After the amorphous silicon is provided a photoresist is deposited over the top of each of the filled channels. The width of the photoresist may slightly exceed the width of the channels. The α-Si and SiN not covered by the photoresist is then etched, and the result of this is shown in FIG. 25j. This etch releases wafer stress.

Figure 25K:
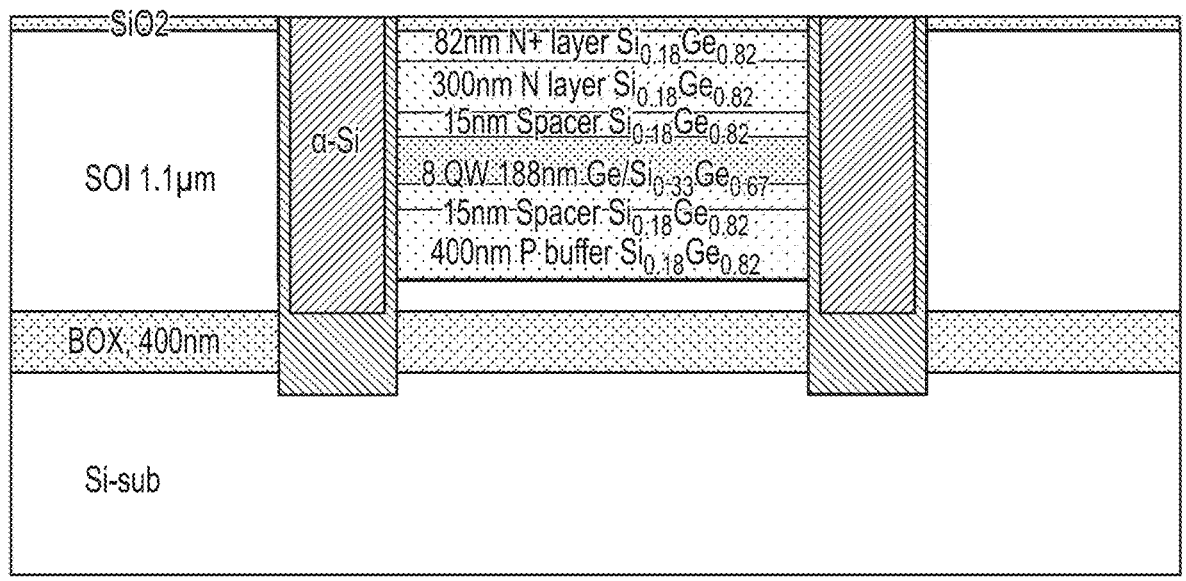
Figure 25L:
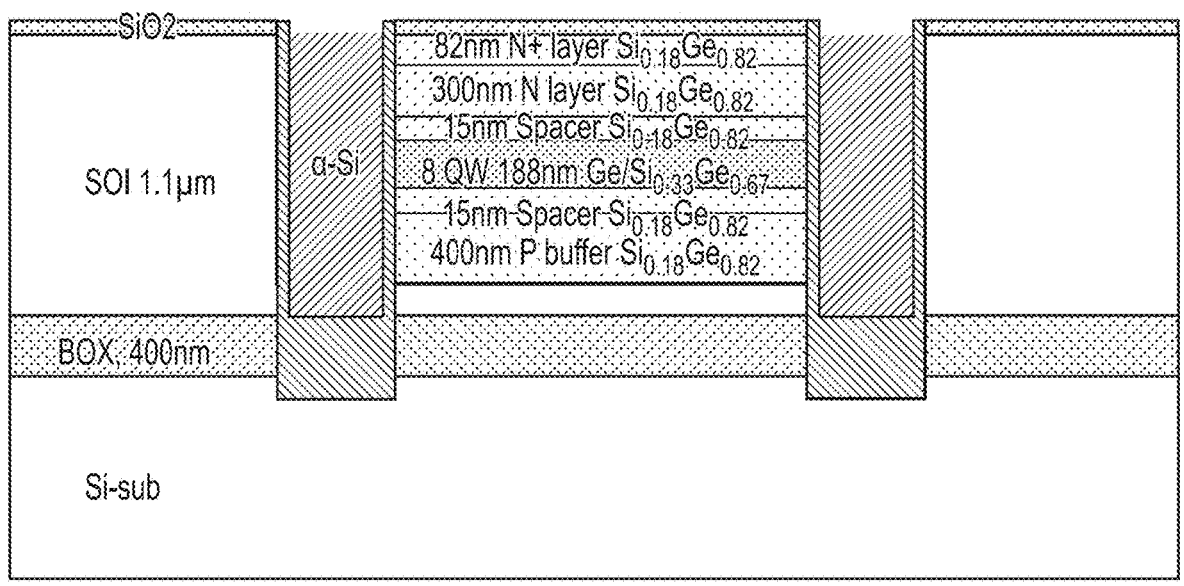

Next, as shown in FIG. 25k, a chemical-machine polishing process is performed so as to planarize the uppermost surface. Around 20 nm of $SiO_2$ is retained over the top of the SOI region and electro-optically active stack. The α-Si can then partially etched, shown in FIG. 25l, such that an uppermost level of the α-Si is equal to the upmost level of the electro-optically active stack.

Figure 25M:
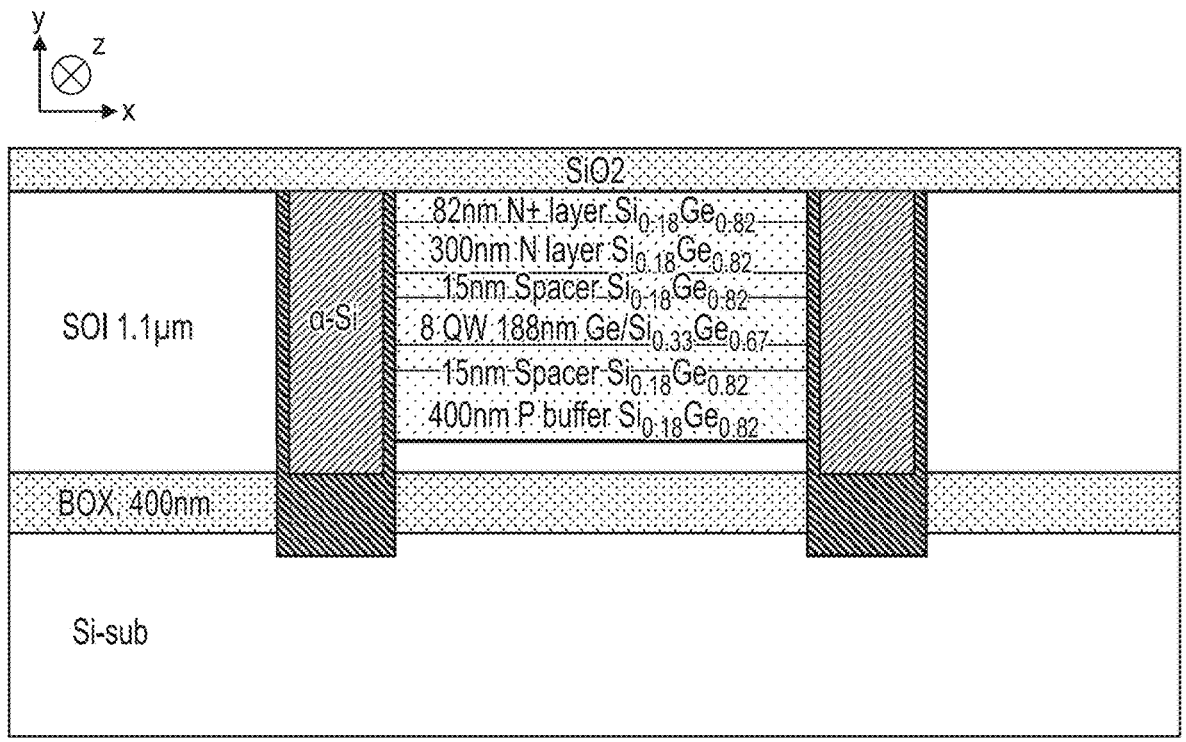

Next, as shown in FIG. 25m, the $SiO_2$ layer is removed and re-deposited. The device is now ready for waveguide fabrication, as discussed in more detail below.

Figure 26:
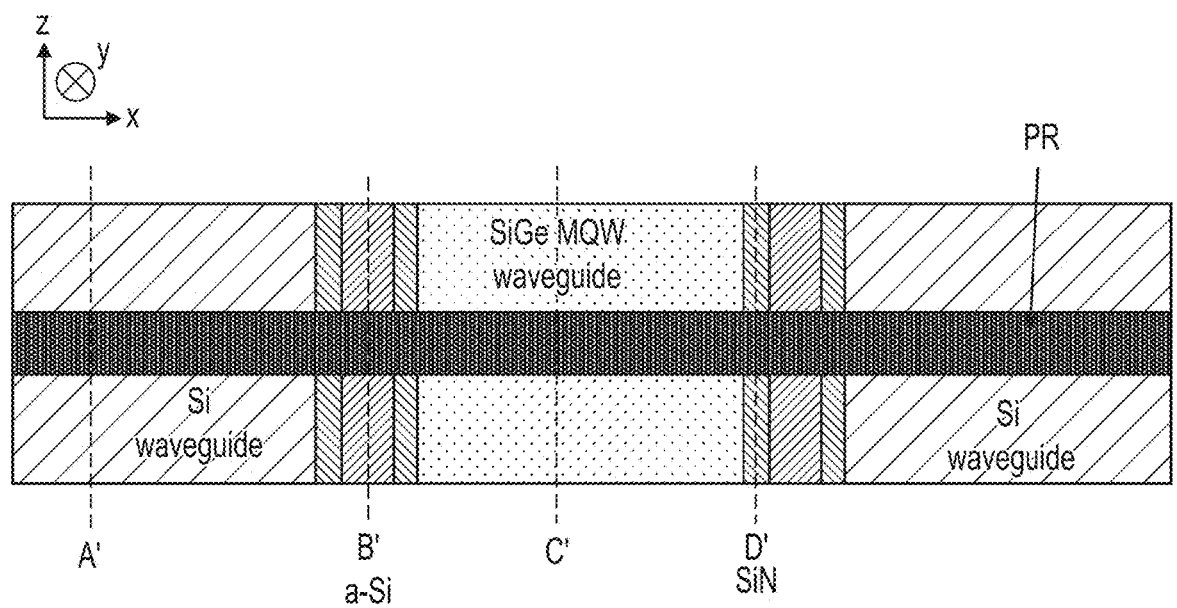
Figure 28A:
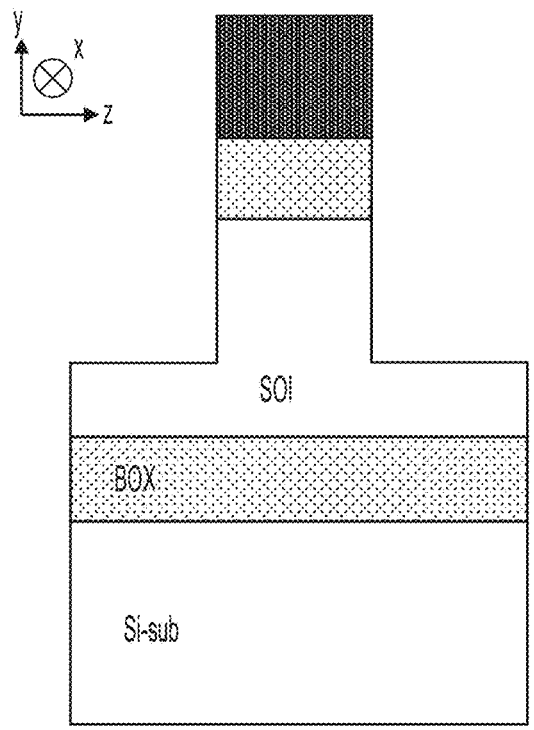
Figure 28B:
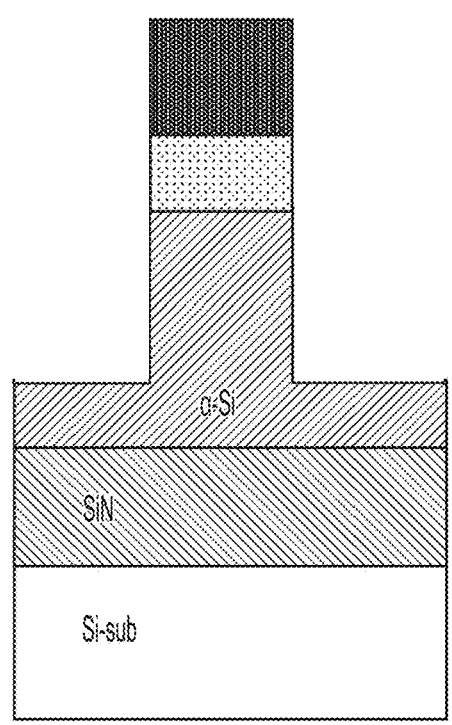
Figure 28C:
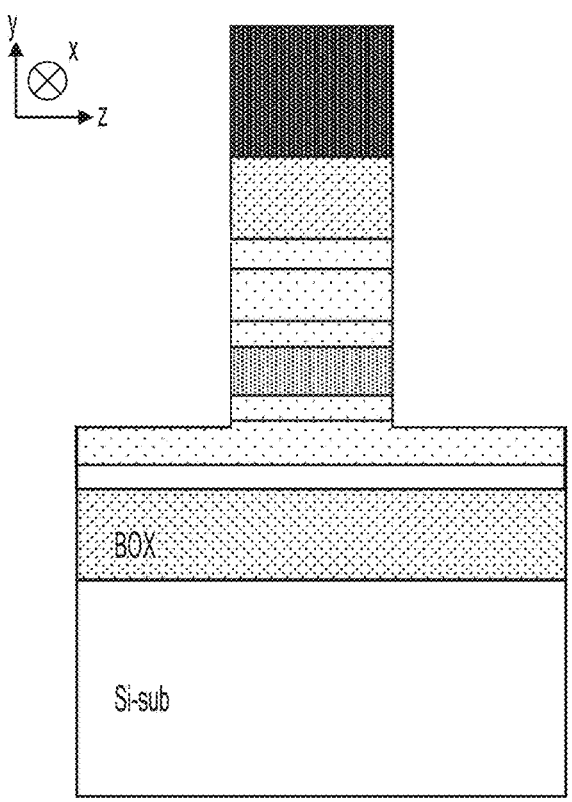
Figure 28D:
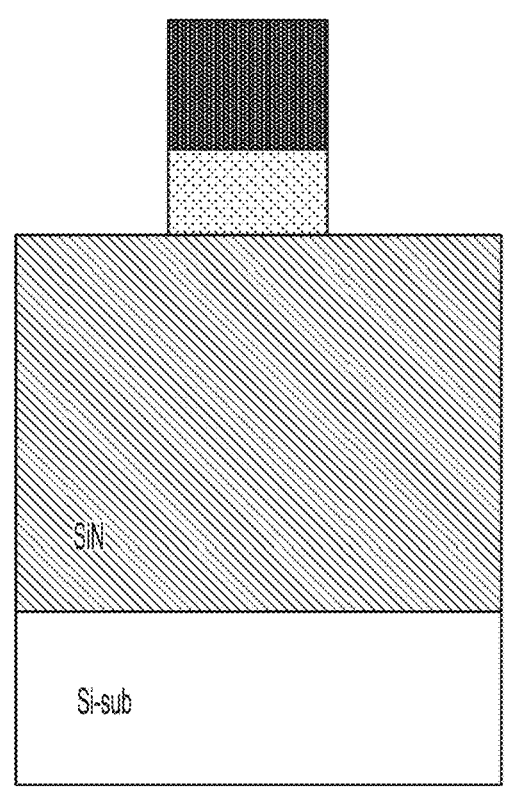
Figure 29A:
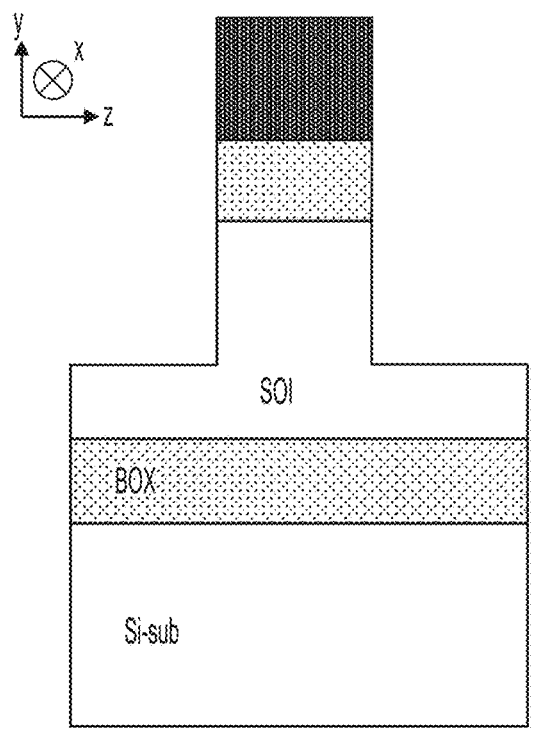
Figure 29B:
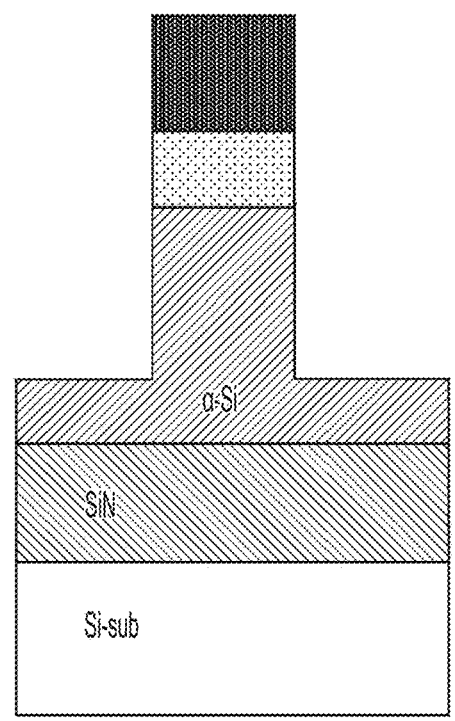
Figure 29C:
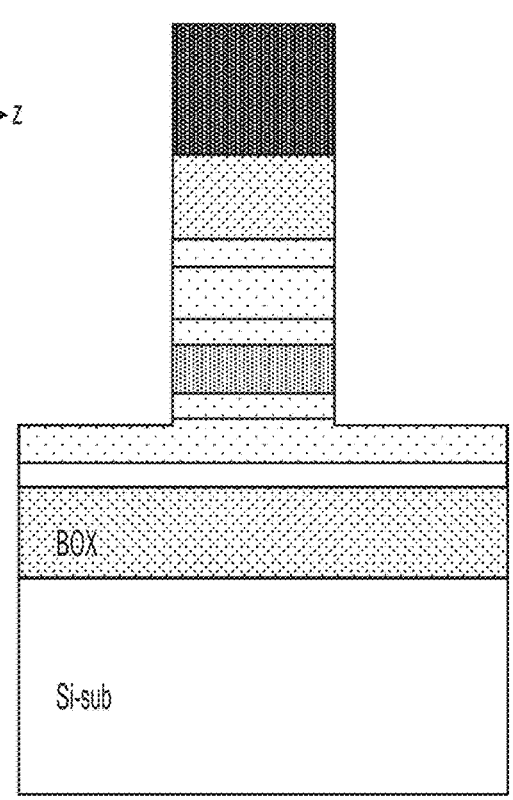
Figure 29D:
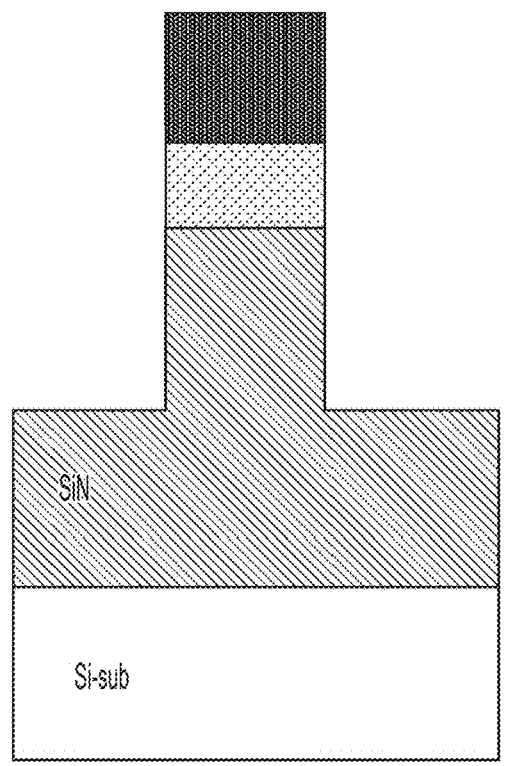
Figure 30:
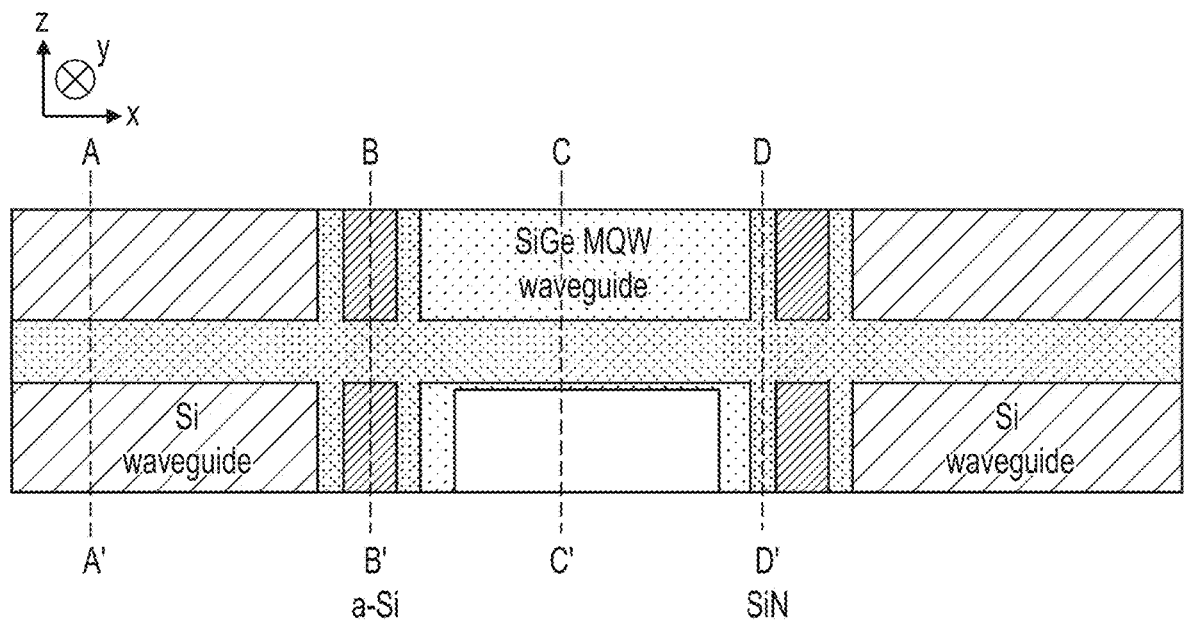
Figure 31A:
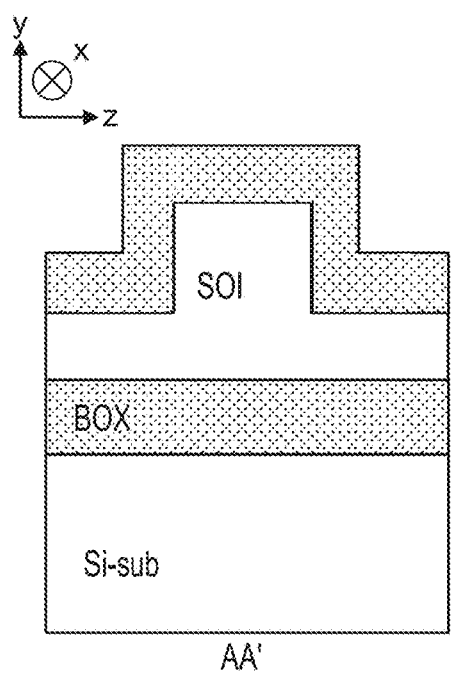
Figure 31B:
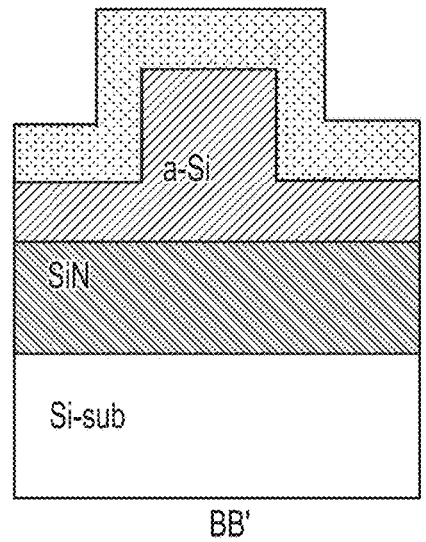
Figure 31C:
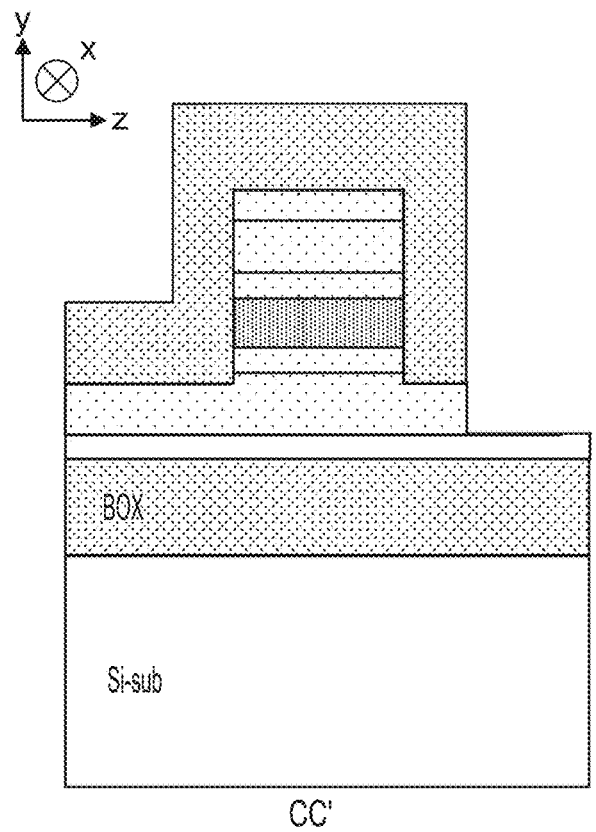
Figure 31D:
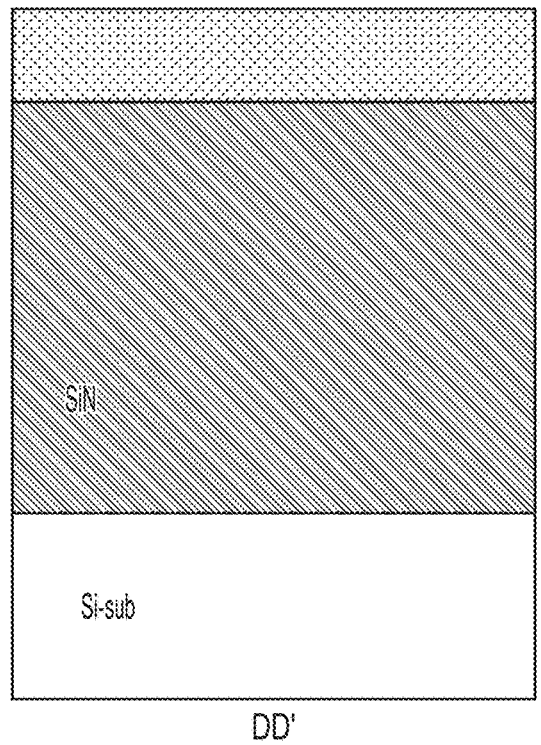
Figure 32:
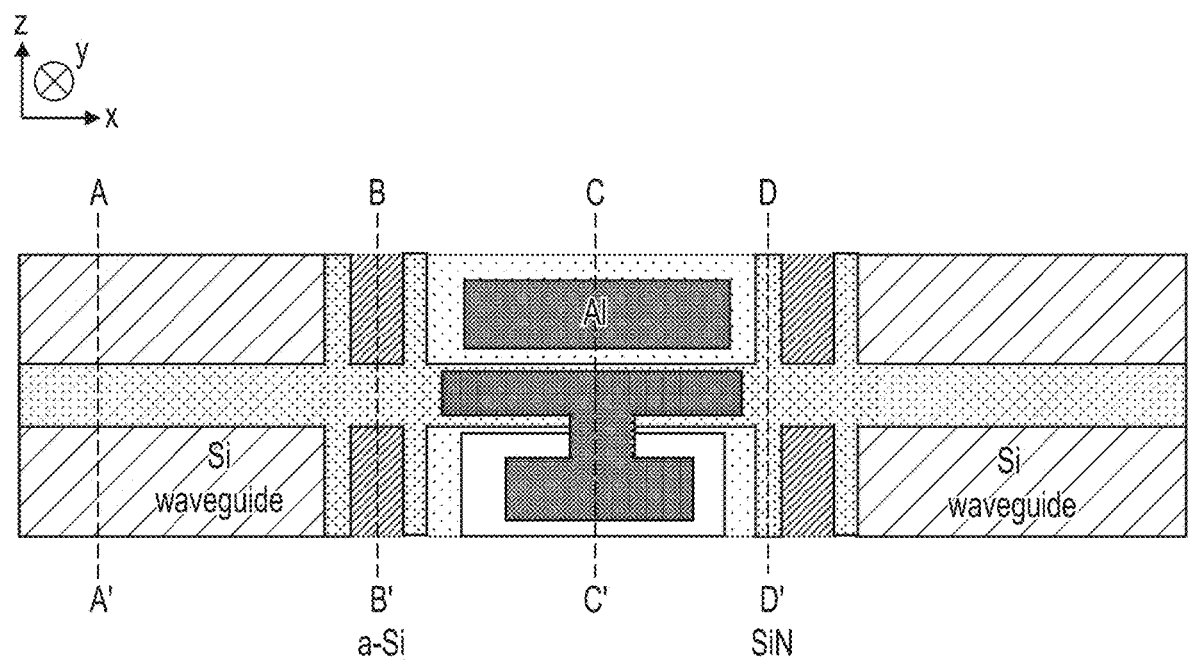
Figure 33A:
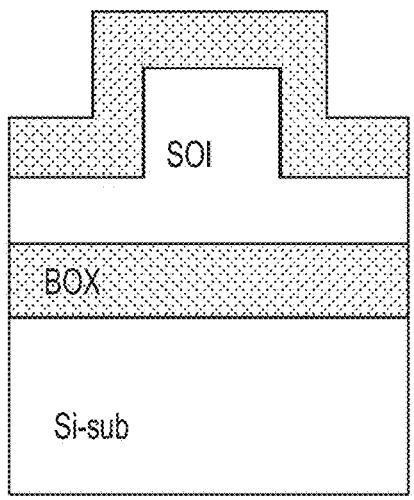
Figure 33B:
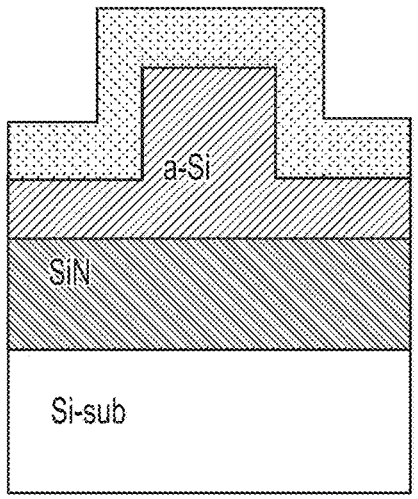
Figure 33C:
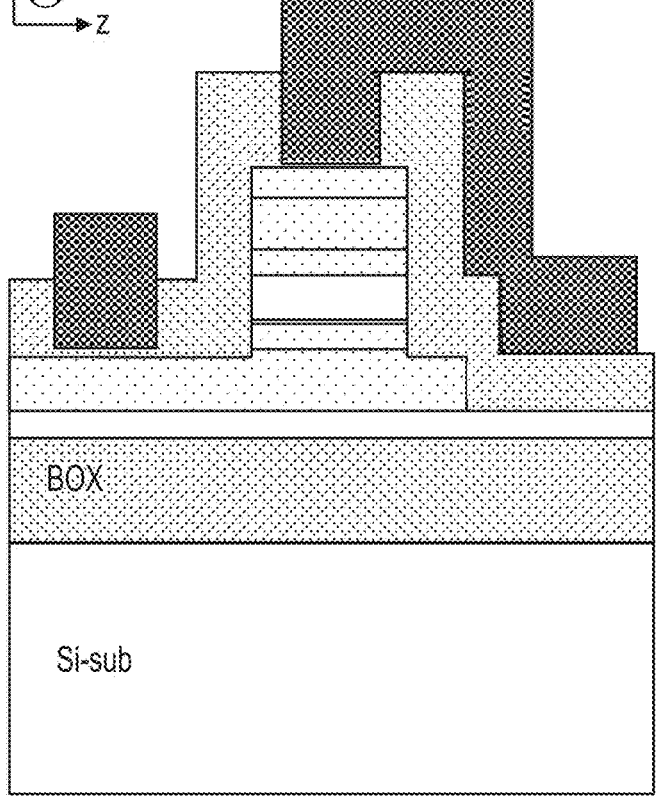
Figure 33D:
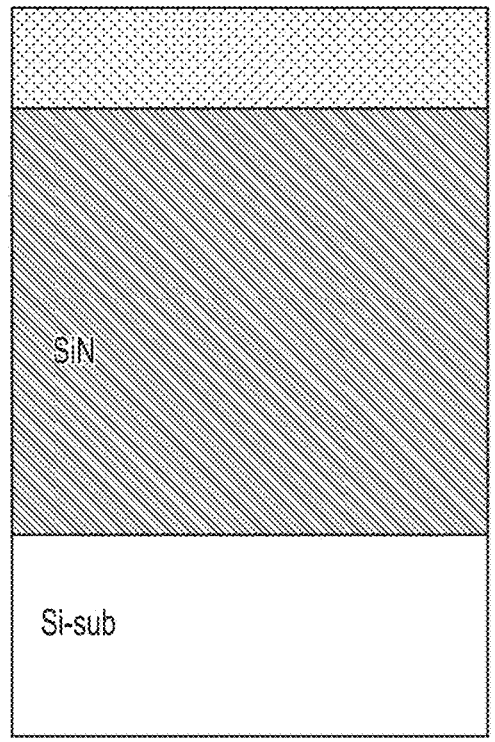

As a first step in fabricating the waveguides, a photoresist is deposited across the $SiO_2$ layer, so as to define the ridge of the first and second passive silicon waveguides as well as the electro-optically active waveguide in the cavity. The unmasked regions (not beneath the photoresist) are then partially etched. The result of this is shown in FIG. 26, from a top-down perspective. FIGS. 27(a)-(d) show the device through cross-sections A-A', B-B', C-C', and D-D' respectively with the photoresist, before the etching takes place. As will be appreciated, the width of the resulting waveguide is determined by the width of the photoresist. FIGS. 28(a)-(d) show the device through the same cross-sections after the etching has taken place. Notably, in this example, the SiN liner (shown in FIGS. 27(d) and 28(d)) is not etched. This etching provides the SOI waveguides and MQW waveguides referred to previously. The etch through the SOI layer, α-Si layer, and Epi layer is uniform in depth, and extends partially into the 400 nm p doped buffer layer discussed above.

However, the SiN may be etched, and the results of this are shown in FIGS. 29(a)-29(d). This step is optional.

Next, as shown in FIGS. 30 and 31(a)-(d), and etch is performed to remove the p doped buffer layer on one side of the device. By doing so, and by subsequently providing the n doped region electrode on the same side as the one where the p doped layer has been removed, the parasitic capacitance can be reduced which can increase the operating speed of the device.

After the p doped buffer layer on one side of the device has been removed, electrodes can be provided by etching vias through the upper $SiO_2$ cladding layer and through a metallization process. These electrodes respectively contact the p doped region and n doped region.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A silicon based electro-optically active device comprising:
   a silicon-on-insulator (SOI) waveguide;
   an electro-optically active waveguide including an electro-optically active stack above an insulator layer and separated from the insulator layer by a seed layer, the electro-optically active waveguide being coupled to the SOI waveguide; and a channel between the electro-optically active waveguide and the SOI waveguide, wherein the channel is filled with a filling material with a refractive index greater than that of a material of a portion of the SOI waveguide forming a sidewall of the channel to thereby form a bridge-waveguide in the channel between the SOI waveguide and the electro-optically active waveguide.

2. The silicon based electro-optically active device of claim 1 including a silicon nitride liner, lining the sidewalls of the channel, said silicon nitride liner including a portion located between the SOI waveguide and the filling material.

3. The silicon based electro-optically active device of claim 1, wherein the electro-optically active stack includes a multiple quantum well region.

4. The silicon based electro-optically active device of claim 1, wherein the filling material is amorphous silicon.

5. The silicon based electro-optically active device of claim 1, wherein the filling material is silicon-germanium (SiGe).

6. The silicon based electro-optically active device of claim 1, wherein the electro-optically active stack has a parallelogramal or trapezoidal geometry.

7. The silicon based electro-optically active device of claim 1, further comprising an epitaxial cladding layer located in-between a silicon substrate of the SOI waveguide and the electro-optically active stack which forms the electro-optically active waveguide.

8. The silicon based electro-optically active device of claim 7, wherein an epitaxial material of the epitaxial cladding layer is silicon.

9. The silicon based electro-optically active device of claim 7, wherein an epitaxial material of the epitaxial cladding layer is silicon-germanium (SiGe).

10. A method of producing a silicon based electro-optically active device, having the steps of:
providing a silicon-on-insulator (SOI) wafer including a silicon device layer above a BOX layer;
etching a cavity in the silicon device layer, the cavity extending through a first portion of the silicon device layer and leaving a second portion of the silicon device layer above the BOX layer;
epitaxially growing an electro-optically active stack on the second portion of the silicon device layer within the cavity, wherein the electro-optically active stack has a facet in a region adjacent to a sidewall of the cavity;
etching the region to thereby remove the facet and produce a channel between the sidewall and the electro-optically active stack; and
filling the channel with a filling material which has a refractive index which is greater than that of a material forming the sidewall.

11. The method of claim 10, including a step, performed before filling the channel with the filling material, of lining the channel with a silicon nitride liner.

12. The method of claim 10, wherein the electro-optically active stack includes a multiple quantum well region.

13. The method of claim 10, wherein the filling material that the channel is filled with comprises amorphous silicon.

14. The method of claim 10, wherein the filling material that the channel is filled with comprises silicon-germanium (SiGe).

15. The method of claim 10, wherein the step of filling the channel is carried out by plasma-enhanced chemical vapour deposition.

16. The method of claim 10, further including a step of planarizing the filling material through chemical-mechanical polishing.

17. The method of claim 10, wherein:
the electro-optically active stack has a second facet in a second region adjacent to an opposite sidewall of the cavity,
the step of etching the region also removes the second region to thereby remove the second facet and produce a second channel between the opposite sidewall and the electro-optically active stack, and
the step of filling the channel includes filling the second channel with amorphous silicon.

18. The method of claim 17, wherein the silicon based electro-optically active device is a quantum-confined Stark effect based electro-absorption modulator.

19. The method of claim 18, further comprising forming a modulator waveguide in the electro-optically active stack and forming a waveguide in the SOI wafer, wherein the electro-optically active stack includes a buffer layer, and the method includes adjusting a height of the buffer layer such that an optical mode in the modulator waveguide matches an optical mode in the waveguide in the SOI wafer.

20. The method of claim 10, wherein the electro-optically active stack is grown such that it has a parallelogramal or trapezoidal geometry.

21. A silicon based electro-optically active device comprising:
a silicon-on-insulator (SOI) waveguide;
an electro-optically active waveguide including an electro-optically active stack, the electro-optically active waveguide being coupled to the SOI waveguide and being separated from an insulator layer by a seed layer; and
a channel between the electro-optically active waveguide and the SOI waveguide,
wherein the channel is filled with a filling material with a refractive index greater than that of a material of a portion of the SOI waveguide forming a sidewall of the channel to thereby form a bridge waveguide in the channel between the SOI waveguide and the electro-optically active stack, and
wherein a layer of the electro-optically active stack in contact with the seed layer includes silicon germanium.

* * * * *